(12) United States Patent
Yun et al.

(10) Patent No.: US 10,910,398 B2
(45) Date of Patent: Feb. 2, 2021

(54) SEMICONDUCTOR DEVICES AND METHODS FOR FORMING THE SAME

(71) Applicant: Samsung Electronics Co., Ltd., Suwon-si (KR)

(72) Inventors: Jang-Gn Yun, Hwaseong-si (KR); Sunghoi Hur, Seoul (KR); Jaesun Yun, Anyang-si (KR); Joon-Sung Lim, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/165,426

(22) Filed: Oct. 19, 2018

(65) Prior Publication Data

US 2019/0051665 A1    Feb. 14, 2019

Related U.S. Application Data

(63) Continuation of application No. 15/661,718, filed on Jul. 27, 2017, now abandoned, which is a (Continued)

(30) Foreign Application Priority Data

Dec. 19, 2014   (KR) ......................... 10-2014-0184594

(51) Int. Cl.
*H01L 27/11582*   (2017.01)
*H01L 27/11573*   (2017.01)
*H01L 27/11575*   (2017.01)

(52) U.S. Cl.
CPC .. *H01L 27/11582* (2013.01); *H01L 27/11573* (2013.01); *H01L 27/11575* (2013.01)

(58) Field of Classification Search
CPC ............................. H01L 27/115–11597; H01L 27/11578–11582; H01L 27/11273; H01L 27/11556
See application file for complete search history.

(56) References Cited

U.S. PATENT DOCUMENTS 7,915,667 B2   3/2011   Knoefler et al.
8,188,530 B2   5/2012   Tanaka et al.
(Continued)

FOREIGN PATENT DOCUMENTS

JP   2009224574 A   10/2009
KR   20100087743 A   8/2010

*Primary Examiner* — Lauren R Bell
(74) *Attorney, Agent, or Firm* — Myers Bigel, P.A.

(57) ABSTRACT

A semiconductor device may include a cell gate conductive pattern in a cell array area that extends to a step area, a cell vertical structure in the cell array area that extends through the cell gate conductive pattern, a cell gate contact structure on the cell gate conductive pattern in the step area, a cell gate contact region in the cell gate conductive pattern and aligned with the cell gate contact structure, a first peripheral contact structure spaced apart from the cell gate conductive pattern, a second peripheral contact structure spaced apart from the first peripheral contact structure, a first peripheral contact region under the first peripheral contact structure, and a second peripheral contact region under the second peripheral contact structure. The cell gate contact region may include a first element and a remainder of the cell gate conductive pattern may not substantially include the first element.

12 Claims, 51 Drawing Sheets

Related U.S. Application Data continuation of application No. 14/974,567, filed on Dec. 18, 2015, now Pat. No. 9,728,549.

(56) References Cited

U.S. PATENT DOCUMENTS

| | | |
|---|---|---|
| 8,288,816 B2 | 10/2012 | Komori et al. |
| 8,324,680 B2 | 12/2012 | Izumi et al. |
| 8,338,882 B2 | 12/2012 | Tanaka et al. |
| 8,541,831 B2 | 9/2013 | Chae et al. |
| 8,791,523 B2 | 7/2014 | Iino et al. |
| 2007/0252201 A1* | 11/2007 | Kito .................... H01L 21/8221 257/331 |
| 2009/0230450 A1 | 9/2009 | Shiino et al. |
| 2010/0207195 A1 | 8/2010 | Fukuzumi et al. |
| 2012/0068247 A1 | 3/2012 | Lee et al. |
| 2012/0149185 A1* | 6/2012 | Kim .................. H01L 27/11582 438/589 |
| 2012/0168831 A1* | 7/2012 | Ahn .................. H01L 27/11582 257/288 |
| 2014/0015128 A1 | 1/2014 | Chae et al. |
| 2014/0197542 A1 | 7/2014 | Yun et al. |

\* cited by examiner

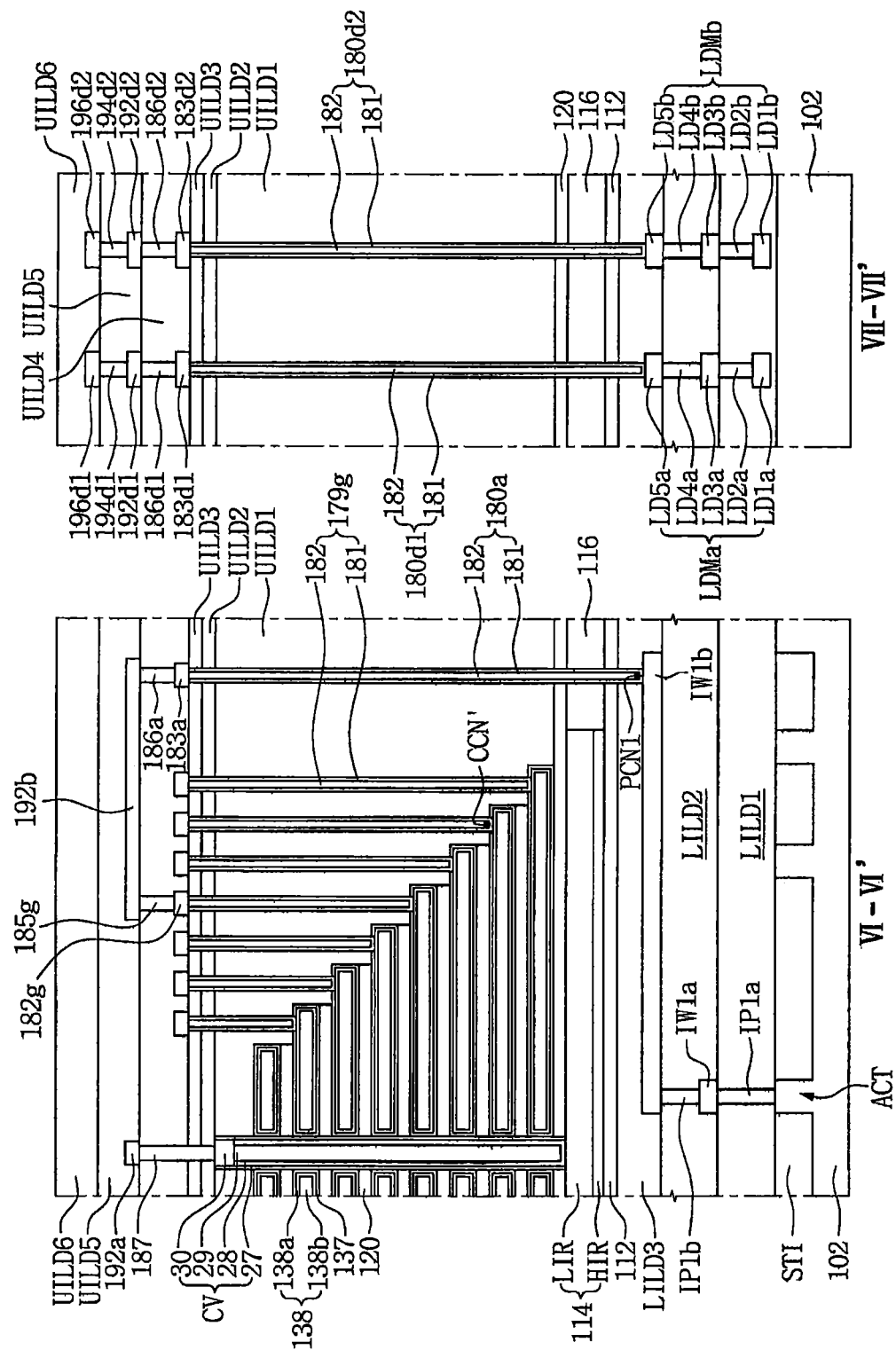

FIG. 6A
FIG. 6B
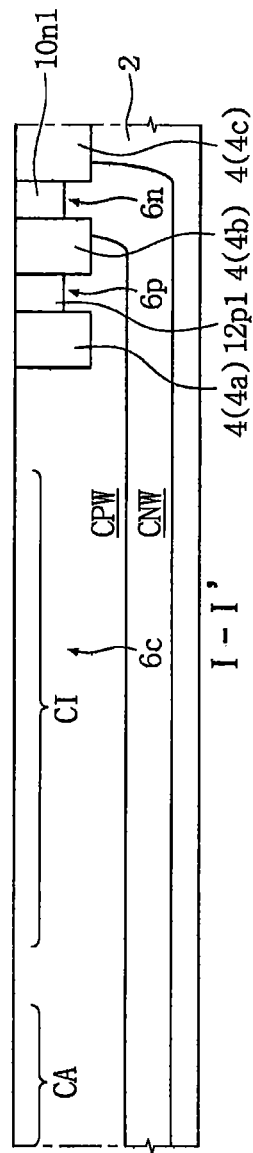
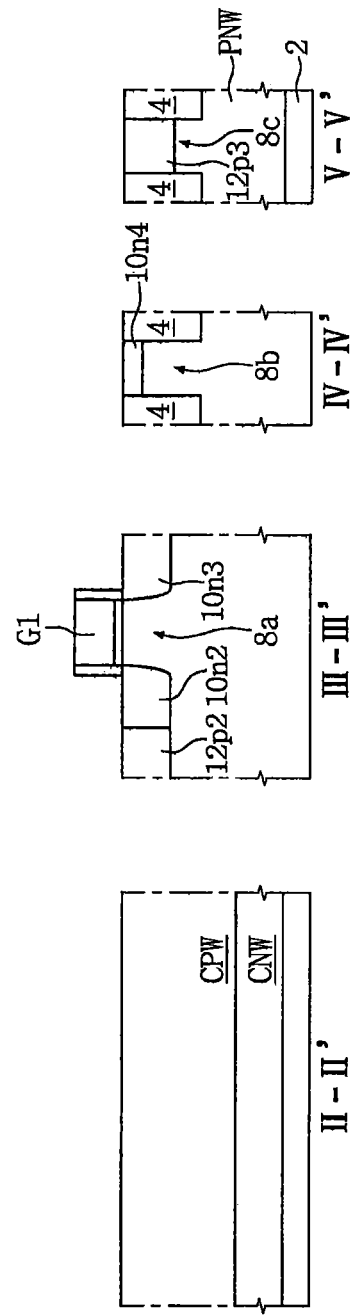

SEMICONDUCTOR DEVICES AND METHODS FOR FORMING THE SAME

CROSS-REFERENCE TO RELATED APPLICATION

This application is a continuation of U.S. patent application Ser. No. 15/661,718, filed on Jul. 27, 2017, which is a continuation of U.S. patent application Ser. No. 14/974,567, now U.S. Pat. No. 9,728,549, filed on Dec. 18, 2015, which claims priority under 35 U.S.C. § 119 to Korean Patent Application No. 10-2014-0184594, filed on Dec. 19, 2014 in the Korean Intellectual Property Office, the disclosures of which are hereby incorporated by reference herein in their entireties.

BACKGROUND

Technical Field

Embodiments of the inventive concepts relate to semiconductor devices, methods of forming the semiconductor devices, and electronic systems adopting the same.

Description of Related Art

In semiconductor devices such as flash memories, a degree of integration may be a factor for determining a price of a semiconductor product. Generally, in the case of two-dimensional semiconductor devices including two-dimensionally arranged memory cells, an increase in the degree of integration may increase cost. This may limit an increase in the degree of integration of the semiconductor devices including two-dimensionally arranged memory cells. In order to increase the degree of integration of semiconductor devices, three-dimensional semiconductor devices including three-dimensionally arranged memory cells have been proposed.

SUMMARY

According to some embodiments of the inventive concepts, semiconductor devices may be provided. A semiconductor device may include a cell array area and a step area. The semiconductor device may include a cell gate conductive pattern in the cell array area that extends to the step area. The semiconductor device may include a cell vertical structure in the cell array area that extends through the cell gate conductive pattern. The semiconductor device may include a cell gate contact structure on the cell gate conductive pattern in the step area. The semiconductor device may include a cell gate contact region in the cell gate conductive pattern and aligned with the cell gate contact structure. The semiconductor device may include a first peripheral contact structure spaced apart from the cell gate conductive pattern. The semiconductor device may include a second peripheral contact structure spaced apart from the first peripheral contact structure. The semiconductor device may include a first peripheral contact region under the first peripheral contact structure. The semiconductor device may include a second peripheral contact region under the second peripheral contact structure. The cell gate contact region may include a first element and a remainder of the cell gate conductive pattern may not substantially include the first element.

In some embodiments, the semiconductor device may include a cell body contact region including the first element and a cell body contact structure on the cell body contact region. The cell body contact region may have a first conductivity type formed using the first element as a dopant.

In some embodiments, the semiconductor device may include a semiconductor substrate including a cell active region, a first peripheral active region, and a second peripheral active region. The cell array area and the step area may be in the cell active region of the semiconductor substrate. The first peripheral contact region may be in the first peripheral active region of the semiconductor substrate. The second peripheral contact region may be in the second peripheral active region of the semiconductor substrate.

In some embodiments, the first peripheral contact region may have a first conductivity type including the first element and the second peripheral contact region may have a second conductivity type including a second element of a group different from the first element.

In some embodiments, the semiconductor device may include a first cell band active region on the cell active region. The semiconductor device may include a second cell band active region on the first cell band active region. The semiconductor device may include a cell body contact structure in the first cell band active region. The semiconductor device may include a cell body contact region in the first cell band active region under the cell body contact structure and including the first element. The cell body contact region may have a first conductivity type formed using the first element as a dopant.

In some embodiments, the semiconductor device may include a first peripheral transistor and a second peripheral transistor. The first peripheral transistor may include a first peripheral gate and a first peripheral impurity region of a first conductivity type. The second peripheral transistor may include a second peripheral gate and a second peripheral impurity region of a second conductivity type different from the first conductivity type. The first peripheral contact region may be in the first peripheral impurity region and may have an impurity concentration higher than the first peripheral impurity region. The second peripheral contact region may be in the second peripheral impurity region and may have an impurity concentration higher than the second peripheral impurity region. The first peripheral contact region may have the first conductivity type including the first element. The second peripheral contact region may have the second conductivity type including a second element of a group different from the first element.

In some embodiments, the cell gate contact structure may have an upper surface that is co-planar with an upper surface of the first peripheral contact structure and a lower surface that is not co-planar with a lower surface of the first peripheral contact structure.

In some embodiments, a lower surface of the cell gate contact structure may not be co-planar with a lower surface of the first peripheral contact structure.

In some embodiments, the semiconductor device may include a semiconductor substrate. The semiconductor device may include a cell semiconductor layer on the semiconductor substrate. The semiconductor device may include a first upper interconnection pattern between the semiconductor substrate and the cell semiconductor layer and extending beyond an outer perimeter of the cell semiconductor layer. The semiconductor device may include a second upper interconnection pattern between the semiconductor substrate and the cell semiconductor layer and extending beyond the outer perimeter of the cell semiconductor layer. The semiconductor device may include a third upper interconnection pattern between the semiconductor substrate and the cell semiconductor layer and extending beyond the outer perimeter of the cell semiconductor layer.

In some embodiments, the first and second upper interconnection patterns may be co-planar, and the third upper interconnection pattern may not be co-planar with the first and second upper interconnection patterns.

In some embodiments, the first peripheral contact region may be in the first upper interconnection pattern, and the second peripheral contact region may be in the second upper interconnection pattern.

In some embodiments, the semiconductor device may include a cell body contact structure on the cell semiconductor layer and a cell body contact region in the cell semiconductor layer under the cell body contact structure and including the first element. The cell body contact region may have a first conductivity type formed using the first element as a dopant.

According to some embodiments of the inventive concepts, semiconductor devices may be provided. A semiconductor device may include a cell semiconductor layer. The semiconductor device may include a plurality of cell gate conductive patterns on the cell semiconductor layer and extending from a cell array area to a step area. The semiconductor device may include a plurality of cell source patterns extending through the cell gate conductive patterns. The semiconductor device may include a cell vertical structure between the cell source patterns and extending through the cell gate conductive patterns. The semiconductor device may include a plurality of cell gate contact structures on respective ones of the cell gate conductive patterns of the step area. The semiconductor device may include a cell body contact structure on the cell semiconductor layer and spaced apart from the cell gate conductive patterns. The semiconductor device may include a cell body contact region in the cell semiconductor layer under the cell body contact structure and having a P-type conductivity type including a group III element of a periodic table. The semiconductor device may include a plurality of cell gate contact regions in respective ones of the cell gate conductive patterns under the cell gate contact structures and including the group III element.

In some embodiments, the semiconductor device may include a semiconductor substrate under the cell semiconductor layer. The semiconductor device may include a first interconnection pattern between the semiconductor substrate and the cell semiconductor layer and extending beyond an outer perimeter of the cell semiconductor layer. The semiconductor device may include a second interconnection pattern between the semiconductor substrate and the cell semiconductor layer and extending beyond the outer perimeter of the cell semiconductor layer.

In some embodiments, the semiconductor device may include a word line interconnection structure on the cell gate conductive patterns. The semiconductor device may include a first peripheral contact structure between the word line interconnection structure and the first interconnection pattern. The semiconductor device may include a bit line. The semiconductor device may include a bit line contact structure between the bit line and the cell vertical structure. The semiconductor device may include a second peripheral contact structure between the bit line and the second interconnection pattern.

In some embodiments, the semiconductor device may include a third interconnection pattern between the semiconductor substrate and the cell semiconductor layer and extending beyond the outer perimeter of the cell semiconductor layer. The semiconductor device may include a cell body interconnection structure on the cell body contact structure. The semiconductor device may include a third peripheral contact structure between the cell body interconnection structure and the third interconnection pattern.

In some embodiments, the semiconductor device may include an inner dam structure on the semiconductor substrate and on the cell semiconductor layer and an outer dam structure on the inner dam structure. Ones of the inner and outer dam structures may have a lower surface closer to the semiconductor substrate than the first and second interconnection patterns, and an upper surface further from the semiconductor substrate than the word line interconnection structure and the bit line.

According to some embodiments of the inventive concepts, semiconductor devices may be provided. A semiconductor device may include a cell semiconductor layer. The semiconductor device may include a plurality of cell gate conductive patterns on the cell semiconductor layer and extending from a cell array area to a first step area. The semiconductor device may include a plurality of cell source patterns passing through the cell gate conductive patterns and extending to the first step area, are disposed. The semiconductor device may include a cell vertical structure between the cell source patterns and passing through the cell gate conductive patterns. The semiconductor device may include a plurality of cell gate contact structures on respective portions of the cell gate conductive patterns within the first step area. The semiconductor device may include a cell body contact structure on the cell semiconductor layer and spaced apart from the cell gate conductive patterns. The semiconductor device may include a cell body contact region in the cell semiconductor layer under the cell body contact structure and having a P-type conductivity type including a group III element of a periodic table. The semiconductor device may include a plurality of cell gate contact regions in respective portions of the cell gate conductive patterns under the cell gate contact structures and including the group III element.

In some embodiments, the semiconductor device may include a plurality of first insulating patterns in the cell array area on the cell semiconductor layer and extending to the first step area and to a second step area. The semiconductor device may include a plurality of second insulating patterns between the first insulating patterns in the second step area of the cell semiconductor layer. The cell body contact structure may pass through the first and second insulating patterns in the second step area and may be connected to the cell semiconductor layer.

In some embodiments, the cell source patterns may include parallel line shapes and the cell body contact structure may include a line shape parallel to the cell source patterns.

According to some embodiments of the inventive concepts, methods of forming semiconductor devices may be provided. A method may include forming a cell vertical structure on a cell semiconductor layer. The method may include forming a plurality of cell gate conductive patterns on respective portions of a side surface of the cell vertical structure on the cell semiconductor layer. Edges of the cell gate conductive patterns may include a step structure. The method may include forming an upper interlayer insulating layer that covers the cell gate conductive patterns and the cell vertical structure. The method may include performing a patterning process that forms a plurality of first contact holes that pass through the upper interlayer insulating layer and expose the respective portions of the cell gate conductive patterns in the step structure, and simultaneously forms a second contact hole that exposes the cell semiconductor layer. The method may include performing an ion implantation process that forms a plurality of first contact areas by implanting a first element in the portions of the cell gate conductive patterns exposed by the first contact holes, and simultaneously forms a second contact area by implanting the first element in the cell semiconductor layer exposed by the second contact hole. The method may include simultaneously forming a plurality of first contact structures that fill the first contact holes, and a second contact structure that fills the second contact hole.

In some embodiments, the method may include forming a first interconnection pattern and a second interconnection pattern between the cell semiconductor layer and a semiconductor substrate. The method may include forming a lower interlayer insulating layer that covers the first and second interconnection patterns. The first and second interconnection patterns may extend beyond an outer perimeter of the cell semiconductor layer.

In some embodiments, the method may include simultaneously forming a first peripheral hole that passes through the upper interlayer insulating layer and the lower interlayer insulating layer and exposes the first interconnection pattern, and a second peripheral hole that exposes the second interconnection pattern. The method may include simultaneously forming a first peripheral contact structure that fills the first peripheral hole, and a second peripheral contact structure that fills the second peripheral hole. The first and second peripheral contact structures may be simultaneously formed with the first and second contact structures.

In some embodiments, the first and second peripheral holes may be formed before or after forming the first and second contact holes.

In some embodiments, the method may include forming a gap fill layer that fills the holes formed first among the first and second peripheral holes and the first and second contact holes. The gap fill layer may be formed before forming holes formed later among the first and second peripheral holes and the first and second contact holes. The gap fill layer may be removed before the first and second contact structures are formed.

According to some embodiments of the inventive concepts, semiconductor devices may be provided. A semiconductor device may include a vertical memory cell structure extending from a cell semiconductor layer in a first direction perpendicular to a surface of the cell semiconductor layer. The semiconductor device may include a cell gate conductive pattern on a portion of the vertical memory cell structure. The semiconductor device may include a cell gate contact structure extending in the first direction from a cell gate contact region in the cell gate conductive pattern. The semiconductor device may include a cell body contact structure extending in the first direction from a cell body contact region in the cell semiconductor layer. The semiconductor device may include a peripheral contact structure extending in the first direction from a peripheral contact region and electrically connected to a peripheral transistor. One or more of the cell body contact region and the peripheral contact region may include a semiconductor doped with a first element to form a first conductivity type. The cell gate contact region may include the first element.

In some embodiments, the cell semiconductor layer may include a semiconductor substrate. The vertical memory cell structure and the cell body contact structure may extend from a first conductivity type well in the semiconductor substrate. The cell body contact region may be doped with the first element at an impurity concentration higher than an impurity concentration of the first conductivity type well.

In some embodiments, the cell semiconductor layer may include a semiconductor substrate. The vertical memory cell structure and the cell body contact structure may extend from a second conductivity type well in the semiconductor substrate. The peripheral contact region may be doped with the first element. The cell body contact region may be doped with a second element to form a second conductivity type different from the first conductivity type.

In some embodiments, the semiconductor device may include a semiconductor substrate and an insulator layer between the semiconductor substrate and the cell semiconductor layer and extending on the semiconductor substrate beyond an outer perimeter of the cell semiconductor layer. The peripheral transistor may be on the semiconductor substrate between the semiconductor substrate and the cell semiconductor layer.

The peripheral contact region may be within a portion of the insulator layer on the semiconductor substrate outside of the perimeter of the cell semiconductor layer. The cell body contact region may be doped with the first element.

In some embodiments, the semiconductor device may include an inner dam structure on the perimeter of the semiconductor substrate. The inner dam structure may include a lower inner dam structure in the insulator layer and an upper inner dam structure on the lower inner dam structure. The lower inner dam structure may include an uppermost lower inner dam adjacent the upper inner dam structure and may include the first element. The semiconductor device may include an outer dam structure on the inner dam structure. The outer dam structure may include a lower outer dam structure in the insulator layer and an upper outer dam structure on the lower outer dam structure. The lower outer dam structure may include an uppermost lower outer dam adjacent the upper outer dam structure and may include the first element.

It is noted that aspects of the inventive concepts described with respect to one embodiment, may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below.

BRIEF DESCRIPTION OF THE DRAWINGS

The inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

FIGS. 5A and 5B are cross-sectional views illustrating a semiconductor device according to some embodiments of the inventive concepts.

FIGS. 6A to 17B are cross-sectional views illustrating intermediate process operations in methods of forming semiconductor devices according to some embodiments of the inventive concepts.

DETAILED DESCRIPTION OF THE EMBODIMENTS

Figure 1A:
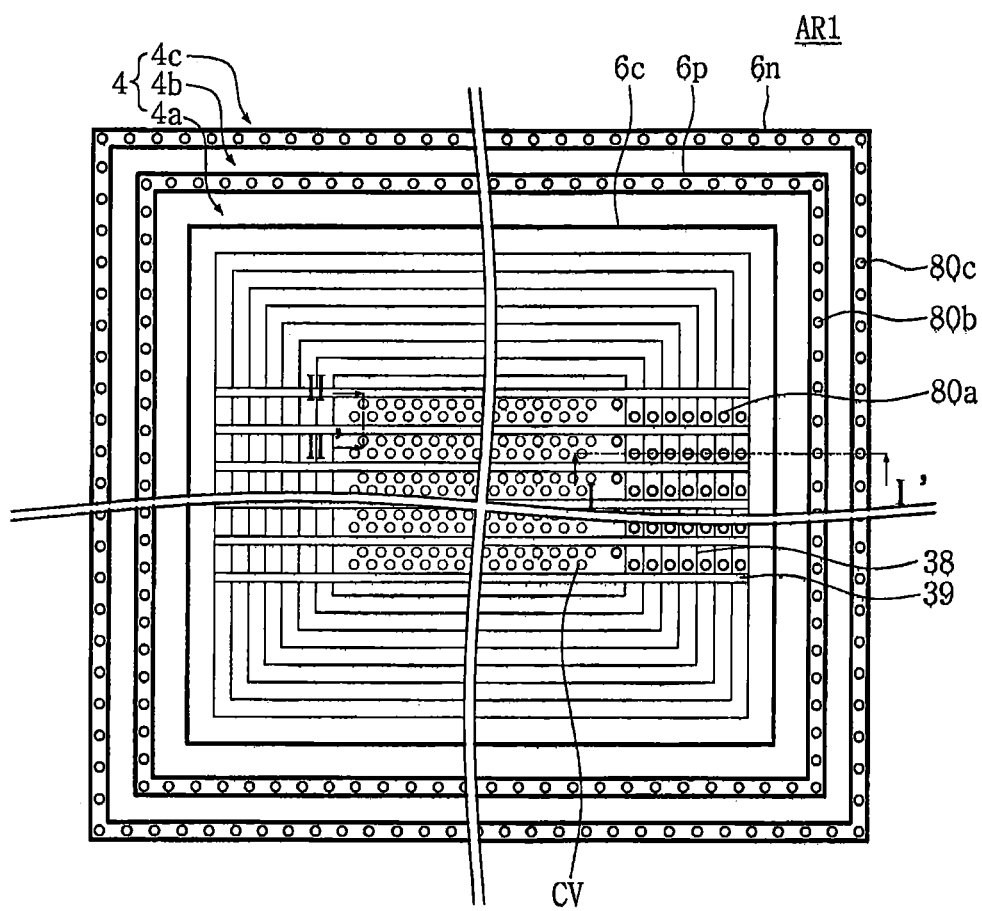
FIGS. 1A and 1B are plan views illustrating a semiconductor device according to some embodiments of the inventive concepts.

The inventive concepts may be embodied in various different forms, and should be construed as limited, not by the embodiments set forth herein, but only by the accompanying claims. Rather, these embodiments are provided so that this disclosure is thorough and complete and fully conveys the inventive concepts to those skilled in the art. In the drawings, the sizes and relative sizes of layers and regions may be exaggerated for clarity. The same reference symbols denote the same components throughout the specification.

Embodiments are described herein with reference to cross-sectional views, plan views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit the inventive concepts but only to illustrate characteristic forms of regions of devices.

The thicknesses of layers and regions in the drawings may be exaggerated for the sake of clarity. Further, it will be understood that when a layer is referred to as being "on" another layer or a substrate, the layer may be formed directly on the other layer or the substrate, or there may be an intervening layer therebetween. The same reference numerals indicate the same components throughout the specification.

Terms such as "top," "bottom," "upper," "lower," "above," "below," and the like are used herein to describe the relative positions of elements or features. It will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" a "top" without departing from the teachings of the inventive concepts.

Furthermore, throughout this disclosure, directional terms such as "upper," "intermediate," "lower," and the like may be used herein to describe the relationship of one element or feature with another, and the inventive concepts should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the present inventive concepts.

The terminology used herein to describe embodiments of the invention is not intended to limit the scope of the inventive concepts.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged, for example, in an array and/or in a two-dimensional pattern.

Figure 1B:
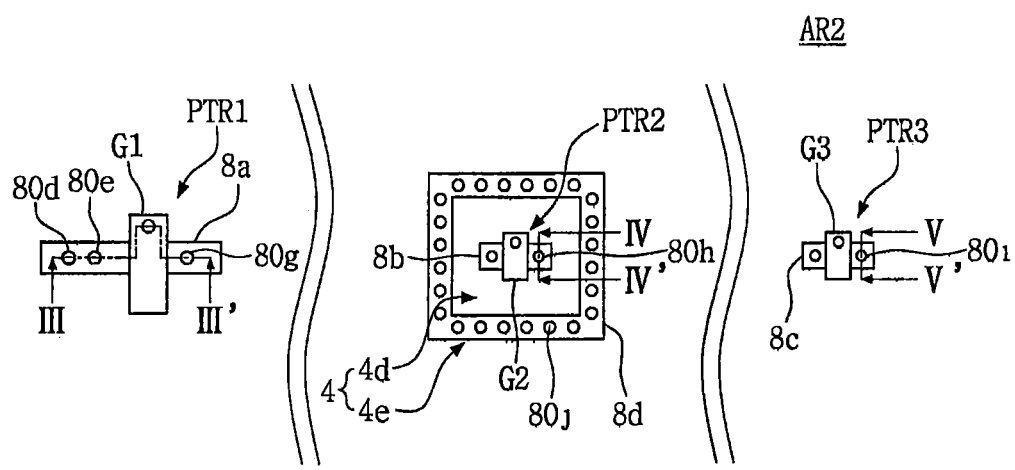

FIGS. 1A and 1B are plan views illustrating a semiconductor device according to some embodiments of the inventive concepts. In FIGS. 1A and 1B, FIG. 1A is a plan view illustrating a first area AR1 of the semiconductor device and FIG. 1B shows plan views illustrating a second area AR2 of the semiconductor device.

Figure 3A:
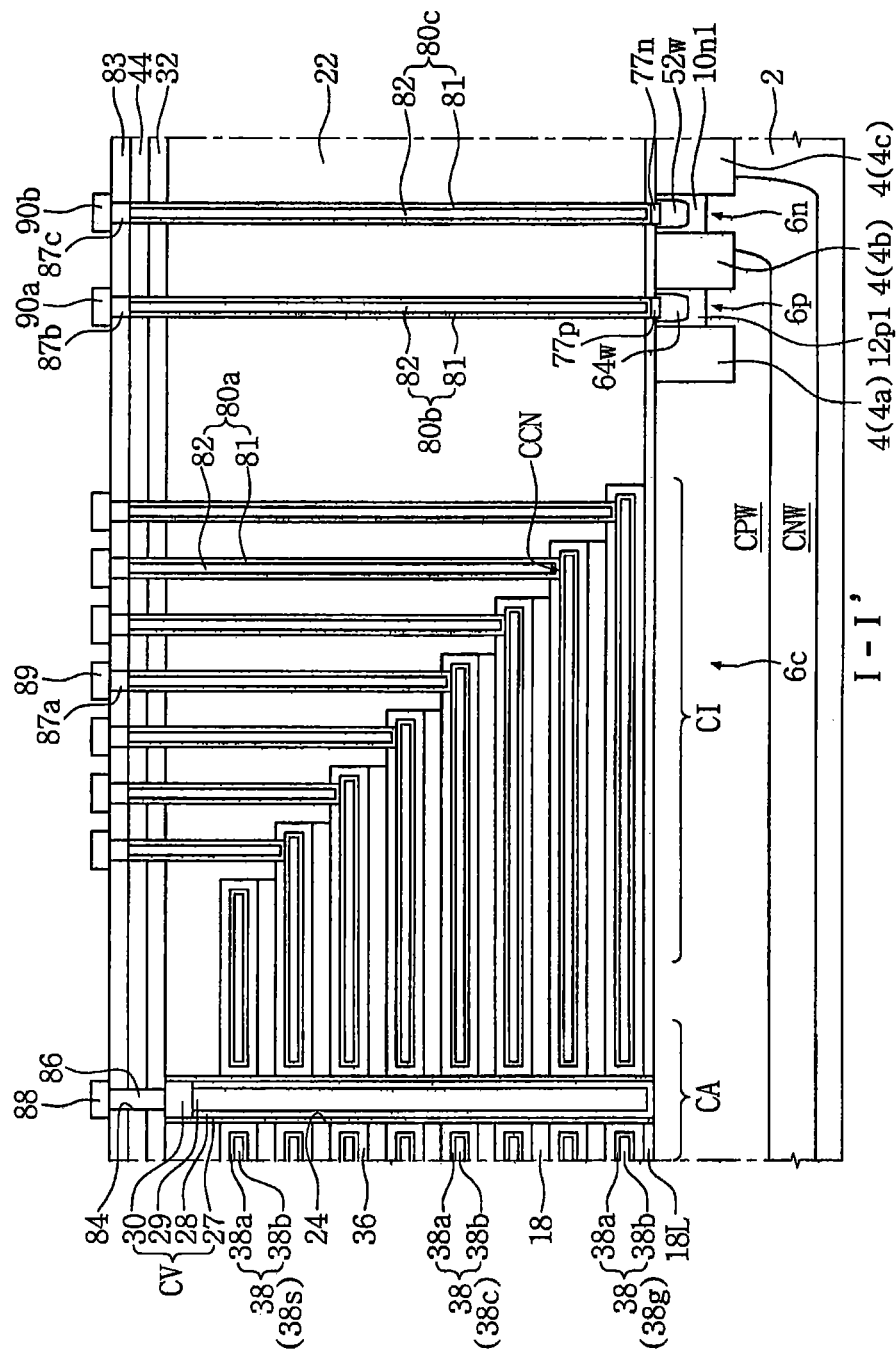
FIGS. 3A and 3B are cross-sectional views illustrating a semiconductor device according to some embodiments of the inventive concepts.
Figure 3B:
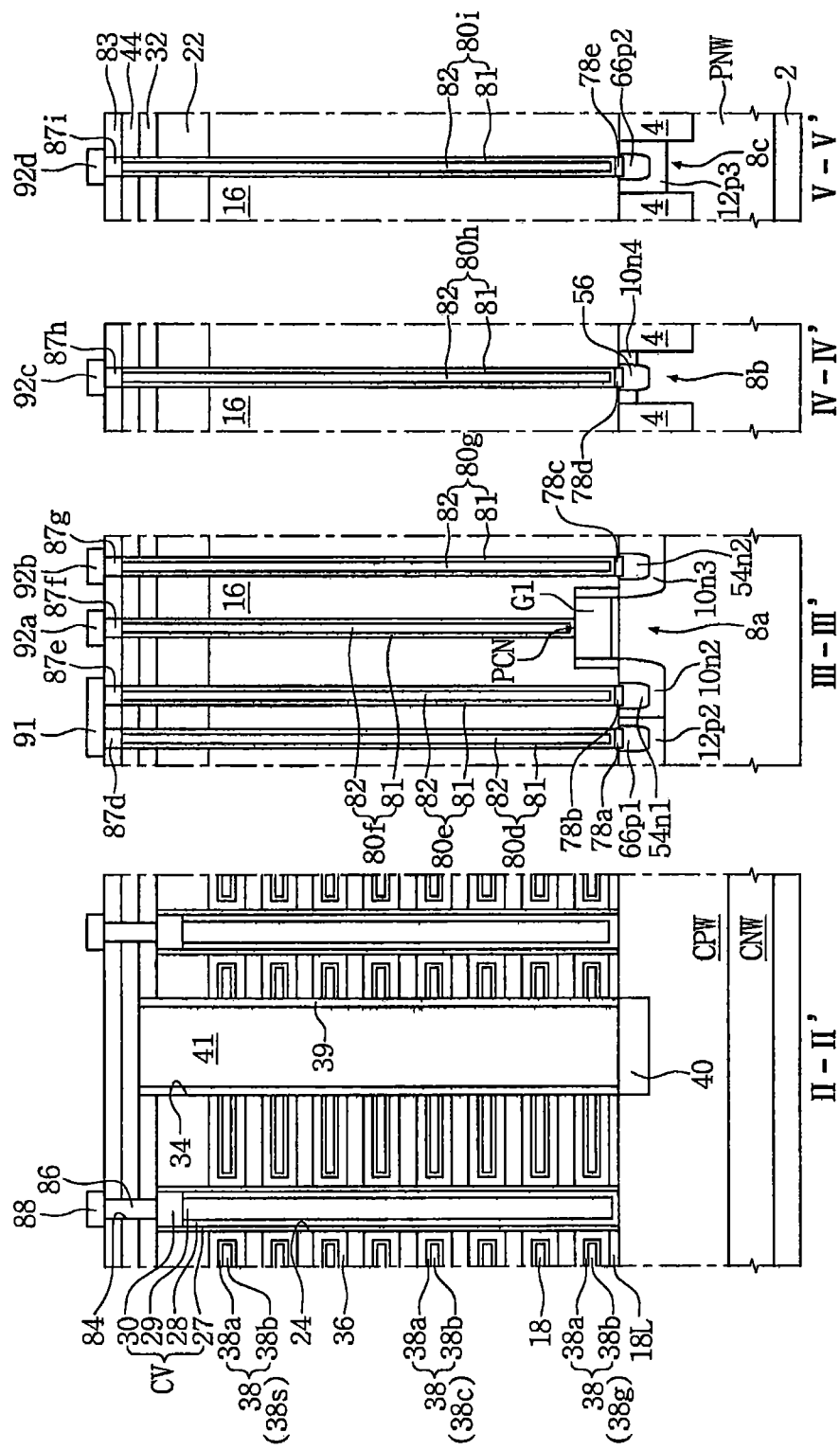

FIGS. 3A and 3B are cross-sectional views illustrating a semiconductor device according to some embodiments of the inventive concepts. In FIGS. 3A and 3B, FIG. 3A is a cross-sectional view illustrating an area taken along line I-I' of FIG. 1A, and FIG. 3B is cross-sectional views illustrating areas taken along lines II-II' of FIG. 1A, III-III', IV-IV', and V-V' of FIG. 1B.

Semiconductor devices according to some embodiments of the inventive concepts will be described with reference to FIGS. 1A, 1B, 3A, and 3B.

Referring to FIGS. 1A, 1B, 3A, and 3B, a substrate 2 may be provided. The substrate 2 may be a semiconductor substrate formed of a semiconductor material such as silicon, etc. The substrate 2 may include a first area AR1 and a second area AR2. The first area AR1 of the substrate 2 may include a cell array area CA and a step area CI. The second area AR2 of the substrate 2 may include a peripheral circuit area. The cell array area CA may include an area in which memory cells capable of storing data may be disposed. The step area CI may be an area in which cell gate contact structures capable of applying a voltage to a gate electrode of the cell array area CA may be disposed.

An isolation area 4, which may define a cell active region 6c, a first cell band active region 6p, a second cell band active region 6n, a first peripheral active region 8a, a second peripheral active region 8b, a third peripheral active region 8c, and a peripheral guard band active region 8d, may be disposed in the substrate 2.

The first cell band active region 6p may surround the cell active region 6c. The second cell band active region 6n may surround the first cell band active region 6p. The peripheral guard band active region 8d may be disposed so as to surround the second peripheral active region 8b.

In the first area AR1, the isolation area 4 may include a first cell isolation part 4a interposed between the cell active region 6c and the first cell band active region 6p, a second cell isolation part 4b interposed between the first cell band active region 6p and the second cell band active region 6n, and a third cell isolation part 4c which may surround outside the second cell band active region 6n.

In the second area AR2, the isolation area 4 may include a first peripheral isolation part 4d interposed between the peripheral guard band active region 8d and the second peripheral active region 8b, and a second peripheral isolation part 4e which may surround outside the peripheral guard band active region 8d.

The substrate 2 may be a semiconductor substrate of a first conductivity type. A first cell well area CNW of a second conductivity type different from the first conductivity type may be disposed in the substrate 2. A second cell well area CPW of the first conductivity type may be disposed in the substrate 2.

In some embodiments, the first conductivity type may have a P-type conductivity type, and the second conductivity type may have an N-type conductivity type. For example, the first cell well area CNW may be an N-type well area, and the second cell well area CPW may be a P-type well area. The second cell well area CPW may be formed in the substrate 2 of the cell array area CA and the step area CI and in the first cell band active region 6p. The first cell well area CNW may be formed in the substrate 2 under the second cell well area CPW and in the second cell band active region 6n. The first cell well area CNW may be formed in a structure that surrounds a lower part of the second cell well area CPW.

A cell body impurity region 12p1 may be disposed in the first cell band active region 6p. A cell body contact region 64w may be disposed in the cell body impurity region 12p1. The cell body contact region 64w may have the same conductivity type as the cell body impurity region 12p1 and an impurity concentration higher than the cell body impurity region 12p1.

A cell guard impurity region 10n1 may be disposed in the second cell band active region 6n. A cell guard contact area 52w may be disposed in the cell guard impurity region 10n1. The cell guard contact area 52w may have the same conductivity type as the cell guard impurity region 10n1 and an impurity concentration higher than the cell guard impurity region 10n1.

The cell body impurity region 12p1 may have the same conductivity type as the second cell well area CPW, for example, may have a P-type conductivity type and an impurity concentration higher than the second cell well area CPW. The cell guard impurity region 10n1 may have the same conductivity type as the first cell well area CNW, for example, may have an N-type conductivity type and an impurity concentration higher than the first cell well area CNW.

Peripheral transistors may be disposed in the second area AR2 of the substrate 2. The peripheral transistors may include a first peripheral transistor PTR1, a second peripheral transistor PTR2, and a third peripheral transistor PTR3.

In some embodiments, the first and second peripheral transistors PTR1 and PTR2 may be NMOS transistors, and the third peripheral transistor PTR3 may be a PMOS transistor.

The first peripheral transistor PTR1 may include a first peripheral gate G1 and first peripheral impurity regions 10n2 and 10n3. The first peripheral gate G1 may cross the first peripheral active region 8a. The first peripheral impurity regions 10n2 and 10n3 may include a first source area 10n2 and a first drain area 10n3, which may be formed in the first peripheral active region 8a on both sides of the first peripheral gate G1. A first body impurity region 12p2, which may be adjacent to the first source area 10n2 and disposed in the first peripheral active region 8a, may be disposed.

The first peripheral active region 8a may have a P-type conductivity type, the first source and drain areas 10n2 and 10n3 may have an N-type conductivity type, and the first body impurity region 12p2 may have a P-type conductivity type.

The first body impurity region 12p2 may have an impurity concentration higher than a channel area in the first peripheral active region 8a, which may be defined between the first source and drain areas 10n2 and 10n3. The first peripheral transistor PTR1 may be a power MOSFET.

The second peripheral transistor PTR2 may include a second peripheral gate G2 which may cross the second peripheral active region 8b, and a second peripheral impurity region 10n4 which may be formed in the second peripheral active region 8b on both sides of the second peripheral gate G2.

The third peripheral transistor PTR3 may include a third peripheral gate G3 which may cross the third peripheral active region 8c, and a third peripheral impurity region 12p3 which may be formed in the third peripheral active region 8c on both sides of the third peripheral gate G3. The third peripheral transistor PTR3 may be a PMOS transistor formed in a peripheral well area PNW of an N-type conductivity type.

A peripheral body contact region 66p1 may be disposed in the first body impurity region 12p2. The peripheral body contact region 66p1 may have the same conductivity type as the first body impurity region 12p2, and may have an impurity concentration higher than the first body impurity region 12p2.

First peripheral contact regions 54n1 and 54n2 may be disposed in the first peripheral impurity regions 10n2 and 10n3, respectively. The first peripheral contact regions 54n1 and 54n2 may include a first source contact area 54n1 disposed in the first source area 10n2 of the first peripheral impurity regions 10n2 and 10n3, and a first drain contact area 54n2 disposed in the first drain area 10n3 of the first peripheral impurity regions 10n2 and 10n3. The first peripheral contact regions 54n1 and 54n2 may have the same conductivity type as the first source area 10n2 and the first drain contact area 54n2, and may have an impurity concentration higher than the first source area 10n2 and the first drain contact area 54n2.

A second peripheral contact region 56 may be disposed in the second peripheral impurity region 10n4. The second peripheral contact region 56 may have a junction deeper than the second peripheral impurity region 10n4. The second peripheral contact region 56 may have the same conductivity type as the second peripheral impurity region 10n4, and may have an impurity concentration higher than the second peripheral impurity region 10n4. A third peripheral contact region 66p2 may be disposed in the third peripheral impurity region 12p3. The third peripheral contact region 66p2 may have the same conductivity type as the third peripheral impurity region 12p3, and may have an impurity concentration higher than the third peripheral impurity region 12p3.

Cell gate conductive patterns 38 stacked in a vertical direction may be disposed in the first area AR1 of the substrate 2. The cell gate conductive patterns 38 may be disposed in the cell array area CA, may extend to the step area CI, and may be disposed in a step structure in which the cell gate conductive patterns 38 may be gradually lowered in the step area CI.

A lowermost gate conductive pattern 38g of the cell gate conductive patterns 38 may include a ground select gate electrode, an uppermost gate conductive pattern 38s may include a string select gate electrode, and a plurality of gate conductive patterns 38c between the lowermost gate conductive pattern 38g and the uppermost gate conductive pattern 38s may include cell gate electrodes. The plurality of gate conductive patterns 38c between the lowermost gate conductive pattern 38g and the uppermost gate conductive pattern 38s may include word lines of a memory device.

Cell gate contact regions CCN including a first element may be disposed in ones of the cell gate conductive patterns 38 in the step area CI. The cell gate conductive patterns 38 in the cell array area CA may not include the first element.

In some embodiments, the first element of the cell gate contact regions CCN may be the same element as dopant impurities of the cell guard contact area 52w, the first source contact area 54n1, the first drain contact area 54n2, and the second peripheral contact region 56. For example, the cell guard contact area 52w, the first source contact area 54n1, the first drain contact area 54n2, and the second peripheral contact region 56 may be areas having an N-type conductivity type, which may be formed using the first element, for example, a group V element (e.g., "P" or "As") of the periodic table as a dopant, and the cell gate contact region CCN may be an area which may be formed by implanting the first element, for example, the group V element in the cell gate conductive patterns 38.

In some embodiments, the first element of the cell gate contact region CCN may be the same element as dopant impurities of the cell body contact region 64w, the peripheral body contact region 66p1, and the third peripheral contact region 66p2. For example, the cell body contact region 64w, the peripheral body contact region 66p1, and the third peripheral contact region 66p2 may be areas having a P-type conductivity type, which may be formed using the first element, for example, a group III element (e.g., boron (B)) of the periodic table as a dopant, and the cell gate contact region CCN may be an area which may be formed by implanting the first element, for example, the group III element in the cell gate conductive patterns 38.

Cell interlayer insulating patterns 18 may be interposed between the cell gate conductive patterns 38. A buffer insulating layer 18L may be interposed between the lowermost gate conductive pattern 38g and the substrate 2. A peripheral interlayer insulating layer 16 may be disposed in the second area AR2 of the substrate 2. A first interlayer insulating layer 22, which may cover the peripheral interlayer insulating layer 16 and the cell gate conductive patterns 38, may be disposed on the substrate 2.

Cell vertical structures CV, which may pass through the first interlayer insulating layer 22, the cell gate conductive patterns 38, and the cell interlayer insulating patterns 18 and may be connected to the substrate 2, may be disposed on the cell array area CA of the substrate 2.

Ones of the cell vertical structures CV may include a first cell dielectric 27, a channel semiconductor pattern 28, a core insulating pattern 29, and a cell pad pattern 30. The cell pad pattern 30 may be disposed on the core insulating pattern 29. The channel semiconductor pattern 28 may be connected to the substrate 2. The channel semiconductor pattern 28 may be disposed on side surfaces and a bottom of the core insulating pattern 29. The first cell dielectric 27 may be disposed on an outside of the channel semiconductor pattern 28. The first cell dielectric 27 may be interposed between the channel semiconductor pattern 28 and the cell gate conductive patterns 38. The channel semiconductor pattern 28 and the cell pad pattern 30 may be formed of silicon. For example, the channel semiconductor pattern 28 and the cell pad pattern 30 may be formed of polysilicon. The cell pad pattern 30 may have an N-type conductivity type.

Second cell dielectrics 36 may be interposed between the cell gate conductive patterns 38 and the cell vertical structures CV. Ones of the first and second cell dielectrics 27 and 36 may include a data storage layer capable of storing data. For example, the first cell dielectric 27 may include a tunnel dielectric layer and the data storage layer, which may be sequentially formed from the channel semiconductor pattern 28. The second cell dielectric 36 may include a blocking dielectric. The first and second cell dielectrics 27 and 36 may have the same structure as a dielectric between a control gate of a NAND flash memory device and a body of a cell transistor of the NAND flash memory device. However, the scope of the inventive concepts is not limited to a structure of the NAND flash memory device and the inventive concepts may be used for various memory devices.

Ones of the cell gate conductive patterns 38 may include a first gate conductive layer 38a and a second gate conductive layer 38b. The first gate conductive layer 38a may be a barrier conductive layer (e.g., a metal nitride such as TiN, or the like). The second gate conductive layer 38b may be formed of a metal layer (e.g., a metal material such as tungsten, or the like). The first gate conductive layer 38a may be interposed between the second cell dielectric 36 and the second gate conductive layer 38b.

A second interlayer insulating layer 32 may be disposed on the first interlayer insulating layer 22. A trench 34, which may pass through the first and second interlayer insulating layers 22 and 32, the buffer insulating layer 18L, the cell interlayer insulating patterns 18, and the cell gate conductive patterns 38, may be disposed. A cell source pattern 41 may be disposed in the trench 34. An insulating spacer 39 may be interposed between side walls of the cell source pattern 41 and the trench 34. The cell source pattern 41 may be formed of a conductive material (e.g., tungsten, or the like). A cell source impurity region 40 may be disposed in the substrate 2 under the cell source pattern 41. The cell source impurity region 40 may have an N-type conductivity type.

A third interlayer insulating layer 44 may be disposed on the second interlayer insulating layer 32.

Cell gate contact structures 80a, a cell body contact structure 80b, a cell guard contact structure 80c, a peripheral body contact structure 80d, a first source contact structure 80e, a peripheral gate contact structure 80f, a first drain contact structure 80g, a second peripheral contact structure 80h, and a third peripheral contact structure 80i may be disposed on the substrate 2. The first source contact structure 80e and the first drain contact structure 80g may be first peripheral contact structures.

The cell gate contact structures 80a may pass through the first to third interlayer insulating layers 22, 32, and 44, and be electrically connected to the cell gate contact regions CCN in the cell gate conductive patterns 38. The cell gate contact structures 80a may be self-aligned with the cell gate contact regions CCN. The cell gate contact structures 80a may have an upper surface which may be disposed on the same plane as upper surfaces of the cell body contact structure 80b, the cell guard contact structure 80c, the peripheral body contact structure 80d, the first source contact structure 80e, the first drain contact structure 80g, the second peripheral contact structure 80h, and the third peripheral contact structure 80i. The cell gate contact structures 80a may have a lower surface different from lower surfaces of the cell body contact structure 80b, the cell guard contact structure 80c, the peripheral body contact structure 80d, the first source contact structure 80e, the first drain contact structure 80g, the second peripheral contact structure 80h, and the third peripheral contact structure 80i, for example, may have a lower surface disposed on a plane higher than the lower surfaces of the cell body contact structure 80b, the cell guard contact structure 80c, the peripheral body contact structure 80d, the first source contact structure 80e, the first drain contact structure 80g, the second peripheral contact structure 80h, and the third peripheral contact structure 80i.

The cell body contact structure 80b may pass through the interlayer insulating layers 22, 32, and 44 and may be electrically connected to the cell body contact region 64w. The cell body contact structure 80b may be self-aligned with the cell body contact region 64w.

The cell guard contact structure 80c may pass through the first to third interlayer insulating layers 22, 32, and 44 and may be electrically connected to the cell guard contact area 52w. The cell guard contact structure 80c may be self-aligned with the cell guard contact area 52w.

The peripheral body contact structure 80d may pass through the first to third interlayer insulating layers 22, 32, and 44 and the peripheral interlayer insulating layer 16 and may be electrically connected to the peripheral body contact region 66p1. The peripheral body contact structure 80d may be self-aligned with the peripheral body contact region 66p1.

The first source contact structure 80e of the first peripheral contact structures may pass through the first to third interlayer insulating layers 22, 32, and 44 and the peripheral interlayer insulating layer 16 and may be electrically connected to and self-aligned with the first source contact area 54n1. The first drain contact structure 80g of the first peripheral contact structures may pass through the first to third interlayer insulating layers 22, 32, and 44 and the peripheral interlayer insulating layer 16 and may be self-aligned with and electrically connected to the first drain contact area 54n2. The peripheral gate contact structure 80f may pass through the first to third interlayer insulating layers 22, 32, and 44 and the peripheral interlayer insulating layer 16 and may be self-aligned with and electrically connected to a peripheral gate contact area PCN of the first peripheral gate G1. The second peripheral contact structure 80h may pass through the first to third interlayer insulating layers 22, 32, and 44 and the peripheral interlayer insulating layer 16 and may be self-aligned with and electrically connected to the second peripheral contact region 56. The third peripheral contact structure 80i may pass through the first to third interlayer insulating layers 22, 32, and 44 and the peripheral interlayer insulating layer 16 and may be self-aligned with and electrically connected to the third peripheral contact region 66p2.

In some embodiments, ones of the contact structures 80a to 80i may include a first conductive layer 81 and a second conductive layer 82 on the first conductive layer 81. The first conductive layer 81 may surround side surfaces and a bottom of the second conductive layer 82.

In some embodiments, the first conductive layer 81 may include a first metal layer (e.g., a metal material such as Ti, or the like) and a metal nitride layer (e.g., a metal nitride such as TiN, WN, or the like) on the first metal layer, and the second conductive layer 82 may include a second metal layer (e.g., W, or the like).

In some embodiments, a cell body silicide 77p may be interposed between the cell body contact region 64w and the cell body contact structure 80b. A cell guard silicide 77n may be interposed between the cell guard contact area 52w and the cell guard contact structure 80c. A first body silicide 78a may be interposed between the peripheral body contact region 66p1 and the peripheral body contact structure 80d. A first source silicide 78b may be interposed between the first source contact area 54n1 and the first source contact structure 80e. A first drain silicide 78c may be interposed between the first drain contact area 54n2 and the first drain contact structure 80g. A second peripheral silicide 78d may be interposed between the second peripheral contact region 56 and the second peripheral contact structure 80h. A third peripheral silicide 78e may be interposed between the third peripheral contact region 66p2 and the third peripheral contact structure 80i.

A fourth interlayer insulating layer 83 may be disposed on portions of the substrate 2 having the contact structures 80a to 80i.

Bit line contact structures 86, which may pass through the interlayer insulating layers 32, 44, and 83 and may be electrically connected to respective ones of the cell pad patterns 30 of the cell vertical structures CV, may be disposed. Cell gate contact structures 87a may be disposed on respective ones of the cell gate contact structures 80a. A cell body contact plug 87b may be disposed on the cell body contact structure 80b. A cell guard contact plug 87c may be disposed on the cell guard contact structure 80c. A peripheral body contact plug 87d may be disposed on the peripheral body contact structure 80d. A first source contact plug 87e may be disposed on the first source contact structure 80e. A peripheral gate contact plug 87f may be disposed on the peripheral gate contact structure 80f. A first drain contact plug 87g may be disposed on the first drain contact structure 80g. A second peripheral contact plug 87h may be disposed on the second peripheral contact structure 80h. A third peripheral contact plug 87i may be disposed on the third peripheral contact structure 80i.

Bit line interconnection structures 88 electrically connected to respective ones of the bit line contact structures 86 may be disposed. Word line interconnection structures 89 electrically connected to respective ones of the cell gate contact structures 87a may be disposed. A cell body interconnection structure 90a electrically connected to the cell body contact plug 87b may be disposed. A cell guard interconnection structure 90b electrically connected to the cell guard contact plug 87c may be disposed. A peripheral source/body interconnection structure 91, which may be simultaneously and electrically connected to the peripheral body contact plug 87d and the first source contact plug 87e, may be disposed. A peripheral gate interconnection structure 92a electrically connected to the peripheral gate contact plug 87f may be disposed. A first drain interconnection structure 92b electrically connected to the first drain contact plug 87g may be disposed. A second peripheral interconnection structure 92c electrically connected to the second peripheral contact plug 87h may be disposed. A third peripheral interconnection structure 92d electrically connected to the third peripheral contact plug 87i may be disposed.

In some embodiments, ones of the cell body contact structure 80b and the cell guard contact structure 80c may be configured in a shape of a plurality of dots. Here, the shape of the dots may be a circular shape or a rectangular shape. However, the scope of the inventive concepts is not limited to the above-mentioned shapes.

Figure 2:
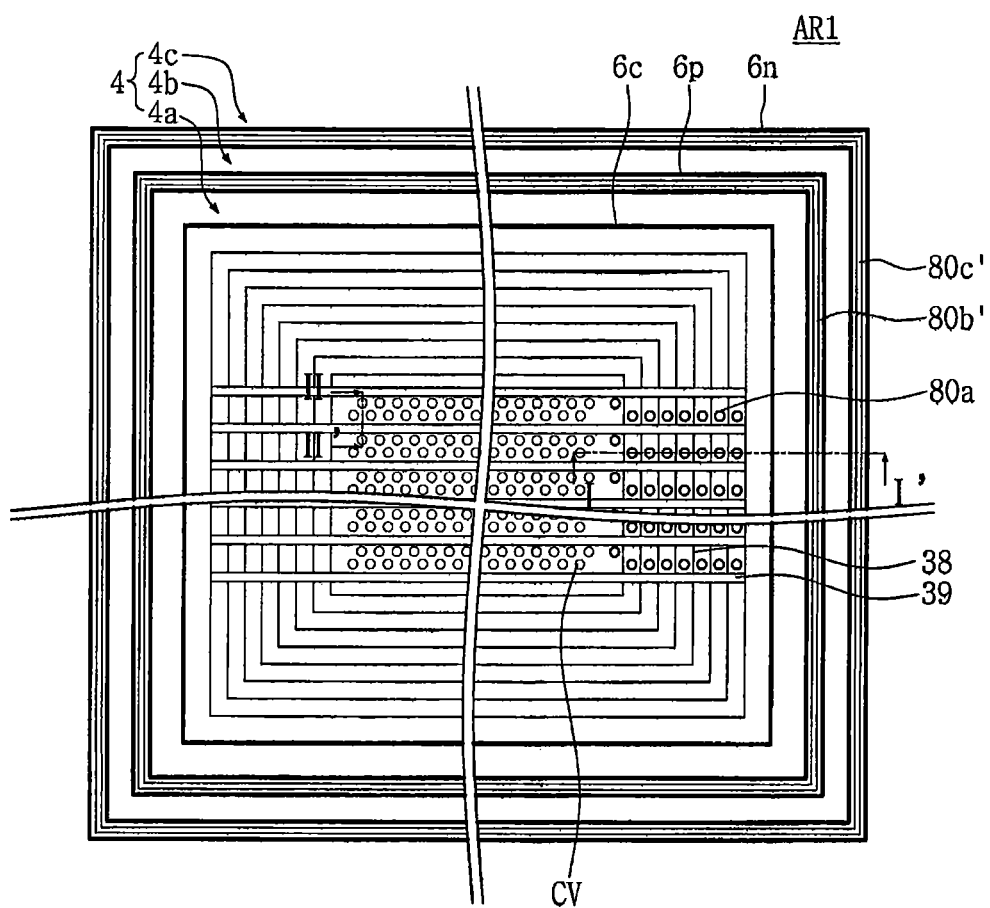
FIG. 2 is a plan view illustrating a semiconductor device according to some embodiments of the inventive concepts.

FIG. 2 is a plan view illustrating a semiconductor device of according to some embodiments of the inventive concepts. Referring to FIG. 2, one or more of the cell body contact structure 80b and the cell guard contact structure 80c may be disposed in a line shape that surrounds the cell active region 6c and may be continuously connected.

Figure 4:
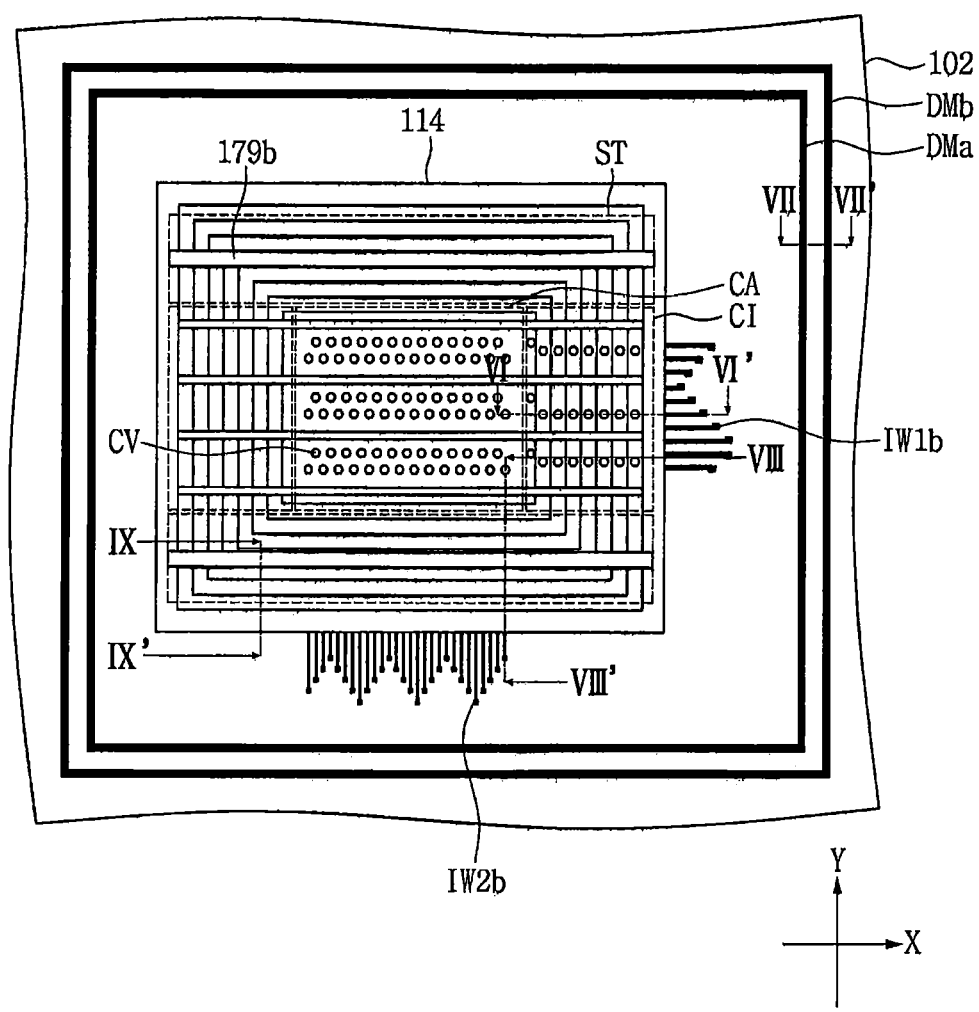
FIG. 4 is a plan view illustrating a semiconductor device of according to some embodiments of the inventive concepts.
Figure 5B:
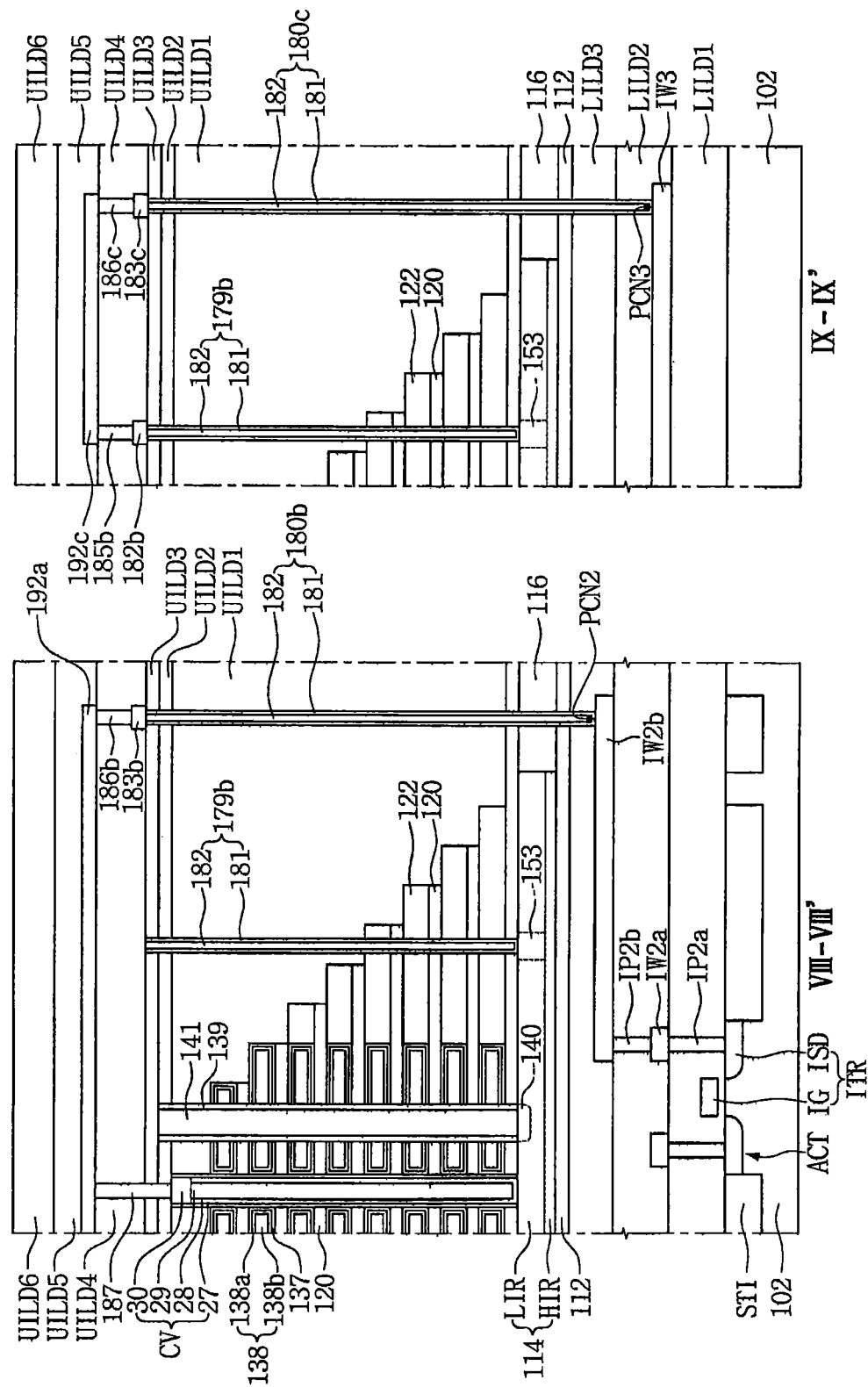
Figure 7A:
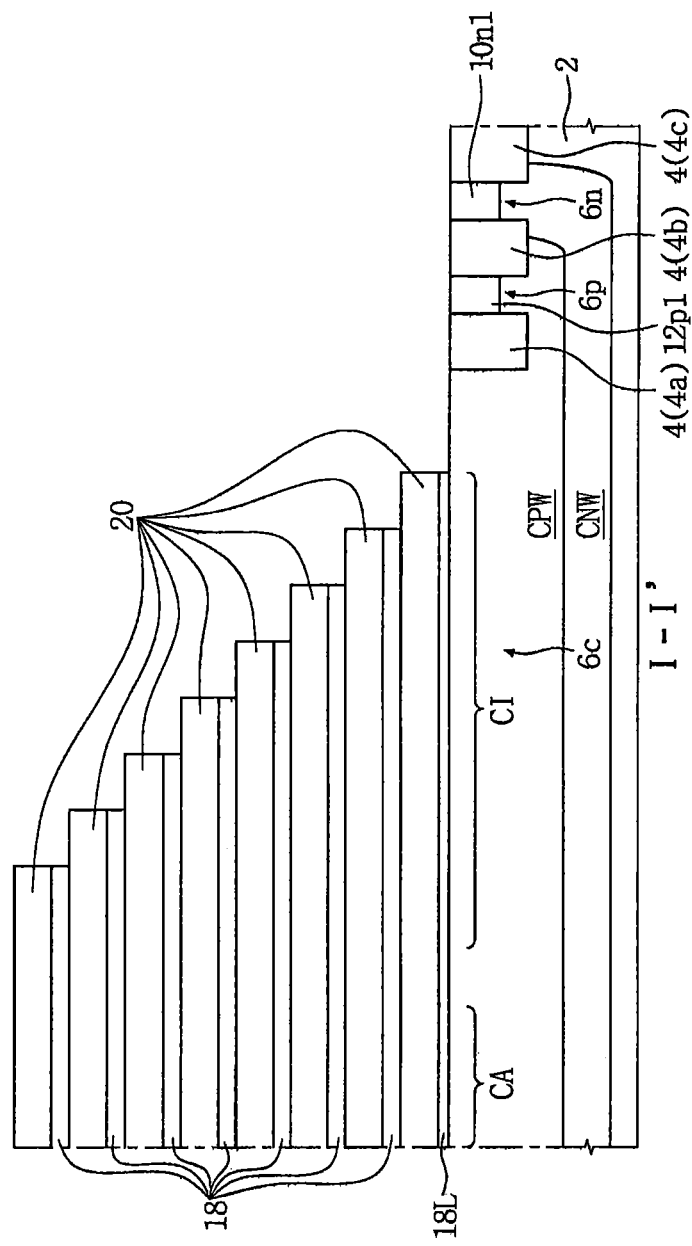
Figure 7B:
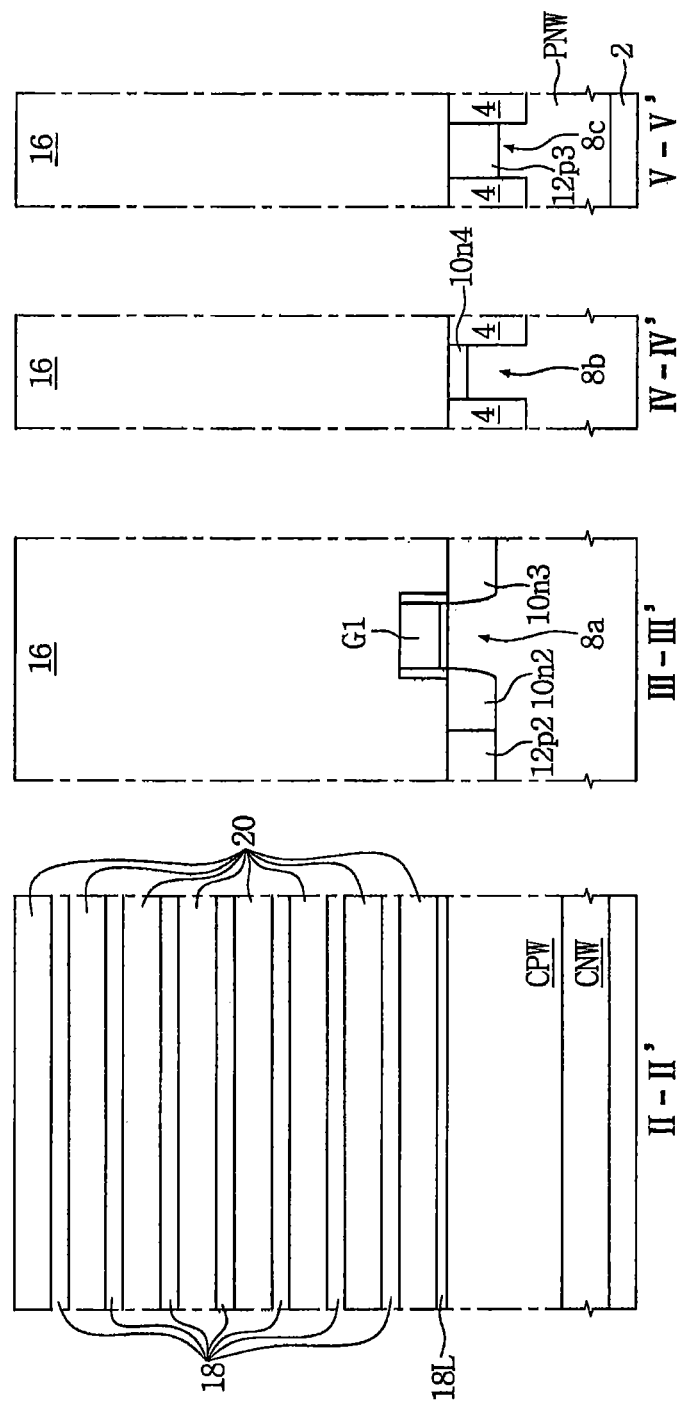
Figure 8A:
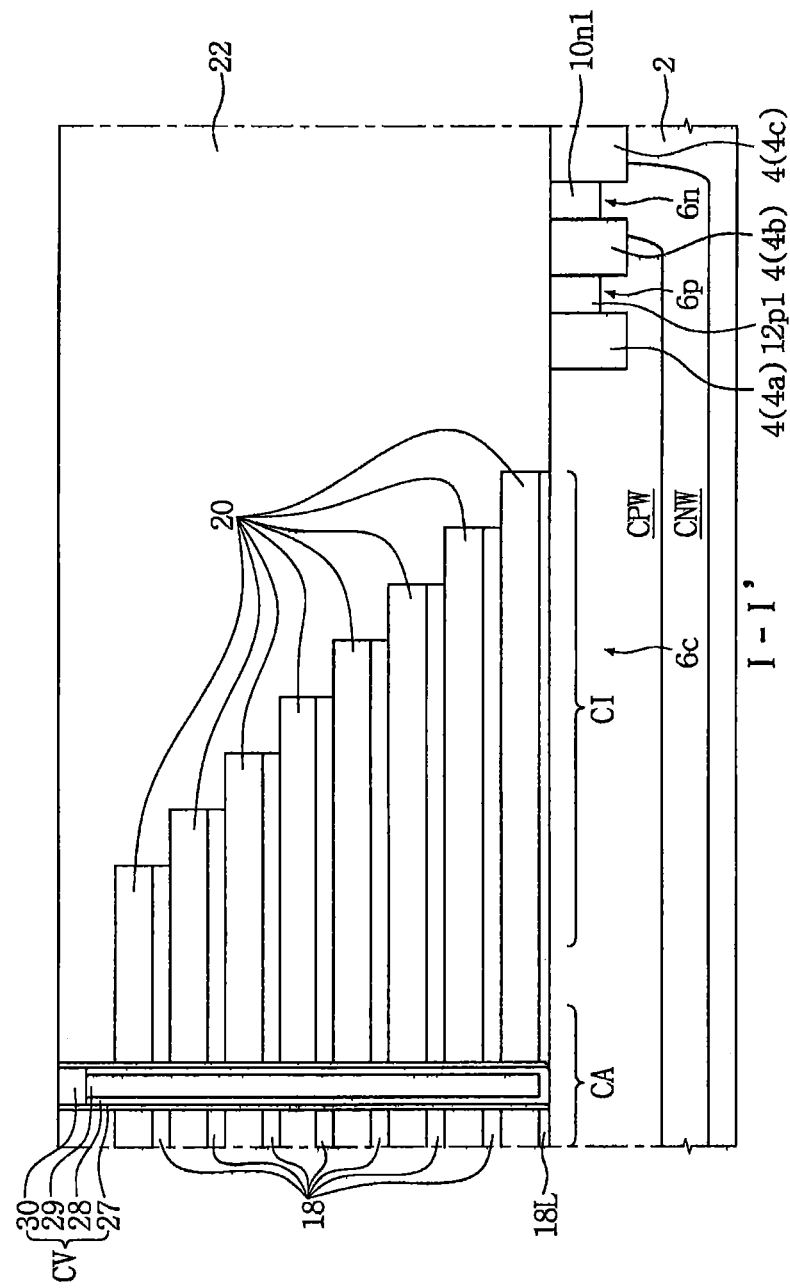
Figure 8B:
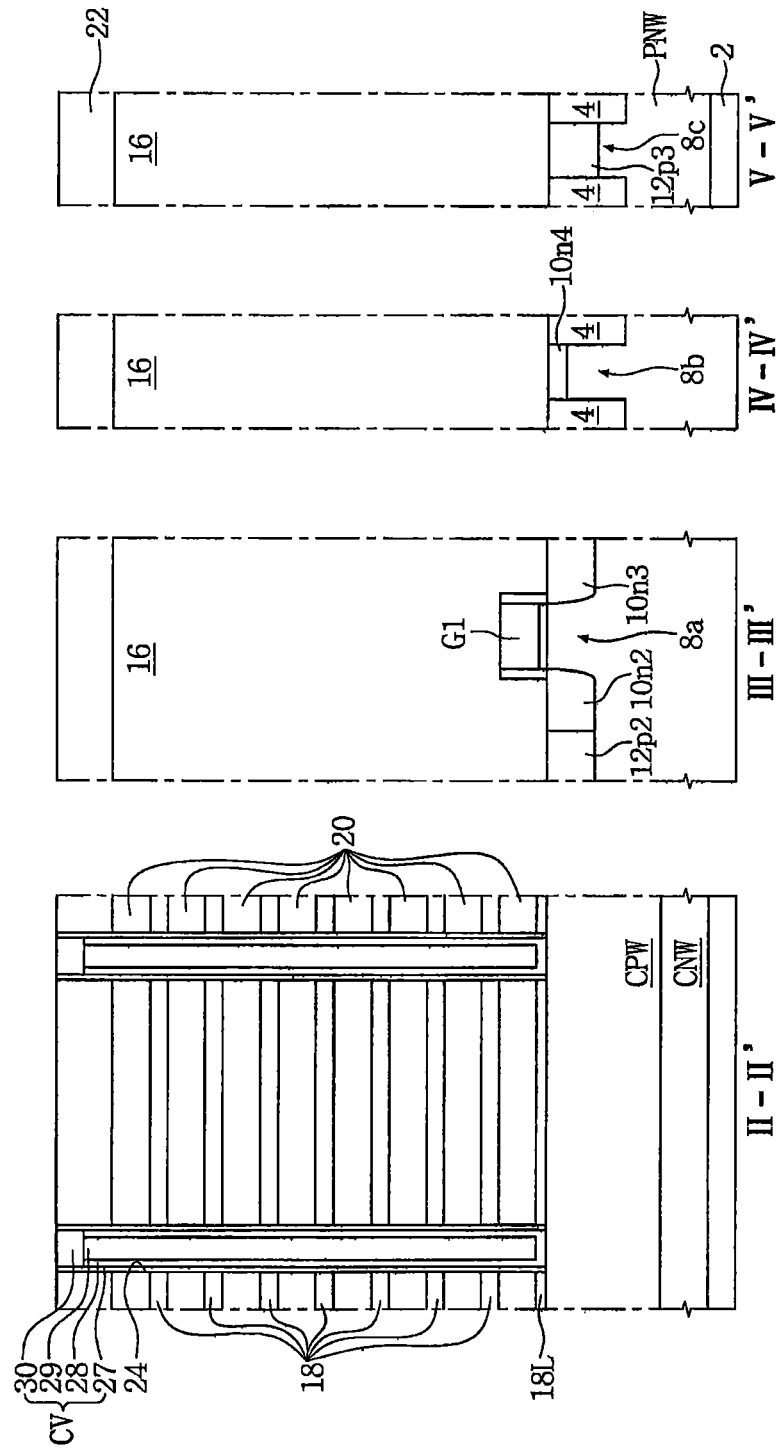
Figure 9A:
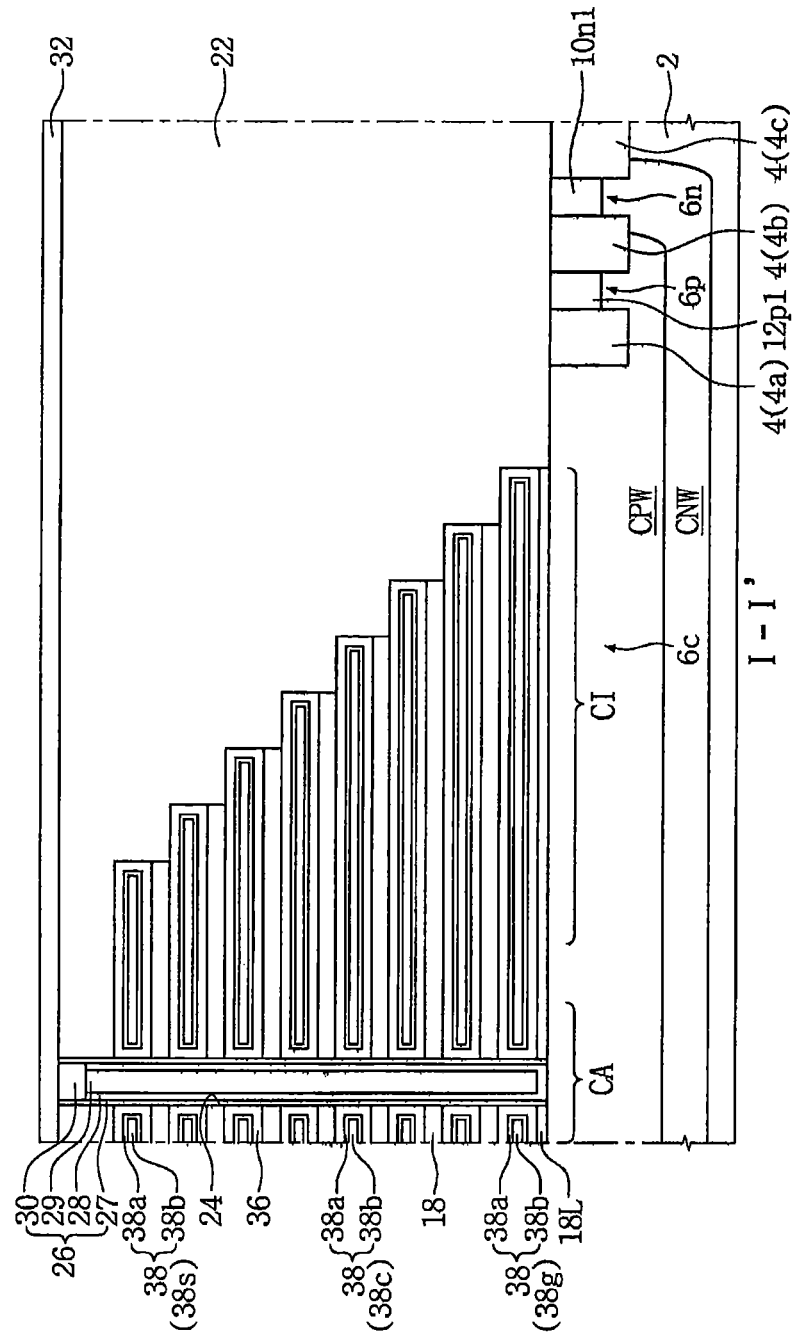
Figure 9B:
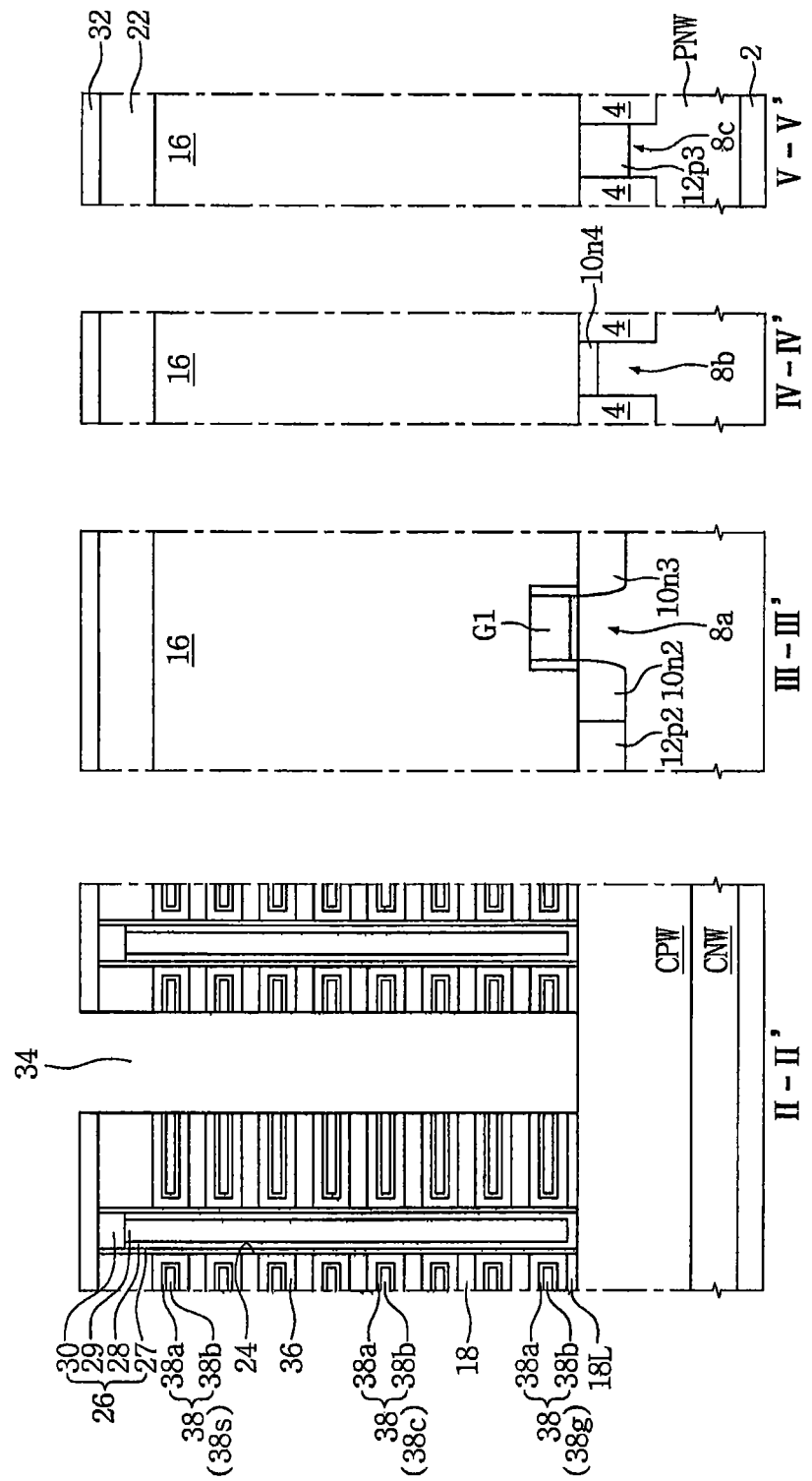
Figure 10A:
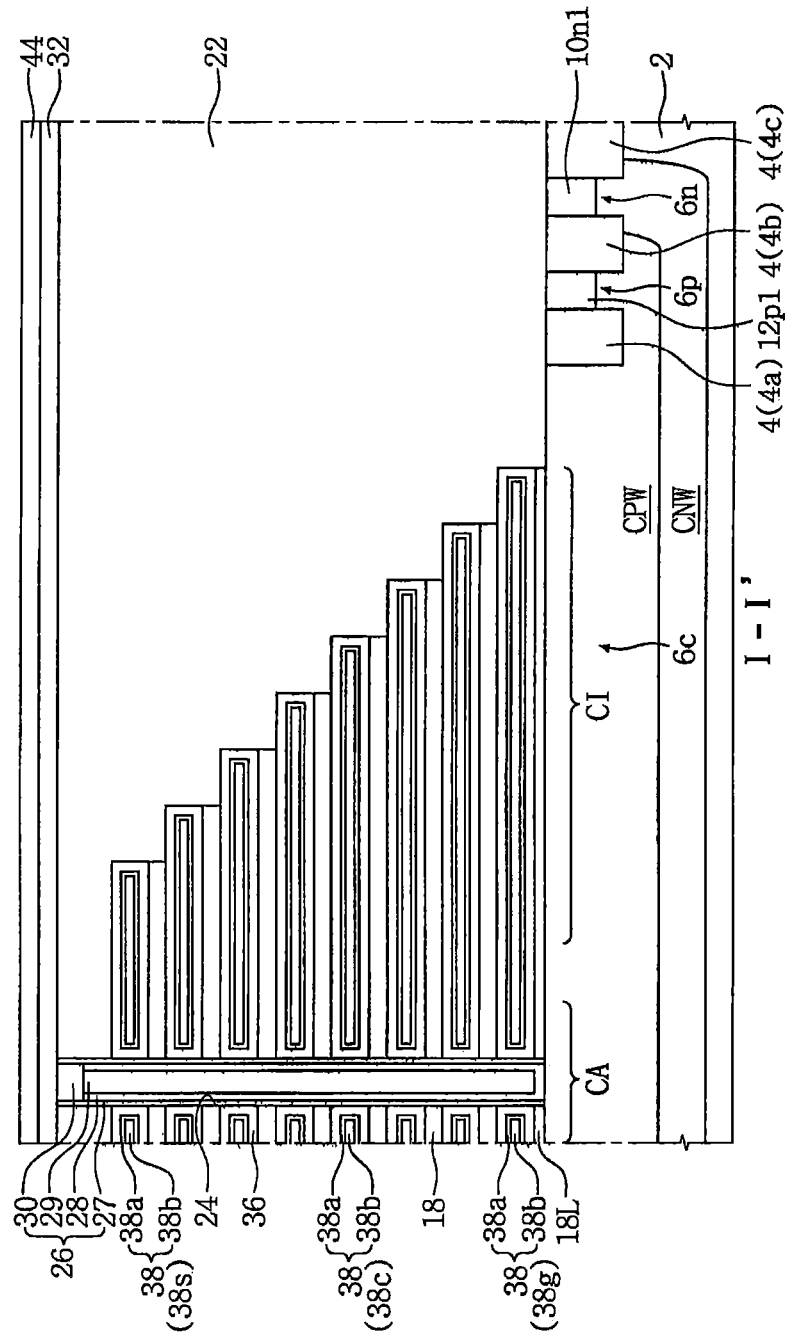
Figure 10B:
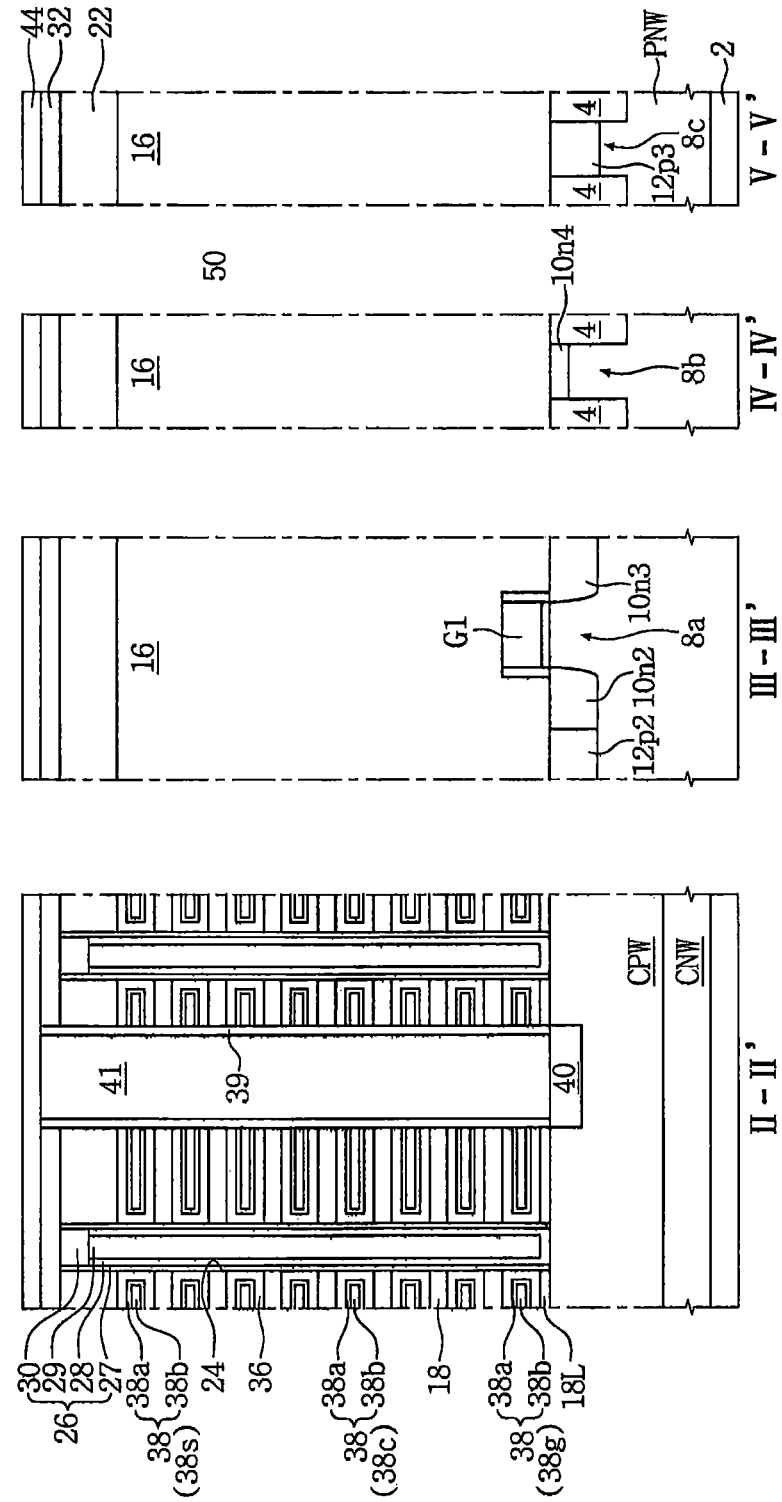
Figure 11A:
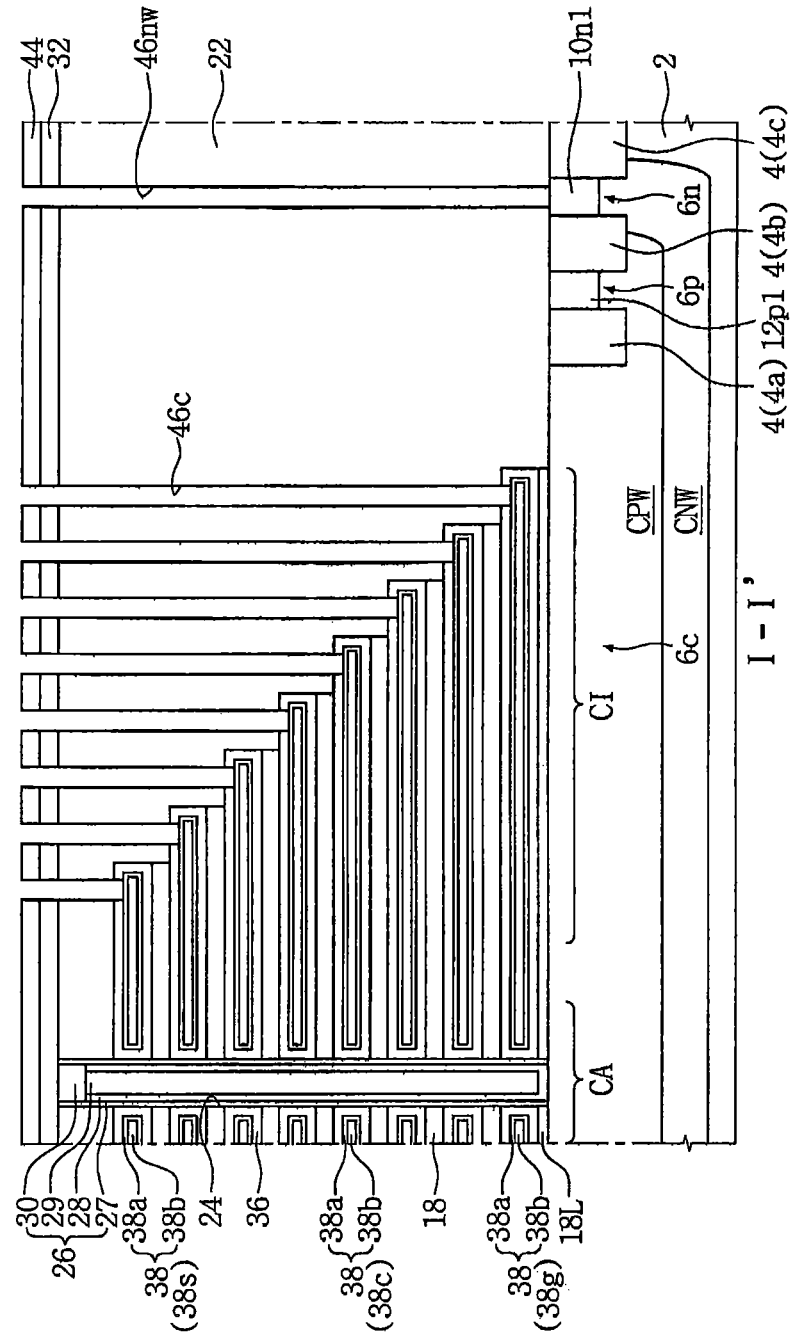
Figure 11B:
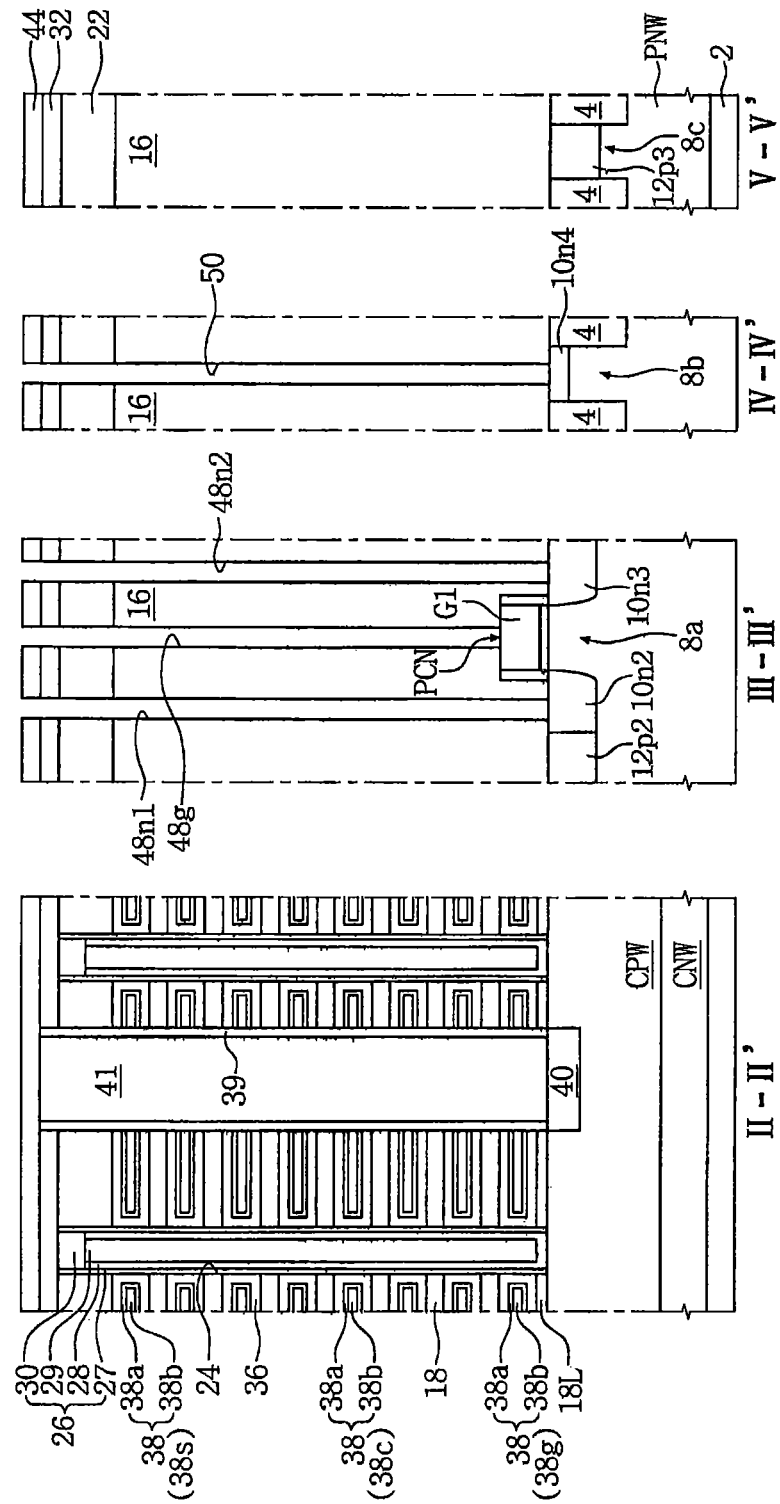

Semiconductor devices according to some embodiments of the inventive concepts will be described with reference to FIGS. 4, 5A, and 5B. FIG. 4 is a plan view illustrating a semiconductor device according to some embodiments of the inventive concepts. FIGS. 5A and 5B are cross-sectional views illustrating a semiconductor device according to some embodiments of the inventive concepts. In FIGS. 5A and 5B, FIG. 5A is cross-sectional views illustrating areas taken along lines VI-VI' and VII-VII' of FIG. 4, and FIG. 5B is cross-sectional views illustrating areas taken along lines VIII-VIII' and IX-IX' of FIG. 4.

Referring to FIGS. 4, 5A, and 5B, a substrate 102 may be provided. The substrate 102 may be a semiconductor substrate. An isolation area STI which may define an active region ACT may be disposed on the substrate 102. Peripheral transistors may be disposed on the substrate 102. For example, a peripheral transistor ITR including a peripheral gate IG on the active region ACT and a peripheral source/drain area ISD in the active region ACT on both sides of the peripheral gate IG may be disposed.

In some embodiments, a first lower inner dam LD1a and a first lower outer dam LD1b, which may have the same material as the peripheral gate IG and may be located at the same level as the peripheral gate IG, may be disposed.

A first lower interlayer insulating layer LILD1 which may cover the peripheral transistor ITR may be disposed on the substrate 102.

A plurality of lower plugs, a second lower inner dam LD2a, and a second lower outer dam LD2b, which may pass through the first lower interlayer insulating layer LILD1, may be disposed. The plurality of lower plugs may include a first lower plug TP1a and a second lower plug TP2a. The second lower plug IP2a may be electrically connected to the peripheral transistor ITR. The second lower plug TP2a may be electrically connected to the peripheral source/drain area ISD of the peripheral transistor ITR.

A plurality of peripheral lower interconnection patterns, a third lower inner dam LD3a, and a third lower outer dam LD3b may be disposed on the first lower interlayer insulating layer LILD1. The peripheral lower interconnection patterns may include a first lower interconnection pattern IW1a, a second lower interconnection pattern IW2a, and a third lower interconnection pattern IW3.

A second lower interlayer insulating layer LILD2, which may cover the plurality of lower interconnection patterns, the third lower inner dam LD3a, and the third lower outer dam LD3b, may be disposed on the first lower interlayer insulating layer LILD1.

A plurality of upper plugs, a fourth lower inner dam LD4a, and a fourth lower outer dam LD4b, which may pass through the second lower interlayer insulating layer LILD2, may be disposed. The plurality of upper plugs may include a first upper plug IP1b and a second upper plug IP2b.

A plurality of upper interconnection patterns, a fifth lower inner dam LD5a, a and fifth lower outer dam LD5b may be disposed on the second lower interlayer insulating layer LILD2. The plurality of upper interconnection patterns may include a first upper interconnection pattern IW1b and a second upper interconnection pattern IW2b. The first upper interconnection pattern IW1b and the second upper interconnection pattern IW2b may be disposed on a plane different from the third lower interconnection pattern IW3. The first upper interconnection pattern IW1b and the second upper interconnection pattern IW2b may be disposed farther away from the semiconductor substrate 102 than the third lower interconnection pattern IW3.

The first upper interconnection pattern IW1b, the first upper plug IP1b, the first lower interconnection pattern IW1a, and the first lower plug IP1a may be electrically connected to each other. The second upper interconnection pattern IW2b, the second upper plug IP2b, the second lower interconnection pattern IW2a, and the second lower plug IP2a may be electrically connected to each other.

The first lower inner dam LD1a, the second lower inner dam LD2a, the third lower inner dam LD3a, the fourth lower inner dam LD4a, and the fifth lower inner dam LD5a may be connected to each other and may configure a lower inner dam structure LDMa. The first lower outer dam LD1b, the second lower outer dam LD2b, the third lower outer dam LD3b, the fourth lower outer dam LD4b, and the fifth lower outer dam LD5b may be connected to each other and may configure a lower outer dam structure LDMb.

A third lower interlayer insulating layer LILD3, which may cover the plurality of upper interconnection patterns, the fifth lower inner dam LD5a, and the fifth lower outer dam LD5b, may be disposed on the second lower interlayer insulating layer LILD2.

A buffer insulating layer 112 may be disposed on the third lower interlayer insulating layer LILD3. The buffer insulating layer 112 may have an etch selectivity different from the third lower interlayer insulating layer LILD3. For example, the buffer insulating layer 112 may be formed of silicon nitride, and the third lower interlayer insulating layer LILD3 may be formed of silicon oxide.

A cell semiconductor layer 114 may be disposed on the buffer insulating layer 112. The cell semiconductor layer 114 may be formed of silicon. The cell semiconductor layer 114 may be formed of doped polysilicon. For example, the cell semiconductor layer 114 may be formed doped silicon having a P-type conductivity type. The cell semiconductor layer 114 may include a high concentration impurity region HIR and a low concentration impurity region LIR, which may be disposed on the high concentration impurity region HIR and has an impurity concentration lower than the high concentration impurity region HIR. The high concentration impurity region HIR may be formed by implanting a group III element (e.g., boron) of the periodic table.

The cell semiconductor layer 114 may overlap a peripheral circuit including the peripheral transistor ITR. The first to third interconnection patterns IW1b, IW2b, and IW3 may overlap the cell semiconductor layer 114 and extend in a direction of an outside of the cell semiconductor layer 114. The first to third interconnection patterns IW1b, IW2b, and IW3 may be disposed at a level higher than lower surfaces of the lower inner/outer dam structures LDMa and LDMb. The lower surfaces of the lower inner/outer dam structures LDMa and LDMb may be disposed closer to the semiconductor substrate 102 than the first to third interconnection patterns IW1b, IW2b, and IWc.

A cell array area CA, a first step area CI located in a first direction X of the cell array area CA, and a second step area ST located in a second direction Y perpendicular to the first direction X of the cell array area CA may be disposed on the cell semiconductor layer 114.

Cell gate conductive patterns 138 which may extend to the first step area CI may be disposed on the cell array area CA of the cell semiconductor layer 114.

The cell gate conductive patterns 138 may include word lines of a memory device.

First insulating patterns 120 may be interposed between a lowermost cell gate conductive pattern of the cell gate conductive patterns 138 and the cell semiconductor layer 114, and between cell gate conductive patterns 138. The first insulating pattern 120 may be defined as a cell interlayer insulating pattern. The first insulating patterns 120 may be formed of silicon oxide. The first insulating patterns 120 may be disposed in the cell array area CA and may extend to the first and second step area CI and ST.

Second insulating patterns 122 may be disposed on the cell semiconductor layer 114. The second insulating patterns 122 may be interposed between the first insulating patterns 120 of the second step area ST. In the second step area ST, the first and second insulating patterns 120 and 122 may be disposed in a step structure. The second insulating patterns 122 may be disposed on the same plane as the cell gate conductive patterns 138.

A first upper interlayer insulating layer UILD1 having a planar upper surface may be disposed on the cell gate conductive patterns 138, the first insulating patterns 120, and the second insulating patterns 122.

Cell vertical structures CV, which may pass through the first upper interlayer insulating layer UILD1 and the cell gate conductive patterns 138 and may be connected to the cell semiconductor layer 114, may be disposed. The cell vertical structures CV may be disposed in the cell array area CA.

Ones of the cell vertical structures CV may include a first cell dielectric 27, a channel semiconductor pattern 28, a core insulating pattern 29, and a cell pad pattern 30 such as those described in FIGS. 3A and 3B.

The cell pad pattern 30 may be disposed on the core insulating pattern 29. The channel semiconductor pattern 28 may be connected to the cell semiconductor layer 114. The channel semiconductor pattern 28 may be disposed on side surfaces and a bottom of the core insulating pattern 29. The first cell dielectric 27 may be disposed on an outer of the channel semiconductor pattern 28. The first cell dielectric 27 may be interposed between the channel semiconductor pattern 28 and the cell gate conductive patterns 138. The channel semiconductor pattern 28 and the cell pad pattern 30 may be formed of silicon. For example, the channel semiconductor pattern 28 and the cell pad pattern 30 may be formed of polysilicon. The cell pad pattern 30 may have an N-type conductivity type. A second cell dielectric 137 may be interposed between the cell gate conductive patterns 138 and the cell vertical structures CV.

Ones of the first and second cell dielectrics 27 and 137 may include a data storage layer capable of storing data. For example, the first cell dielectric 27 may include a tunnel dielectric layer and the data storage layer, which may be sequentially formed from the channel semiconductor pattern 28. The second cell dielectric 137 may include a blocking dielectric. The first and second cell dielectrics 27 and 137 may have the same structure as a dielectric between a control gate of a NAND flash memory device and a body of a cell transistor of the NAND flash memory device. However, the scope of the inventive concepts is not limited to a structure of the NAND flash memory device and the inventive concepts may be used for various memory devices.

A second upper interlayer insulating layer UILD2 may be disposed on the first upper interlayer insulating layer UILD1 and the cell vertical structures CV. A cell source pattern 141, which may pass through the first and second upper interlayer insulating layers UILD1 and UILD2, and the cell gate conductive patterns 138, may be disposed. The cell source pattern 141 may be formed of a conductive material (e.g., a material such as Ti, TiN, W, or the like). An insulating spacer 139 may be disposed on an outside of the cell source pattern 141. The insulating spacer 139 may be interposed between the cell source pattern 141 and the cell gate conductive patterns 138.

A cell source impurity region 140 may be disposed in the cell semiconductor layer 114 under the cell source pattern 141. The cell source impurity region 140 may be electrically connected to the cell source pattern 141. The cell source impurity region 140 may have a conductivity type differ from the cell semiconductor layer 114, for example, an N-type conductivity type.

A third upper interlayer insulating layer UILD3 may be disposed on the second upper interlayer insulating layer UILD2 and the cell source patterns 141.

Cell gate contact structures 179g, which may pass through the first to third upper interlayer insulating layers UILD1 to UILD3 and may be electrically connected to the cell gate conductive patterns 138, may be disposed.

A cell body contact structure 179b, which may pass through the first to third upper interlayer insulating layers UILD1 to UILD3 and may be electrically connected to the cell semiconductor layer 114, may be disposed.

A first peripheral contact structure 180a, which may pass through the first to third upper interlayer insulating layers UILD1 to UILD3, an intermediate interlayer insulating layer 116, and the third lower interlayer insulating layer LILD3 and may be electrically connected to the first upper interconnection pattern IW1b, may be disposed. A second peripheral contact structure 180b, which may pass through the first to third upper interlayer insulating layers UILD1 to UILD3, the intermediate interlayer insulating layer 116, and the third lower interlayer insulating layer LILD3 and may be electrically connected to the second upper interconnection pattern IW2b, may be disposed. A third peripheral contact structure 180c, which may pass through the first to third upper interlayer insulating layers UILD1 to UILD3, the intermediate interlayer insulating layer 116, and the second and third lower interlayer insulating layers LILD2 and LILD3 and may be electrically connected to the third lower interconnection pattern IW3, may be disposed.

The cell gate contact structures 179g may have upper surfaces which may be disposed on the same plane as upper surfaces of the cell body contact structure 179b, the first peripheral contact structure 180a, the second peripheral contact structure 180b, and the third peripheral contact structure 180c.

The cell gate contact structures 179g may have lower surfaces located at a plane different from lower surfaces of the cell body contact structure 179b, the first peripheral contact structure 180a, the second peripheral contact structure 180b, and the third peripheral contact structure 180c, for example, may have lower surfaces located at a plane higher than the cell body contact structure 179b, the first peripheral contact structure 180a, the second peripheral contact structure 180b, and the third peripheral contact structure 180c.

Ones of the first peripheral contact structures 180a, the second peripheral contact structure 180b, and the third peripheral contact structure 180c may have the respective lower surface located at a plane different from the lower surfaces of the other contact structures. For example, the first peripheral contact structure 180a and the second peripheral contact structure 180b may have the lower surfaces of located at a plane different from the lower surface of the third peripheral contact structure 180c. The first peripheral contact structure 180a and the second peripheral contact structure 180b may have the lower surfaces farther away from the semiconductor substrate 102 than the lower surface of the third peripheral contact structure 180c.

A first upper inner dam 180d1, which may pass through the first to third upper interlayer insulating layers UILD1 to UILD3, the intermediate interlayer insulating layer 116, and the third lower interlayer insulating layer LILD3 and may be connected to the lower inner dam structure LDMa, may be disposed. A first upper outer dam 180d2, which may pass through the first to third upper interlayer insulating layers UILD1 to UILD3, the intermediate interlayer insulating layer 116, and the third lower interlayer insulating layer LILD3 and may be connected to the lower outer dam structure LDMb, may be disposed.

Ones of the cell gate contact structures 179g, the cell body contact structure 179b, the first to third contact structures 180a, 180b, and 180c, the first upper inner dam 180d1, and the first upper outer dam 180d2 may include the first conductive layer 181 and the second conductive layer 182. The first conductive layer 181 may surround side surfaces and a bottom of the second conductive layer 182.

In some embodiments, the first conductive layer 181 may include a first metal layer (e.g., a metal material such as Ti, or the like) and a metal nitride layer (e.g., a metal nitride such as TIN, WN, or the like) on the first metal layer, and the second conductive layer 182 may include a second metal layer (e.g., W, or the like).

In some embodiments, the cell source patterns 141 may have line shapes in parallel, and the cell body contact structure 179b may have a line shape parallel to the cell source patterns 141. A cell body contact region 153 may have a line shape corresponding to the line shape of the cell body contact structure 179b.

In some embodiments, the cell source pattern 141 may pass through the first and second insulating patterns 120 and 122 of the second step area ST and may be connected to the cell semiconductor layer 114.

A cell gate contact region CCN' may be disposed in the cell gate conductive patterns 138 under the cell gate contact structure 179g. The cell gate contact structure 179g may be self-aligned with and electrically connected to the cell gate contact region CCN'.

A first peripheral contact region PCN1 may be disposed in the first upper interconnection pattern IW1b under the first peripheral contact structure 180a. The first peripheral contact structure 180a may be self-aligned with and electrically connected to the first peripheral contact region PCN1. A second peripheral contact region PCN2 may be disposed in the second upper interconnection pattern IW2b under the second peripheral contact structure 180b. The second peripheral contact structure 180b may be self-aligned with and electrically connected to the second peripheral contact region PCN2. A third peripheral contact region PCN3 may be disposed in the third lower interconnection pattern IW3 under the third peripheral contact structure 180c. The third peripheral contact structure 180c may be self-aligned with and electrically connected to the third peripheral contact region PCN3. The cell body contact region 153 may be disposed in the cell semiconductor layer 114 under the cell body contact structure 179b. The cell body contact structure 179b may be self-aligned with and electrically connected to the cell body contact region 153. The cell body contact region 153 may have the same conductivity type (e.g., a P-type conductivity type) as the low concentration impurity region LIR and an impurity concentration higher than the low concentration impurity region LIR.

In some embodiments, the cell gate contact region CCN' may include the same element as a dopant impurity element in the cell body contact region 153. For example, the cell gate contact region CCN' and the cell body contact region 153 may commonly include a group III element (e.g., boron) of the periodic table. The cell gate conductive patterns 138 in the cell array area CA may not include the group III element commonly included in the cell gate contact region CCN' and the cell body contact region 153.

In some embodiments, the cell gate contact region CCN' and the cell body contact region 153 may commonly include a first element, for example, a group III element (e.g., boron) of the periodic table, and the first peripheral contact region PCN1, the second peripheral contact region PCN2, and the third peripheral contact region PCN3 may not include the first element.

In some embodiments, the cell body contact region 153, the first peripheral contact region PCN1, the second peripheral contact region PCN2, and the third peripheral contact region PCN3 may commonly include a group III element (e.g., boron) of the periodic table, and the cell gate contact region CCN' may not include the group III element.

In some embodiments, the cell gate contact region CCN', the cell body contact region 153, the first peripheral contact region PCN1, the second peripheral contact region PCN2, and the third peripheral contact region PCN3 may commonly include a group III element (e.g., boron) of the periodic table.

A cell gate intermediate pattern 182g may be disposed on the cell gate contact structures 179g. A cell body intermediate pattern 182b may be disposed on the cell body contact structure 179b. A first peripheral intermediate pattern 183a may be disposed on the first peripheral contact structure 180a. A second peripheral intermediate pattern 183b may be disposed on the second peripheral contact structure 180b. A third peripheral intermediate pattern 183c may be disposed on the third peripheral contact structure 180c. A second upper inner dam 183d1 may be disposed on the first upper inner dam 180d1. A second upper outer dam 183d2 may be disposed on the first upper outer dam 180d2.

The cell gate intermediate pattern 182g, the cell body intermediate pattern 182b, the first peripheral intermediate pattern 183a, the second peripheral intermediate pattern 183b, the third peripheral intermediate pattern 183c, the second upper inner dam 183d1, and the second upper outer dam 183d2 may be formed of the same material and may be disposed on the same plane as each other.

A fourth upper interlayer insulating layer UILD4, which may cover the cell gate intermediate pattern 182g, the cell body intermediate pattern 182b, the first peripheral intermediate pattern 183a, the second peripheral intermediate pattern 183b, the third peripheral intermediate pattern 183c, the second upper inner dam 183d1, the second upper outer dam 183d2, may be disposed on the third upper interlayer insulating layer UILD3.

A cell gate upper plug 185g connected to the cell gate intermediate pattern 182g, a cell body upper plug 185b connected to the cell body intermediate pattern 182b, a first peripheral upper plug 186a connected to the first peripheral intermediate pattern 183a, a second peripheral upper plug 186b connected to the second peripheral intermediate pattern 183b, a third peripheral upper plug 186c connected to the third peripheral intermediate pattern 183c, a third upper inner dam 186d1 connected to the second upper inner dam 183d1, and a third upper outer dam 186d2 connected to the second upper outer dam 183d2, which may pass through the fourth upper interlayer insulating layer UILD4, may be disposed.

A bit line contact structure 187, which may pass through the second to fourth upper interlayer insulating layers UILD2 to UILD4 and may be connected to the cell pad pattern 30 of the cell vertical structure CV, may be disposed.

A bit line interconnection structure 192a, a word line interconnection structure 192b, a body interconnection structure 192c, a fourth upper inner dam 192d1, and a fourth upper outer dam 192d2 may be disposed on the fourth upper interlayer insulating layer UILD4.

The cell gate contact structure 179g, the cell gate intermediate pattern 182g, and the cell gate upper plug 185g, which may be electrically connected to each other, may be interposed between the word line interconnection structure 192b and the cell gate contact regions CCN' and electrically connected to the word line interconnection structure 192b and the cell gate contact regions CCN'.

The bit line contact structure 187 may be interposed between the bit line interconnection structure 192a and the cell pad pattern 30 of the cell vertical structure CV and electrically connected to the bit line interconnection structure 192a and the cell pad pattern 30. The second peripheral contact structure 180b, the second peripheral intermediate pattern 183b, and the second peripheral upper plug 186b, which may be electrically connected to each other, may be interposed between the bit line interconnection structure 192a and the second peripheral contact region PCN2 in the second upper interconnection pattern IW2b and electrically connected to the bit line interconnection structure 192a and the second upper interconnection pattern IW2b.

The cell body contact structure 179b, the cell body intermediate pattern 182b, and the cell body upper plug 185b, which may be electrically connected to each other, may be interposed between the body interconnection structure 192c and the cell body contact region 153 in the cell semiconductor layer 114 and electrically connected to the body interconnection structure 192c and the cell body contact region 153.

The third peripheral contact structure 180c, the third peripheral intermediate pattern 183c and the third peripheral upper plug 186c, which may be electrically connected to each other, may be interposed between the body interconnection structure 192c and the third peripheral contact region PCN3 in the third lower interconnection pattern IW3 and electrically connected to the body interconnection structure 192c and the third lower interconnection pattern IW3.

A fifth upper interlayer insulating layer UILD5, which may cover the bit line interconnection structure 192a, the word line interconnection structure 192b, the body interconnection structure 192c, the fourth upper inner dam 192d1, and the fourth upper outer dam 192d2, may be disposed on the fourth upper interlayer insulating layer UILD4. A fifth upper inner dam 194d1 connected to the fourth upper inner dam 192d1 and a fifth upper outer dam 194d2 connected to the fourth upper outer dam 192d2, which may pass through the fifth upper interlayer insulating layer UILD5, may be disposed. A sixth upper inner dam 196d1 connected to the fifth upper inner dam 194d1 and a sixth upper outer dam 196d2 connected to the fifth upper outer dam 194d2 may be disposed on the fifth upper interlayer insulating layer UILD5. A sixth upper interlayer insulating layer UILD6, which may cover the sixth upper inner dam 196d1 and the sixth upper outer dam 196d2, may be disposed on the fifth upper interlayer insulating layer UILD5.

The lower inner dam structure LDMa and the first to sixth upper inner dams 180d1, 183d1, 186d1, 192d1, 194d1, and 196d1 may be connected to each other and may configure an inner dam structure DMa (shown in FIG. 4), and the lower outer dam structure LDMb and the first to sixth upper outer dams 180d2, 183d2, 186d2, 192d2, 194d2, and 196d2 may be connected to each other and may configure an outer dam structure DMb (shown in FIG. 4).

The inner dam structure DMa may surround the cell semiconductor layer 114. The outer dam structure DMb may surround the inner dam structure DMa. Parts of the first to third interconnection patterns IW1b, IW2b, and IW3 which may extend in a direction of an outside of the cell semiconductor layer 114 and the first to third peripheral contact regions PCN1, PCN2, and PCN3 may be interposed between the inner dam structure DMa and the cell semiconductor layer 114 in a plan view.

FIGS. 6A to 17B are cross-sectional views illustrating intermediate process operations in methods of forming semiconductor devices according to some embodiments of the inventive concepts. In FIGS. 6A to 17B, FIGS. 6A, 7A, 8A, 9A, 10A, 11A, 12A, 13A, 14A, 15A, 16A, and 17A are cross-sectional views illustrating an area taken along line I-I' of FIG. 1A, and FIGS. 6B, 7B, 8B, 9B, 10B, 11B, 12B, 13B, 14B, 15B, 16B, and 17B are cross-sectional views illustrating areas taken along lines II-IF of FIG. 1A, and IV-IV', and V-V' of FIG. 1B.

Example methods of forming semiconductor devices according to some embodiments of the inventive concept illustrated in FIGS. 1A, 1B, 3A, and 3B will be described with reference to FIGS. 6A to 17B.

Referring to FIGS. 1A, 1B, 6A, and 6B, a substrate 2 may be prepared. The substrate 2 may be a semiconductor substrate formed of a semiconductor material such as silicon, etc. The substrate 2 may include a first area AR1 and a second area AR2. The first area AR1 of the substrate 2 may include a cell array area CA and a step area CI. The second area AR2 of the substrate 2 may include a peripheral circuit area. The cell array area CA may include an area in which memory cells capable of storing data may be disposed. The step area CI may be an area in which cell gate contact structures capable of applying a voltage to a gate electrode of the cell array area CA may be disposed.

An isolation area 4 may be formed in the substrate 2. The isolation area 4 may be formed by performing a shallow trench isolation process. The isolation area 4 may define a cell active region 6c, a first cell band active region 6p, a second cell band active region 6n, a first peripheral active region 8a, a second peripheral active region 8b, and a third peripheral active region 8c in the substrate 2. The first cell band active region 6p may surround the cell active region 6c. A part of the isolation area 4 may be formed between the cell active region 6c and the first cell band active region 6p. The second cell band active region 6n may surround the first cell band active region 6p. A part of the isolation area 4 may be formed between the first cell band active region 6p and the second cell band active region 6n.

The substrate 2 may be a semiconductor substrate of a first conductivity type. A first cell well area CNW of a second conductivity type different from the first conductivity type may be formed in the substrate 2. A second cell well area CPW of the first conductivity type may be formed in the substrate 2.

In some embodiments, the first conductivity type may have a P-type conductivity type, and the second conductivity type may have an N-type conductivity type. For example, the first cell well area CNW may be an N-type well area, and the second cell well area CPW may be a P-type well area. The second cell well area CPW may be formed in the substrate 2 of the cell array area CA and the step area CI, and in the first cell band active region 6p.

The first cell well area CNW may be formed in the substrate 2 under the second cell well area CPW, and in the second cell band active region 6n. The first cell well area CNW may be formed in a structure that surrounds a lower part of the second cell well area CPW.

A cell body impurity region 12p1 may be formed in the first cell band active region 6p. A cell guard impurity region 10n1 may be formed in the second cell band active region 6n. The cell body impurity region 12p1 may have the same conductivity type as the second cell well area CPW, for example, a P-type conductivity type, and an impurity concentration higher than the second cell well area CPW. The cell guard impurity region 10n1 may have the same conductivity type as the first cell well area CNW, for example, an N-type conductivity type, and an impurity concentration higher than the first cell well area CNW.

Peripheral transistors may be formed in the second area AR2 of the substrate 2. The peripheral transistors may include a first peripheral transistor PTR1, a second peripheral transistor PTR2, and a third peripheral transistor PTR3.

In some embodiments, the first and second peripheral transistors PTR1 and PTR2 may be NMOS transistors and the third peripheral transistor PTR3 may be a PMOS transistor.

The first peripheral transistor PTR1 may include a first peripheral gate G1 which may cross the first peripheral active region 8a, and a first source area 10n2, a first drain area 10n3, and a first body impurity region 12p2, which may be formed in the first peripheral active region 8a on both sides of the first peripheral gate G1. The first peripheral active region 8a may have a P-type conductivity type, the first source and drain areas 10n2 and 10n3 may have an N-type conductivity type, and the first body impurity region 12p2 may have a P-type conductivity type. The first body impurity region 12p2 may have an impurity concentration higher than a channel area in the first peripheral active region 8a which may be defined between the first source and drain areas 10n2 and 10n3. The first peripheral transistor PTR1 may be a power MOSFET.

The second peripheral transistor PTR2 may include a second peripheral gate G2 which may cross the second peripheral active region 8b, and a second peripheral impurity region 10n4 formed in the second peripheral active region 8b on both sides of the second peripheral gate G2.

The third peripheral transistor PTR3 may include a third peripheral gate G3 which may cross the third peripheral active region 8c, and a third peripheral impurity region 12p3 formed in the third peripheral active region 8c on both sides of and the third peripheral gate G3. The third peripheral transistor PTR3 may be a PMOS transistor formed on an N-type peripheral well area PNW.

Referring to FIGS. 1A, 1B, 7A, and 7B, a peripheral interlayer insulating layer 16 may be formed on the second area AR2 of the substrate 2 having the peripheral transistors PTR1, PTR2, and PTR3. The peripheral interlayer insulating layer 16 may cover the peripheral transistors PTR1, PTR2, and PTR3. The formation of the peripheral interlayer insulating layer 16 may include forming an insulating layer on a semiconductor substrate having the peripheral transistors PTR1, PTR2, and PTR3, and removing the insulating layer on the first area AR1 of the substrate 2 by performing a photolithography process and an etching process.

A buffer insulating layer 18L, and sacrificial patterns 20 and cell interlayer insulating patterns 18, which may be alternately and repeatedly stacked on the buffer insulating layer 18L, may be formed on the substrate 2.

The formation of the sacrificial patterns 20 and the cell interlayer insulating patterns 18 may include forming the buffer insulating layer 18L on the substrate 2, alternately and repeatedly forming sacrificial layers and cell interlayer insulating layers on the buffer insulating layer 18L, and forming the sacrificial layers and the cell interlayer insulating layers on the step area CI in a step structure by patterning the sacrificial layers and the cell interlayer insulating layers on the step area CI. The sacrificial layers and the cell interlayer insulating layers may be alternately and repeatedly stacked in a direction perpendicular to the substrate 2.

The forming of the sacrificial layers and the cell interlayer insulating layers on the step area CI in a step structure by patterning the sacrificial layers and the cell interlayer insulating layers may include protecting the sacrificial layers and the cell interlayer insulating layers on the cell array area CA using a mask and performing a plurality of patterning processes on the sacrificial layers and the cell interlayer insulating layers on the step area CI using an etching process.

The buffer insulating layer 18L and the cell interlayer insulating patterns 18 may be formed of an insulating material such as silicon oxide, and the sacrificial patterns 20 may be formed of a material having an etch selectivity different from the buffer insulating layer 18L and the cell interlayer insulating patterns 18, for example, silicon nitride.

Referring to FIGS. 1A, 1B, 8A, and 8B, a first interlayer insulating layer 22 may be formed on the substrate 2 having the buffer insulating layer 18L, the cell interlayer insulating patterns 18, the sacrificial patterns 20, and the peripheral interlayer insulating layer 16.

Cell vertical structures CV, which may pass through the first interlayer insulating layer 22, the buffer insulating layer 18L, the cell interlayer insulating patterns 18, and the sacrificial patterns 20, may be formed on the cell array area CA. Ones of the cell vertical structures CV may include a first dielectric 27, a cell semiconductor pattern 28, a cell core insulating pattern 29, and a cell pad pattern 30.

The formation of the cell vertical structures CV may include forming holes 24, which may pass through the first interlayer insulating layer 22, the buffer insulating layer 18L, the cell interlayer insulating patterns 18, and the sacrificial patterns 20, conformally forming the first dielectric 27 on the substrate 2 having the holes 24, forming a semiconductor layer on the first dielectric 27, forming the core insulating pattern 29 which may partially fill the holes 24 on the semiconductor layer, forming a pad layer on the substrate 2 having the core insulating pattern 29, and forming the pad pattern 30 and the semiconductor pattern 28 by planarizing the pad layer and the semiconductor layer until the first interlayer insulating layer 22 may be exposed. The forming of the first dielectric 27 may include forming a data storage layer (e.g., a silicon nitride layer capable of trapping charges), and forming a tunnel oxide layer. The pad pattern 30 may be formed with an N-type conductivity type.

Referring to FIGS. 1A, 1B, 9A, and 9B, a second interlayer insulating layer 32 may be formed on the substrate 2 having the cell vertical structures CV. A trench 34, which may pass through the first and second interlayer insulating layers 22 and 32, the buffer insulating layer 18L, the cell interlayer insulating patterns 18, and the sacrificial patterns 20 of FIGS. 8A and 8B,) may be formed. The trench 34 may extend from the cell array area CA to the step area CI. The trench 34 may expose side surfaces of the sacrificial patterns 20. The trench 34 may expose the substrate 2. The sacrificial patterns 20 exposed by the trench 34 may be selectively etched by performing an etching process. While the sacrificial patterns 20 may be selectively etched, empty spaces which may expose side surfaces of the cell vertical structures CV may be formed. A second dielectric 36 and gate conductive patterns 38 may be formed in the empty spaces formed while the sacrificial patterns 20 may be etched.

The formation of the second dielectric 36 and the gate conductive patterns 38s, 38g, and 38c may include removing the sacrificial patterns 20, conformally forming the second dielectric 36 on the substrate 2 in which the sacrificial patterns 20 may be removed, forming a gate conductive layer on substrate 2 having the second dielectric 36, etching the gate conductive layer so that the gate conductive layer remains in spaces in which the sacrificial patterns 20 may be removed, and forming the gate conductive patterns 38s, 38g, and 38c. The second dielectric 36 may be formed of an insulating material such as aluminum oxide, etc.

The cell gate conductive patterns 38 may be formed so as to include at least one of a doped semiconductor (e.g., doped silicon, or the like), a metal (e.g., tungsten, copper, aluminum, or the like), a conductive metal nitride (e.g., titanium nitride, tantalum nitride, tungsten nitride, or the like), a conductive metal-semiconductor compound (e.g., a metal silicide, or the like), and a transition metal (e.g., titanium, tantalum, or the like).

In some embodiments, ones of the cell gate conductive patterns 38 may include a first gate conductive layer 38a and a second gate conductive layer 38b. The formation of the cell gate conductive patterns 38 may include conformally forming the first gate conductive layer 38a, forming the second gate conductive layer 38b which may fill the empty spaces formed while the sacrificial patterns 20 may be removed on the first gate conductive layer 38a, and removing the first and second gate conductive layers 38a and 38b located on the interlayer insulating layer 32, in the trench 34 using an etching process. The first gate conductive layer 38a may be a barrier conductive layer (e.g., a metal nitride such as TiN, or the like). The second gate conductive layer 38b may be formed of a metal layer (e.g., a metal material such as tungsten, or the like).

Referring to FIGS. 1A, 1B, 10A, and 10B, an insulating spacer 39 may be formed on a side wall of the trench 34. A cell source impurity region 40 may be formed in the substrate 2 exposed by the trench 34 by performing an ion implantation process. The substrate 2 may have a P-type conductivity type, and the cell source impurity region 40 may have an N-type conductivity type. A cell source pattern 41 may be formed in the trench 34. The cell source pattern 41 may be formed of a conductive material (e.g., tungsten, or the like). The insulating spacer 39 may be interposed between the cell gate conductive patterns 38 and the cell source pattern 41. A third interlayer insulating layer 44 may be formed on the cell source pattern 41, the insulating spacer 39, and the interlayer insulating layer 32.

Referring to FIGS. 1A, 1B, 11A, and 11B, a contact hole, which may expose ones of an area having an N-type conductivity type and an area having a P-type conductivity type in the substrate 2, and cell gate contact holes 46c, which may expose the cell gate conductive patterns 38 on the step area CI, may be formed by performing a patterning process. For example, the area having an N-type conductivity type in the substrate 2 may be the cell guard impurity region 10n1, the first source area 10n2, the first drain area 10n3, or the second peripheral impurity region 10n4, and the area having a P-type conductivity type in the substrate 2 may be the cell body impurity region 12p1, the first body impurity region 12p2, and the third peripheral impurity region 12p3.

In some embodiments, the cell gate contact holes 46c may be formed, and simultaneously cell guard contact holes 46nw which may expose the cell guard impurity region 10n1, a first source contact hole 48n1 which may expose the first source area 10n2, a first drain contact hole 48n2 which may expose the first drain area 10n3, and a second source/drain contact hole 50 which may expose the second peripheral impurity region 10n4 may be formed.

In some embodiments, while the cell gate contact holes 46c may be formed, a peripheral gate contact hole 48g which may expose the peripheral gate G1 may be simultaneously formed.

The simultaneous formation of the cell gate contact holes 46c, the cell guard contact holes 46nw, the first source contact hole 48n1, the first drain contact hole 48n2, the second source/drain contact hole 50, and the peripheral gate contact hole 48g may include patterning the interlayer insulating layers 16, 22, 32, and 44 using a photolithography process and an etching process. The cell gate contact holes 46c may pass through the first to third interlayer insulating layers 22, 32, and 44, and may expose the cell gate conductive patterns 38 on the step area CI. The cell guard contact holes 46nw may expose the cell guard impurity region 10n1 in the second cell band active region 6n. The peripheral gate contact hole 48g may pass through the interlayer insulating layers 16, 22, 32, and 44 and may expose the peripheral gate G1 of the peripheral transistor. The first source contact hole 48n1 may pass through the interlayer insulating layers 16, 22, 32, and 44 and may expose the first source area 10n2, the first drain contact hole 48n2 may pass through the interlayer insulating layers 16, 22, 32, and 44 and may expose the first drain area 10n3, and the second source/drain contact hole 50 may pass through the interlayer insulating layers 16, 22, 32, and 44 and may expose the second peripheral impurity region 10n4.

Referring to FIGS. 1A, 1B, 12A, and 12B, a first ion implantation process 51 may be performed. By performing the first ion implantation process 51, a cell guard contact area 52w may be formed in the cell guard impurity region 10n1 exposed by the cell guard contact holes 46nw, a first source contact area 54n1 may be formed in the first source area 10n2 exposed by the first source contact hole 48n1, a first drain contact area 54n2 may be formed in the first drain area 10n3 exposed by the first drain contact hole 48n2, and a second peripheral contact region 56 may be formed in the second peripheral impurity region 10n4 exposed by the second source/drain contact hole 50.

In some embodiments, the first ion implantation process 51 may be a process of implanting N-type impurity (e.g., "P" or "As" in a group V element).

In some embodiments, while the first ion implantation process 51 is performed, cell gate contact regions CCN in which a group V element of the periodic table may be implanted may be formed in the cell gate conductive patterns 38 exposed by the cell gate contact holes 46c, and a peripheral gate contact area PCN in which a group V element of the periodic table may be implanted may be formed in the peripheral gate G1 exposed by the peripheral gate contact hole 48g.

The cell guard contact area 52w, the first source contact area 54n1, the first drain contact area 54n2, the second peripheral contact region 56, the cell gate contact regions CCN, and peripheral gate contact area PCN may be simultaneously formed.

Referring to FIGS. 1A, 1B, 13A, and 13B, gap fill layers 58, which may fill the cell gate contact holes 46c, the peripheral gate contact hole 48g, the cell guard contact holes 46nw, the first source contact hole 48n1, the first drain contact hole 48n2, and the second source/drain contact hole 50, may be formed. The formation of the gap fill layers 58 may include forming a gap fill material layer on the substrate 2 having the cell guard contact area 52w, the first source contact area 54n1, the first drain contact area 54n2, the second peripheral contact region 56, the peripheral gate contact area PCN, and the cell gate contact regions CCN, and performing an etch-back process on the gap fill material layer until an upper surface of the third interlayer insulating layer 44 may be exposed. The gap fill layers 58 may be formed of a material having an etch selectivity different from the interlayer insulating layers 22, 32, and 44, the substrate 2, the cell gate conductive patterns 38, and the peripheral gate G1. For example, the gap fill layers 58 may be formed of a spin on hardmask (SOH) layer, an amorphous carbon layer, a photoresist, or amorphous silicon.

Referring to FIGS. 1A, 1B, 14A, and 14B, by performing a patterning process using a photolithography process and an etching process, contact holes, which may pass through the interlayer insulating layers 16, 22, 32, and 44 and expose an area having a P-type conductivity type in the substrate 2, may be formed. The area having a P-type conductivity type in the substrate 2 may be the cell body impurity region 12p1, the first body impurity region 12p2 and the third peripheral impurity region 12p3. Therefore, a cell body contact hole 60pw, which may pass through the interlayer insulating layers 22, 32, and 44 and exposes the cell body impurity region 12p1, a peripheral body contact hole 60p1, which may pass through the interlayer insulating layers 16, 22, 32, and 44 and exposes the first body impurity region 12p2, and a third peripheral impurity region 12p3, which may pass through the interlayer insulating layers 16, 22, 32, and 44 and exposes the third source/drain contact hole 60p2, may be formed.

By performing a second ion implantation process 62 in which the third interlayer insulating layer 44 and the gap fill layers 58 may be used as an ion implantation mask, a cell body contact region 64w may be formed in the cell body impurity region 12p1 exposed by the cell body contact hole 60pw, a peripheral body contact region 66p1 may be formed in the first body impurity region 12p2 exposed by the peripheral body contact hole 60p1, and a third peripheral contact region 66p2 may be formed in the third peripheral impurity region 12p3 exposed by the third source/drain contact hole 60p2.

Figure 12A:
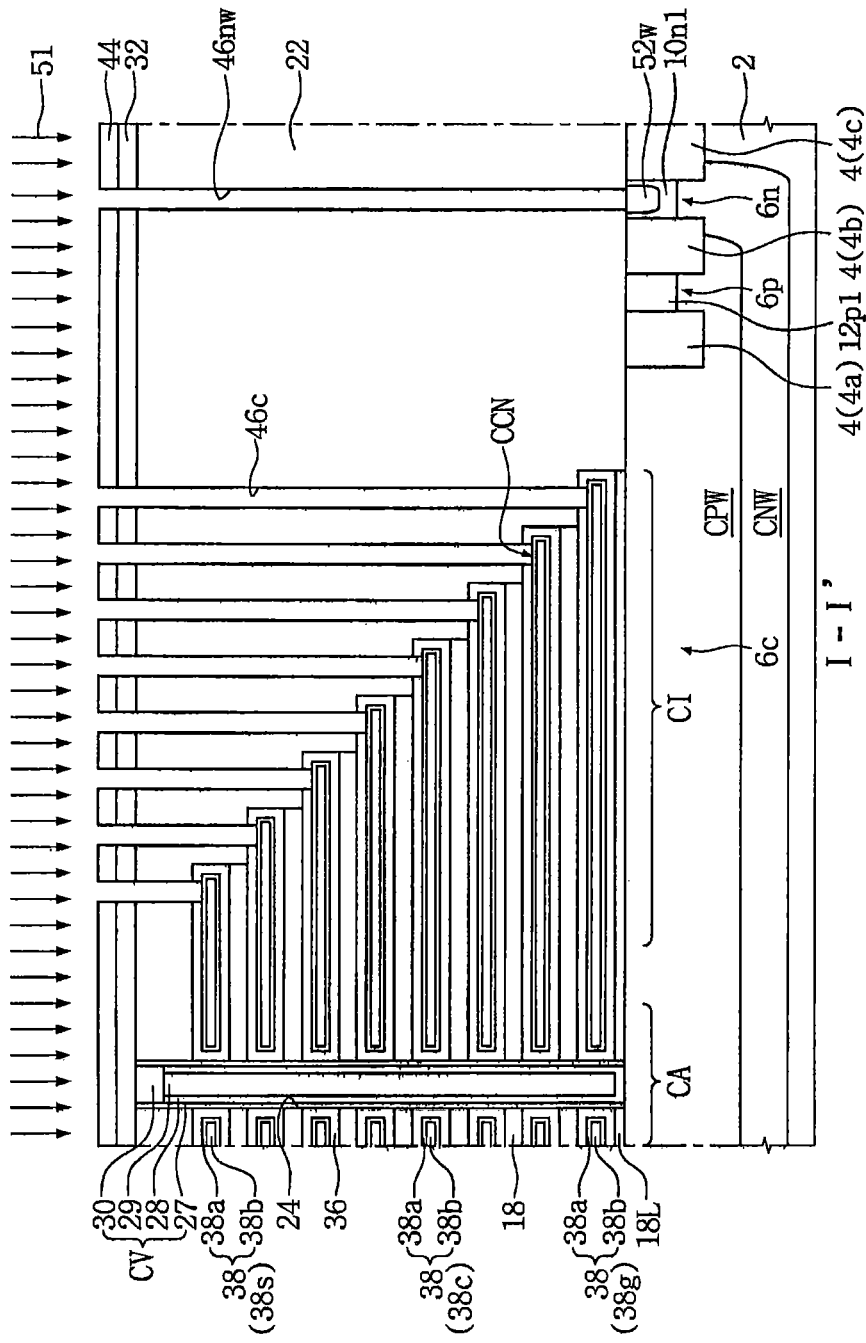
Figure 12B:
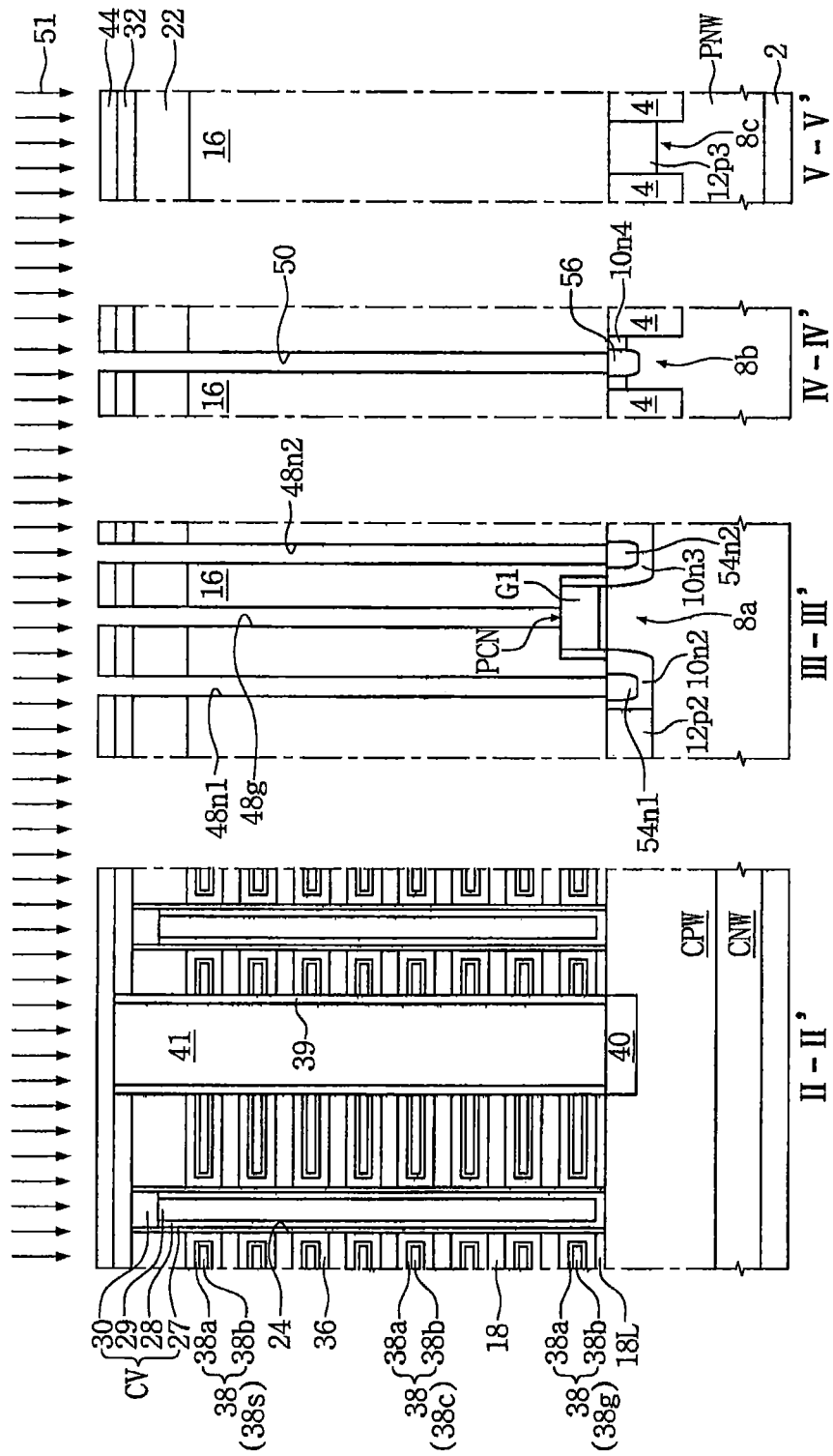
Figure 13A:
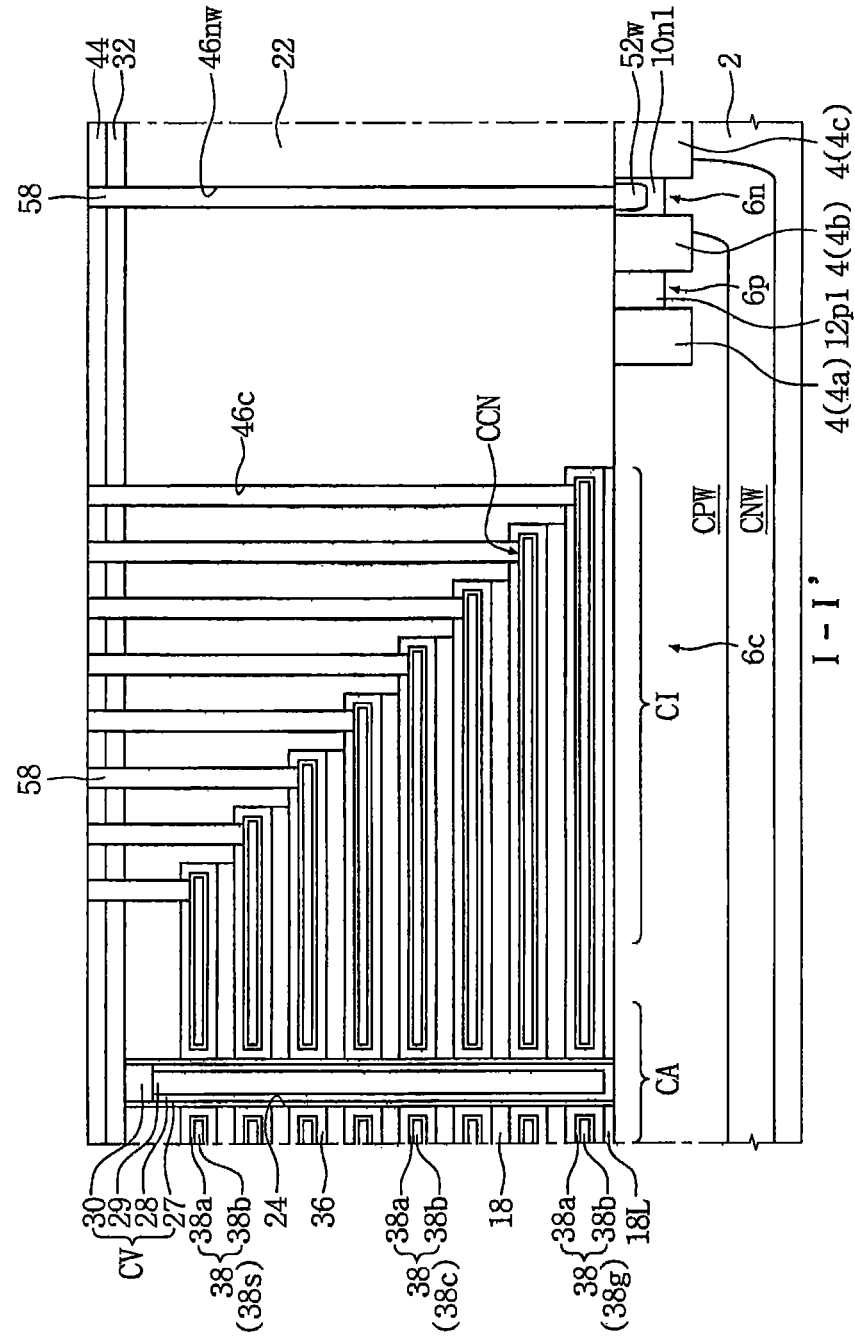
Figure 13B:
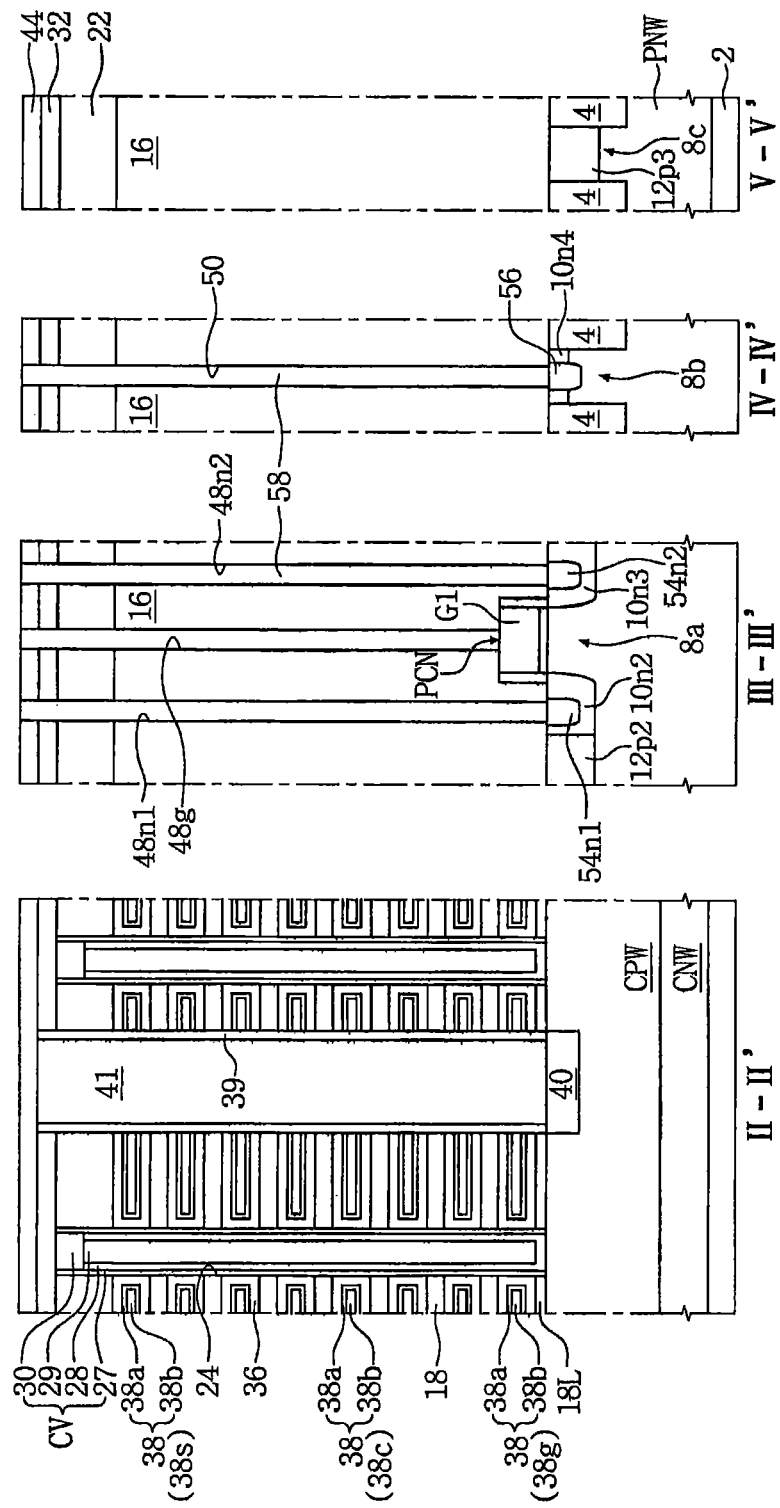
Figure 14A:
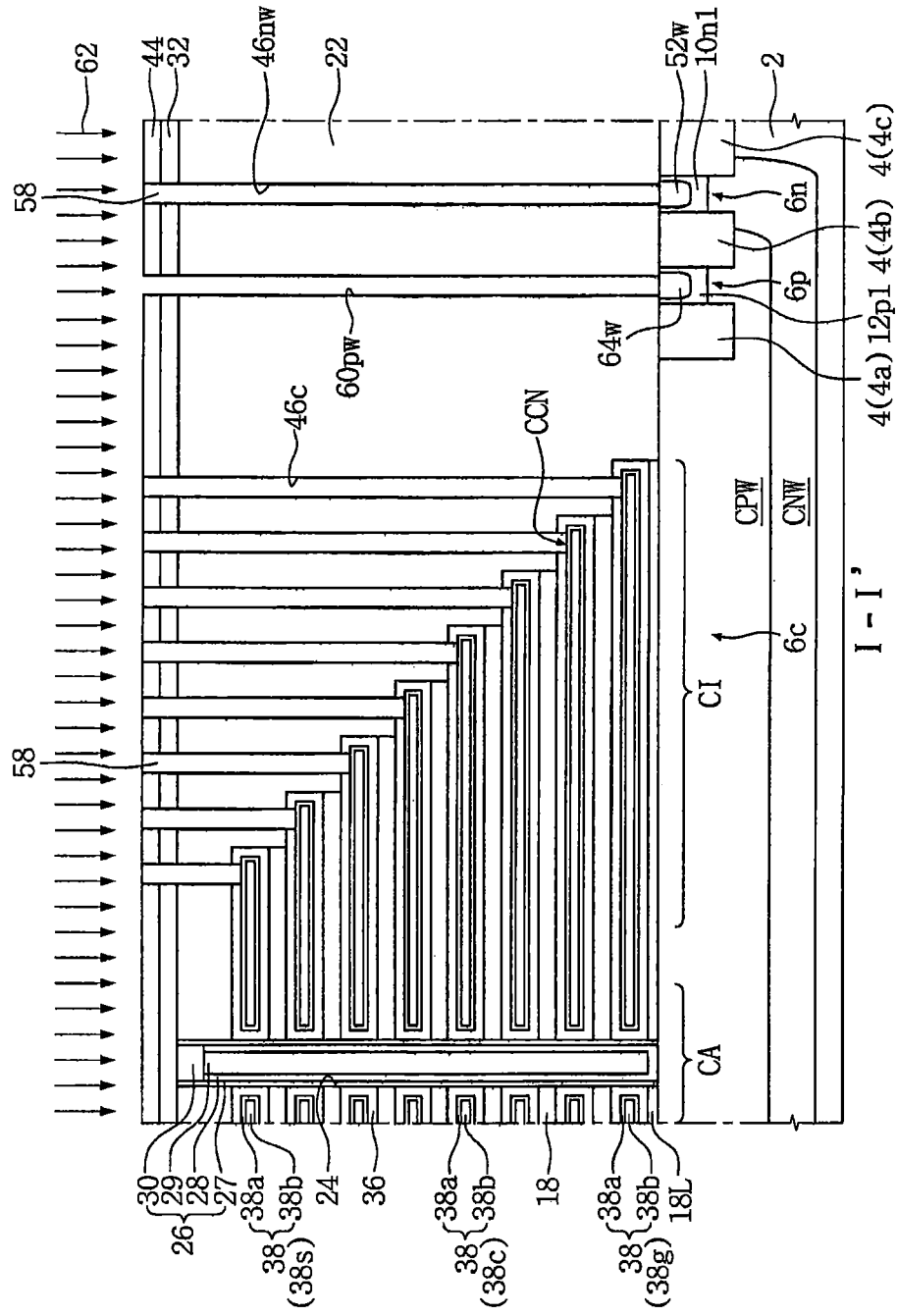
Figure 14B:
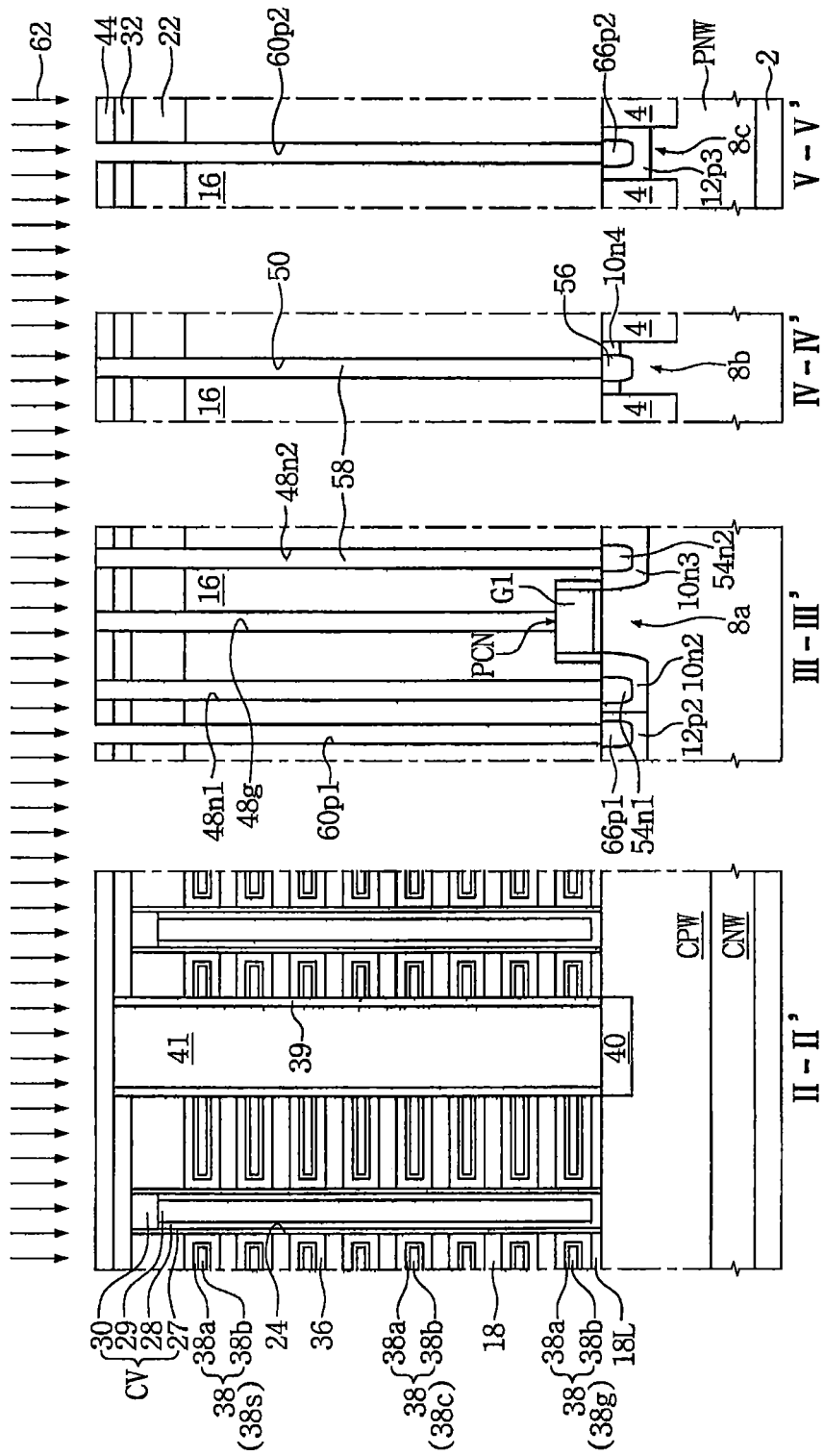

The second ion implantation process 62 may be a process of implanting an element of a group different from the first ion implantation process 51 described in FIGS. 12A and 12B. For example, the first ion implantation process 51 may be a process of implanting a group V element of the periodic table, and the second ion implantation process 62 may be a process of implanting a group III element of the periodic table.

The cell body contact region 64w may have an impurity concentration higher than the cell body impurity region 12p1. The peripheral body contact region 66p1 may have an impurity concentration higher than the first body impurity region 12p2. The third peripheral contact region 66p2 may have an impurity concentration higher than the third peripheral impurity region 12p3.

Referring to FIGS. 1A, 1B, 15A, and 15B, the gap fill layers 58 in the cell gate contact holes 46c, the peripheral gate contact hole 48g, the cell guard contact holes 46nw, the first source contact hole 48n1, the first drain contact hole 48n2, and the second source/drain contact hole 50 may be selectively removed. Therefore, the cell guard contact area 52w, the first source contact area 54n1, the first drain contact area 54n2, the second peripheral contact region 56, the cell gate contact regions CCN, the peripheral gate contact area PCN, the cell body contact region 64w, the peripheral body contact region 66p1, and the third peripheral contact region 66p2 may be exposed.

Referring to FIGS. 1A, 1B, 16A, and 16B, contact structures 80a to 80i may be formed in the contact holes 46c, 60pw, 46nw, 60p1, 48n1, 48n2, 50, and 60p2, respectively. For example, cell gate contact structures 80a may be formed in the cell gate contact holes 46c, a cell body contact structure 80b may be formed in the cell body contact hole 60pw, a cell guard contact structure 80c may be formed in the cell guard contact hole 46nw, a peripheral body contact structure 80d may be formed in the peripheral body contact hole 60p1, a first source contact structure 80e may be formed in the first source contact hole 48n1, a peripheral gate contact structure 80f may be formed in the peripheral gate contact hole 48g, a first drain contact structure 80g may be formed in the first drain contact hole 48n2, a second source/drain contact structure 80h may be formed in the second source/drain contact hole 50, and a third source/drain contact structure 80i may be formed in the third source/drain contact hole 60p2.

In some embodiments, ones of the contact structures 80a to 80i may include a respective first conductive layer 81 and a respective second conductive layer 82 on the first conductive layer 81. The first conductive layer 81 may surround side surfaces and a bottom of the second conductive layer 82.

In some embodiments, the first conductive layer 81 may include a first metal layer (e.g., a metal material such as Ti, or the like) and a metal nitride layer (e.g., a metal nitride such as TiN, WN, or the like) on the first metal layer, and the second conductive layer 82 may include a second metal layer (e.g., W, or the like).

In some embodiments, a cell body silicide 77p may be formed on the cell body contact region 64w, a cell guard silicide 77n may be formed on the cell guard contact area 52w, a first body silicide 78a may be formed on the peripheral body contact region 66p1, a first source silicide 78b may be formed on the first source contact area 54n1, a first drain silicide 78c may be formed on the first drain contact area 54n2, a second source/drain silicide 78d may be formed on the second peripheral contact region 56, and a third source/drain silicide 78e may be formed on the third peripheral contact region 66p2.

In some embodiments, after a silicide process for forming the silicides 77p, 77n, and 78a to 78e is performed, the contact structures 80a to 80i may be formed.

In some embodiments, the formation of the silicides 77p, 77n, and 78a to 78e may include forming a metal-silicon compound (e.g., TiSi, or the like) by reaction of the first metal layer for forming the contact structures 80a to 80i and silicon of the substrate 2 using an annealing process.

Referring to FIGS. 1A, 1B, 17A, and 17B, a fourth interlayer insulating layer 83 may be formed on the substrate 2 having the contact structures 80a to 80i.

In some embodiments, upper contact holes 85a to 85i, which may pass through the fourth interlayer insulating layer 83 and expose ones of the contact structures 80a to 80i, may be formed.

In some embodiments, the upper contact holes 85a to 85i may be formed and, simultaneously, bit line contact holes 84 which may expose the vertical structures CV may be formed.

Referring again to FIGS. 1A, 1B, 3A, and 3B, bit line contact structures 86, which may fill the bit line contact holes 84, and upper contact plugs 87a to 87i, which may fill the upper contact holes 85a to 85i, may be formed.

The bit line contact structures 86 may pass through the interlayer insulating layers 32, 44, and 83, and correspond and be electrically connected to ones of the cell pad patterns 30 of the cell vertical structures CV. The upper contact plugs 87a to 87i may correspond and be electrically connected to ones of the contact structures 80a to 80i.

The upper contact plugs 87a to 87i may include a cell gate contact structures 87a on the cell gate contact structures 80a, a cell body contact plug 87b on the cell body contact structure 80b, a cell guard contact plug 87c on the cell guard contact structure 80c, a peripheral body contact plug 87d on the peripheral body contact structure 80d, a first source contact plug 87e on the first source contact structure 80e, a peripheral gate contact plug 87f on the peripheral gate contact structure 80f, a first drain contact plug 87g on the first drain contact structure 80g, a second source/drain contact plug 87h on the second source/drain contact structure 80h, and a third source/drain contact plug 87i on the third source/drain contact structure 80i.

Interconnection structures 88, 89, 90a, 90b, 91, 92a, 92b, 92c, and 92d, which may be electrically connected to the bit line contact structures 86 and the contact plugs 87a to 87i, respectively, may be formed on the fourth interlayer insulating layer 83.

The interconnection structures 88, 89, 90a, 90b, 91, 92a, 92b, 92c, and 92d may include bit line interconnection structures 88 electrically connected to the bit line contact structures 86, gate interconnection structures 89 electrically connected to the cell gate contact structures 87a, a cell body interconnection structure 90a electrically connected to the cell body contact plug 87b, a cell guard interconnection structure 90b electrically connected to the cell guard contact plug 87c, a peripheral source/body interconnection structure 91 simultaneously and electrically connected to the peripheral body contact plug 87d and the first source contact plug 87e, a peripheral gate interconnection structure 92a electrically connected to the peripheral gate contact plug 87f, a first drain interconnection structure 92b electrically connected to the first drain contact plug 87g, a second source/drain interconnection structure 92c electrically connected to the second source/drain contact plug 87h, and a third peripheral interconnection structure 92d electrically connected to the third upper source/drain contact plug 87i.

Example methods of forming semiconductor devices according to some embodiments of the inventive concepts described in FIGS. 1A, 1B, 3A, and 3B will be described with reference to FIGS. 18A, 18B, 19A, and 19B.

Figure 19A:
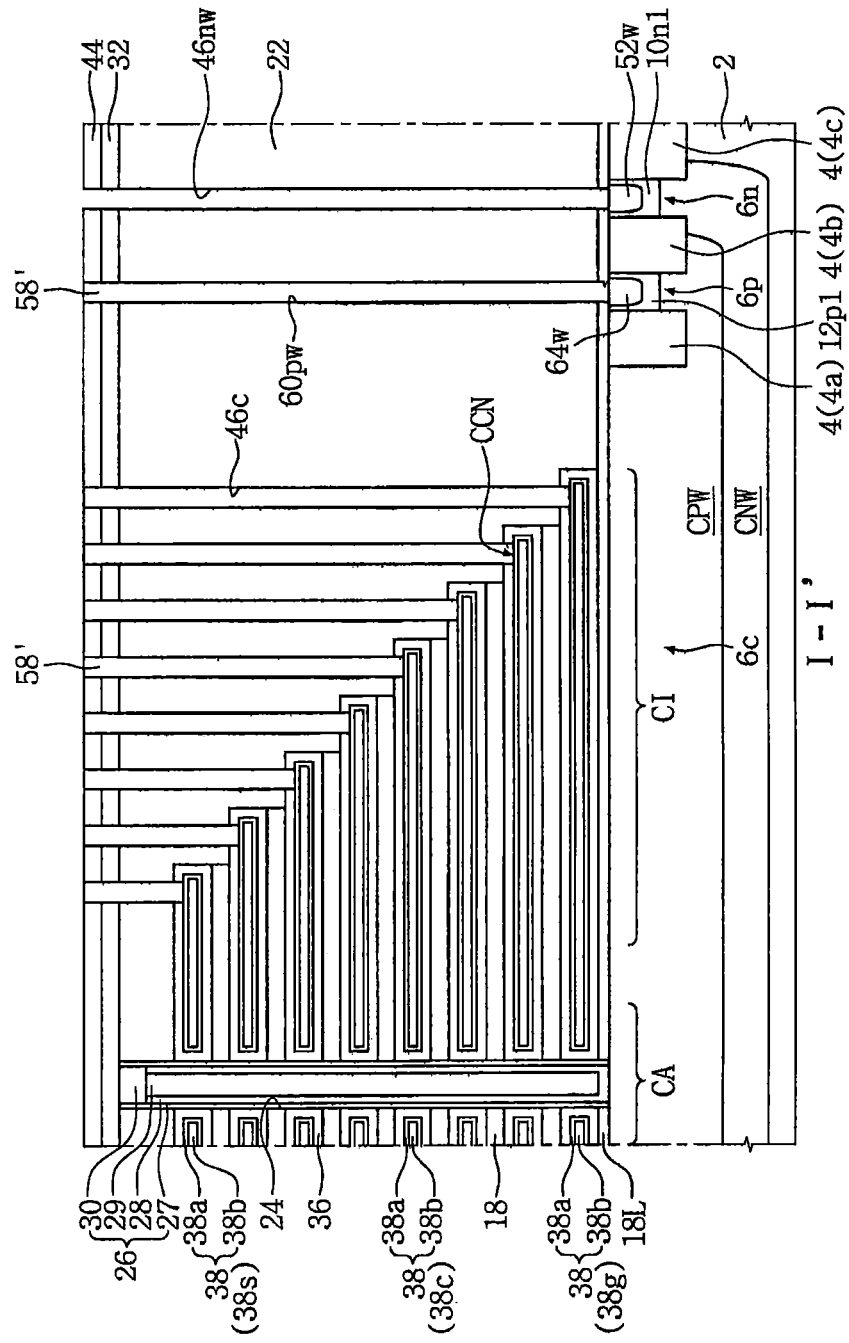
Figure 19B:
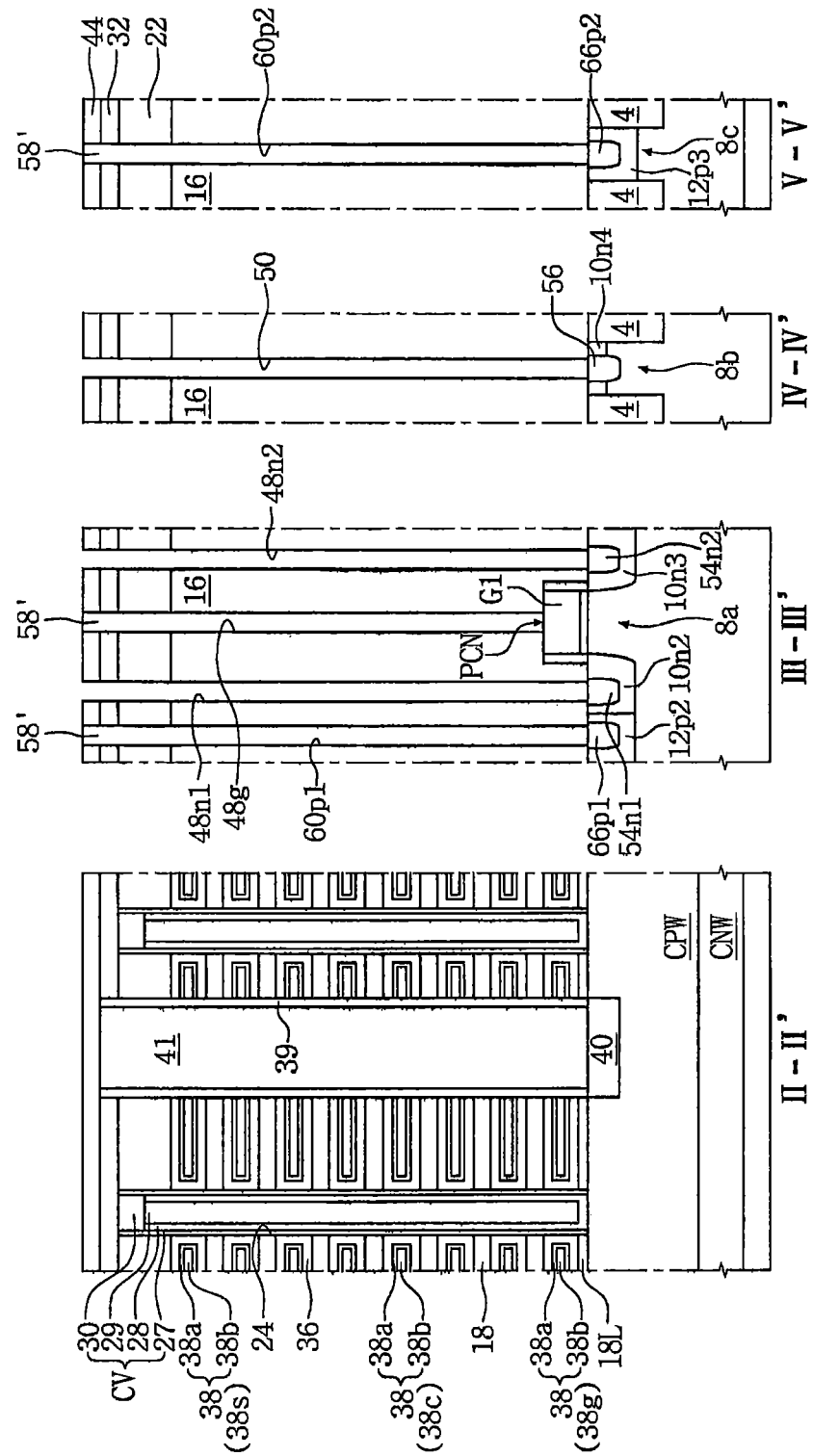

FIGS. 18A to 19B are cross-sectional views illustrating intermediate process operations in methods of forming a semiconductor devices according to some embodiments of the inventive concepts. In FIGS. 18A to 19B, FIGS. 18A and 19A are cross-sectional views illustrating an area taken along line I-I' of FIG. 1A, and FIGS. 18B and 19B are cross-sectional views illustrating areas taken along lines II-II' of FIG. 1A, and IV-IV', and V-V' of FIG. 1B.

Referring to FIGS. 1A, 1B, 18A, and 18B, as described with reference to FIGS. 6A to 10B, the peripheral transistors PTR1, PTR2, and PTR3, the cell vertical structures CV, the cell gate conductive patterns 38, and the interlayer insulating layers 16, 22, 32, and 44 may be formed on the substrate 2.

By performing a patterning process, a contact hole which may expose an area of an area having N-type conductivity type or an area having a P-type conductivity type in the substrate 2, for example, an area having a P-type conductivity type, and a cell gate contact holes 46c, which may expose the cell gate conductive patterns 38 on the step area CI, may be formed. The area having a P-type conductivity type in the substrate 2 may be a cell body impurity region 12p1, a first body impurity region 12p2 and a third peripheral impurity region 12p3.

In some embodiments, the cell gate contact holes 46c may be formed, and simultaneously a cell body contact hole 60pw, which may pass through the interlayer insulating layers 22, 32, and 44 and exposes the cell body impurity region 12p1, a peripheral body contact hole 60p1, which may pass through the interlayer insulating layers 16, 22, 32, and 44 and exposes the first body impurity region 12p2, and a third source/drain contact hole 60p2, which may pass through the interlayer insulating layers 16, 22, 32, and 44 and exposes the third peripheral impurity region 12p3, may be formed.

In some embodiments, while the cell gate contact holes 46c are formed, a peripheral gate contact hole 48g which may expose the peripheral gate G1 may be simultaneously formed.

The cell gate contact holes 46c, the cell body contact hole 60pw, the peripheral body contact hole 60p1, and the third source/drain contact hole 60p2 may be simultaneously formed.

By performing an ion implantation process capable of implanting a group III element (e.g., B, Al, or the like) of the periodic table, a cell body contact region 64w may be formed in the cell body impurity region 12p1 exposed by the cell body contact hole 60pw, a peripheral body contact region 66p1 may be formed in the first body impurity region 12p2 exposed by the peripheral body contact hole 60p1, and a third peripheral contact region 66p2 may be formed in the third peripheral impurity region 12p3 exposed by the third source/drain contact hole 60p2.

In some embodiments, the cell body contact region 64w, the peripheral body contact region 66p1, and the third peripheral contact region 66p2 may be formed and, simultaneously, cell gate contact regions CCN implanted the group III element of the periodic table may be formed in the cell gate conductive patterns 38 exposed by the cell gate contact holes 46c, and a peripheral gate contact area PCN implanted the group III element of the periodic table may be formed in the peripheral gate G1 exposed by the peripheral gate contact hole 48g.

Referring to FIGS. 1A, 1B, 19A, and 19B, gap fill layers 58', which may fill the cell gate contact holes 46c, the cell body contact hole 60pw, the peripheral body contact hole 60p1, and the third source/drain contact hole 60p2, may be formed. The gap fill layers 58' may be formed of a material having an etch selectivity different from the interlayer insulating layers 22, 32, and 44, the substrate 2, the cell gate conductive patterns 38, and the peripheral gate G1. For example, the gap fill layers 58' may be formed of an SOH layer, an amorphous carbon layer, a photoresist, or amorphous silicon.

Contact holes which may expose an area having an N-type conductivity type in the substrate 2 may be formed. The contact holes may include cell guard contact holes 46nw which may expose the cell guard impurity region 10n1, a first source contact hole 48n1 which may expose the first source area 10n2, a first drain contact hole 48n2 which may expose the first drain area 10n3, and a second source/drain contact hole 50 which may expose the second peripheral impurity region 10n4.

By performing an ion implantation process of implanting a group V element of the periodic table, a cell guard contact area 52w may be formed in the cell guard impurity region 10n1 exposed by the cell guard contact holes 46nw, a first source contact area 54n1 may be formed in the first source area 10n2 exposed by the first source contact hole 48n1, a first drain contact area 54n2 may be formed in the first drain area 10n3 exposed by the first drain contact hole 48n2, and a second peripheral contact region 56 may be formed in the second peripheral impurity region 10n4 exposed by the second source/drain contact hole 50.

Figure 15A:
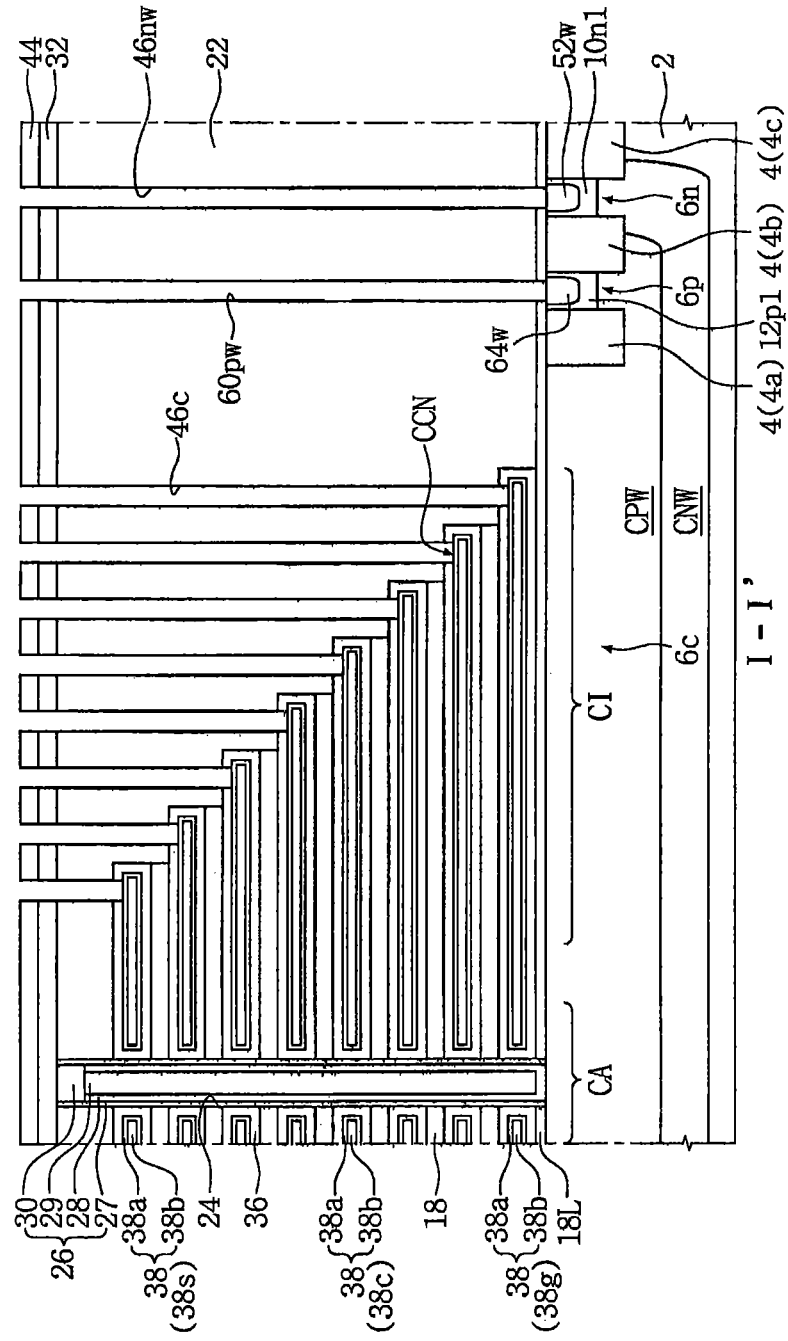
Figure 15B:
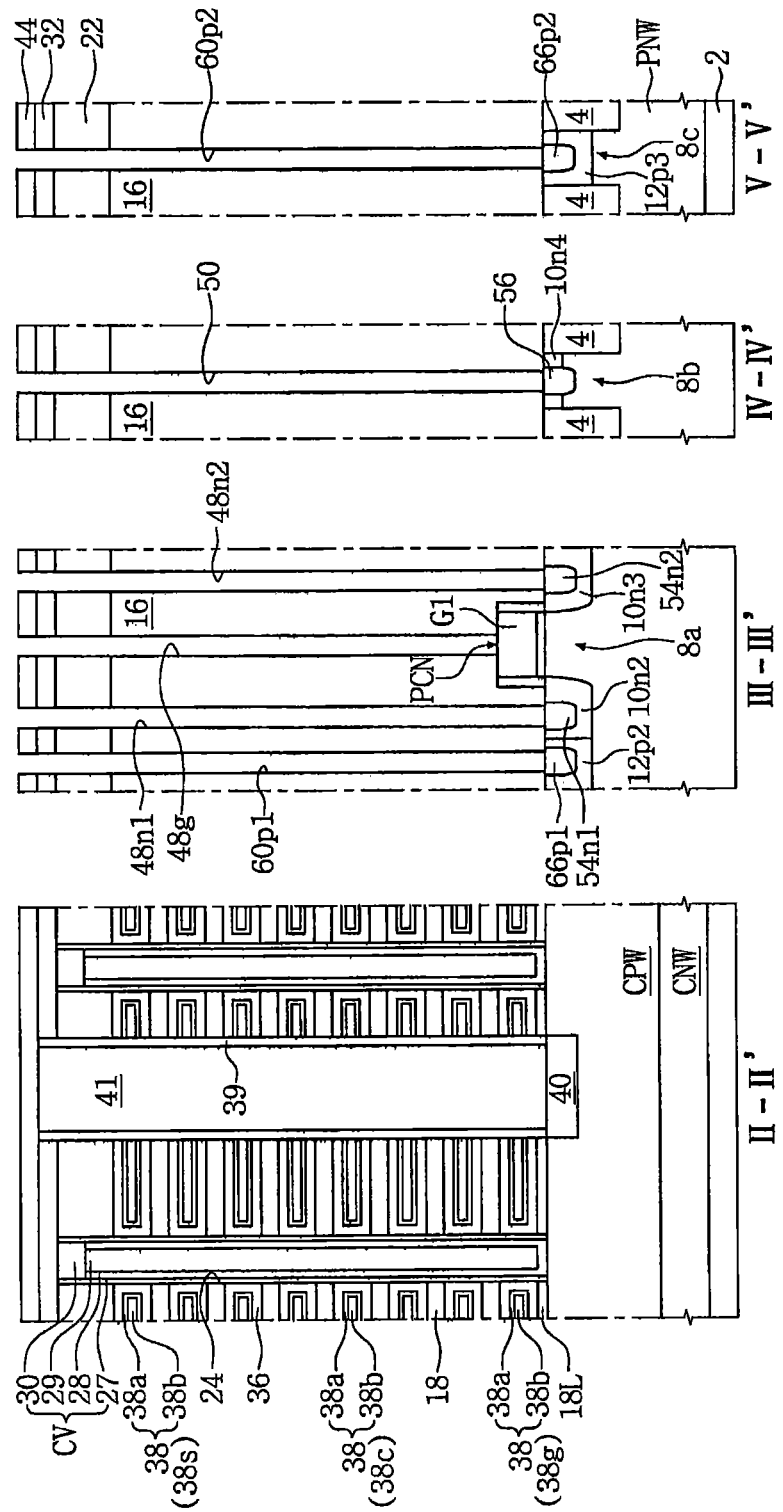
Figure 16A:
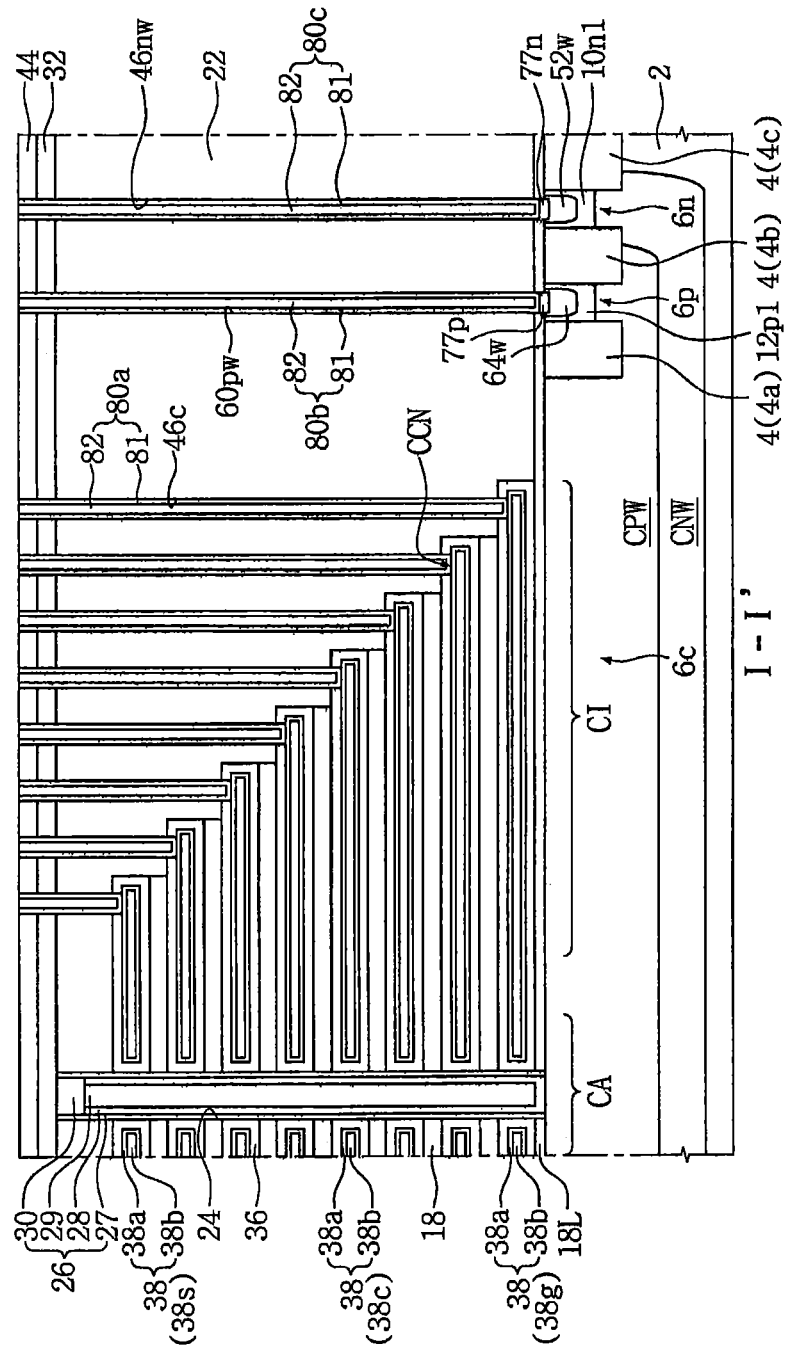
Figure 16B:
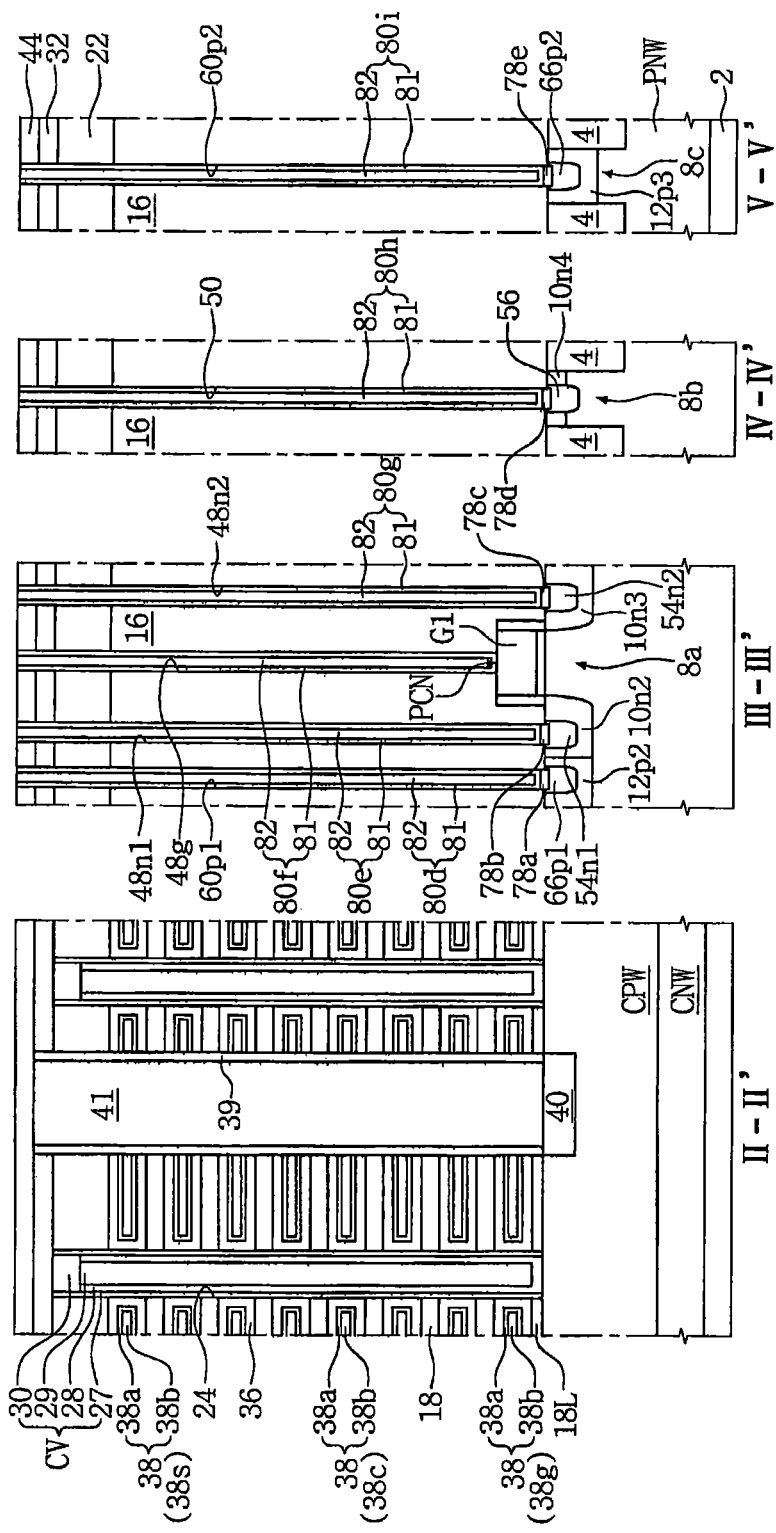
Figure 17A:
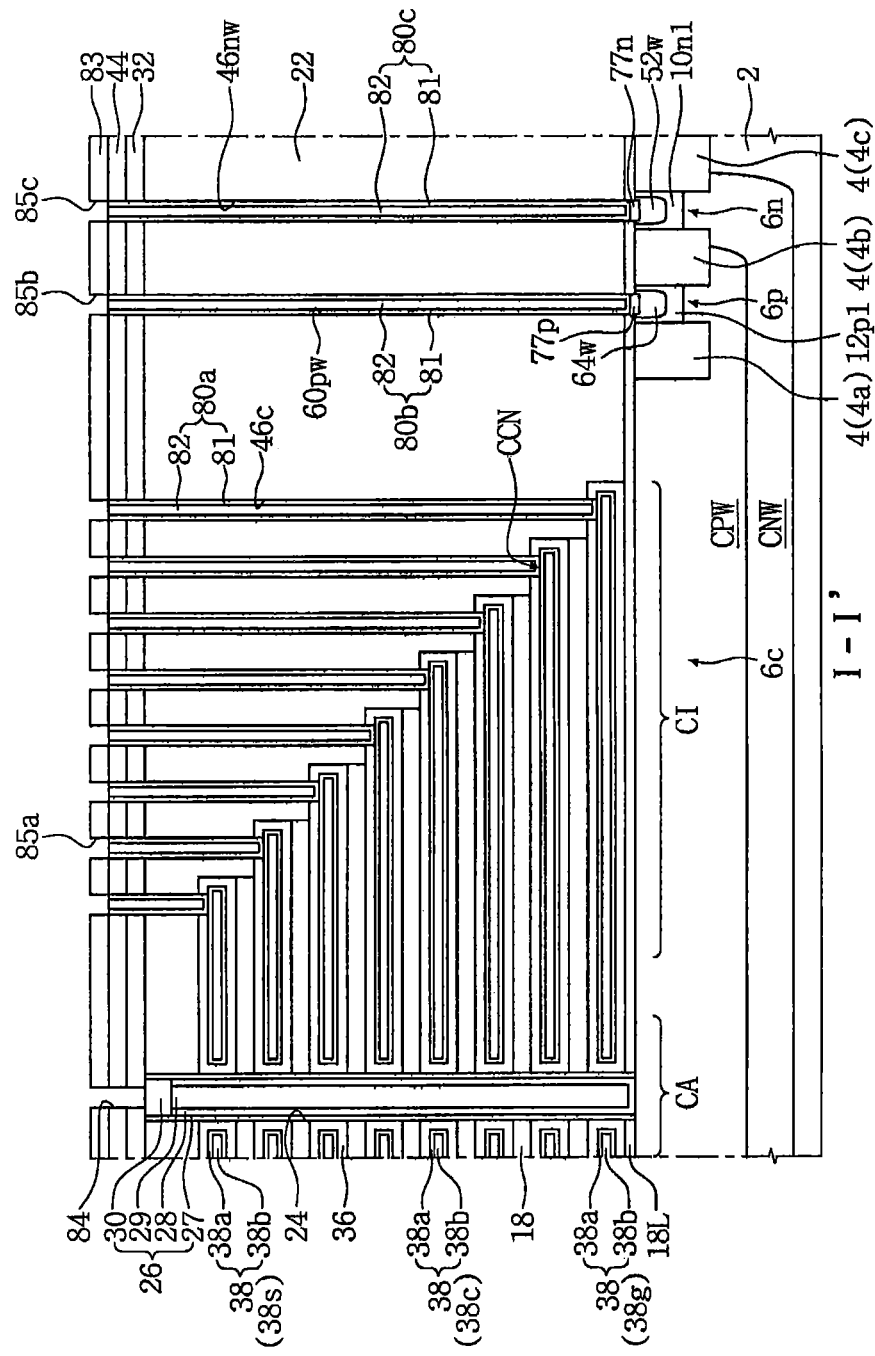
Figure 17B:
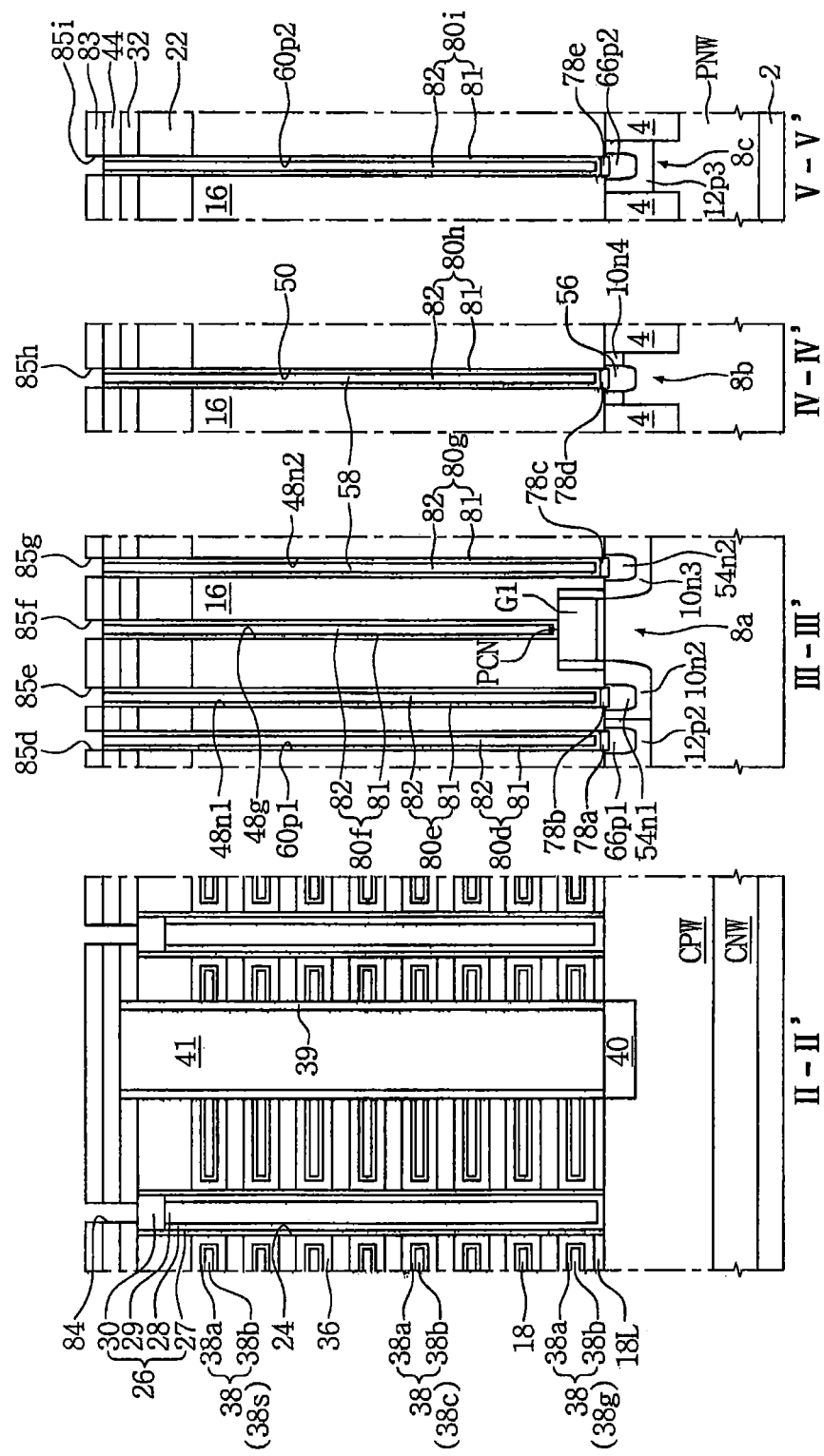
Figure 18A:
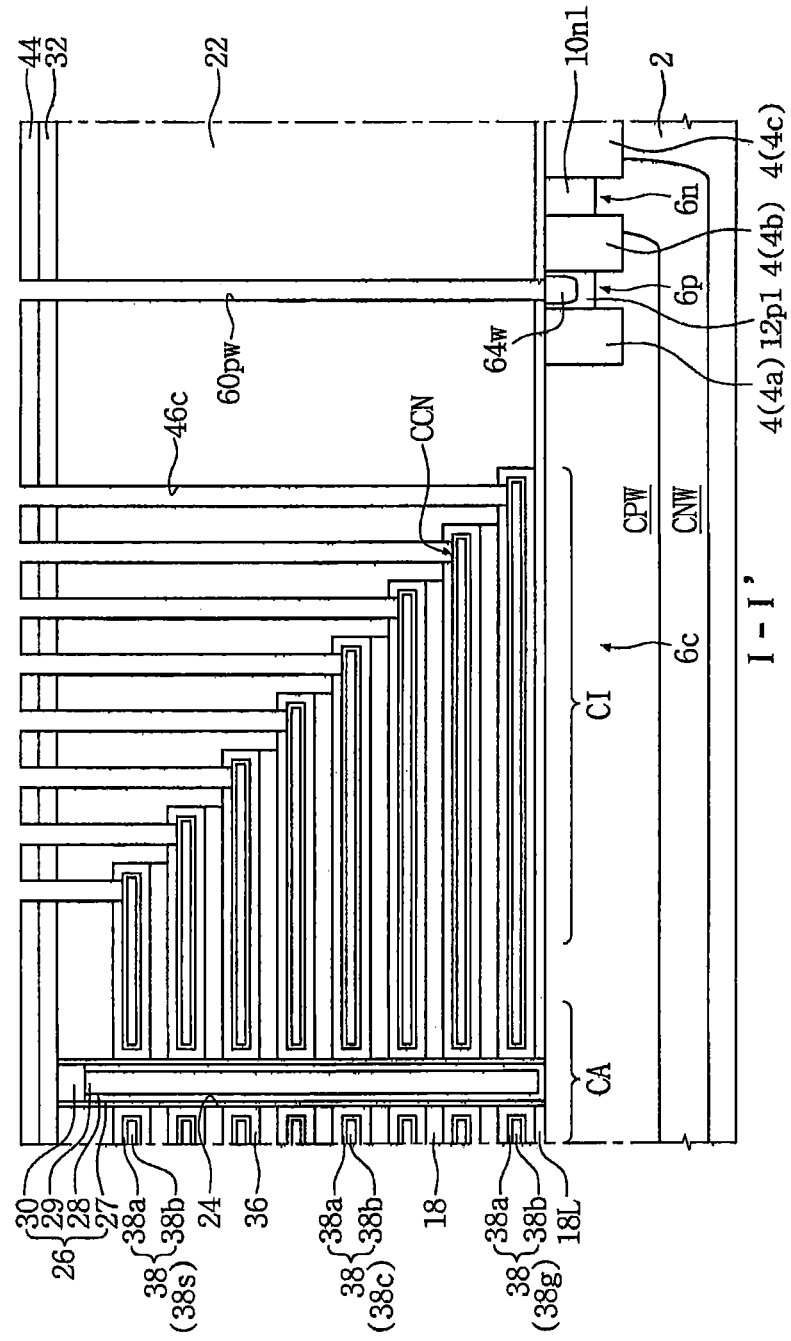
FIGS. 18A to 19B are cross-sectional views illustrating intermediate process operations in methods of forming a semiconductor devices according to some embodiments of the inventive concepts.
Figure 18B:
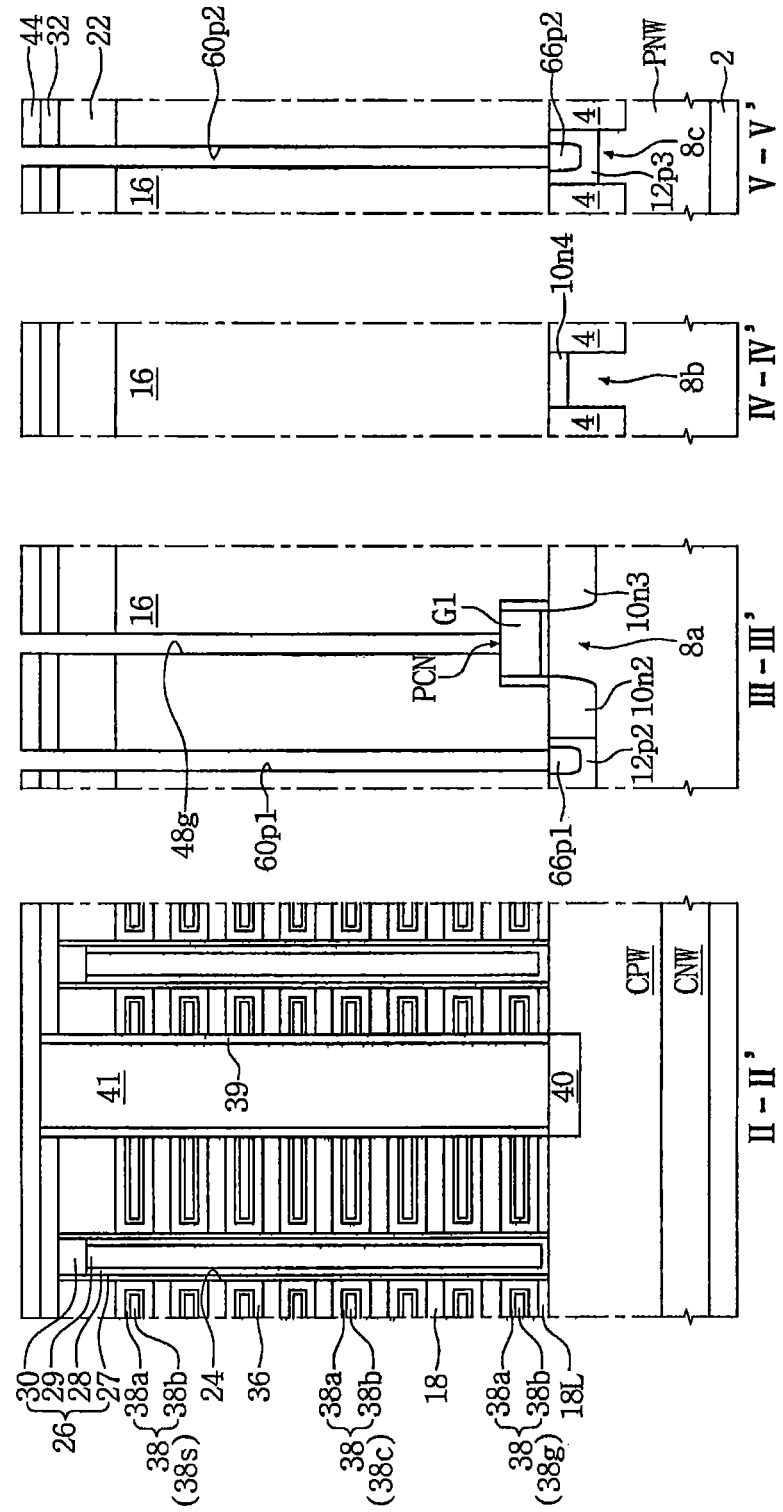

Then, as described with reference to FIGS. 15A and 15B, the gap fill layers 58' may be selectively removed, and contact structures such as those described in FIGS. 16A and 16B, and contact plugs and interconnection structures such as those described in FIGS. 3A and 3B may be formed.

FIGS. 20A to 25B are cross-sectional views illustrating intermediate process operations in methods of forming a semiconductor devices according to some embodiments of the inventive concepts. In FIGS. 20A to 25B, FIGS. 20A, 21A, 22A, 23A, 24A, and 25A are cross-sectional views illustrating areas taken along lines VI-VI' and VII-VII' of FIG. 4, and FIGS. 20B, 21B, 22B, 23B, 24B, and 25B are cross-sectional views illustrating areas taken along lines VIII-VIII' and IX-IX' of FIG. 4.

Example methods of forming semiconductor devices according to some embodiments of the inventive concepts illustrated in FIGS. 4, 5A, and 5B will be described with reference to FIGS. 20A to 25B.

Figure 20A:
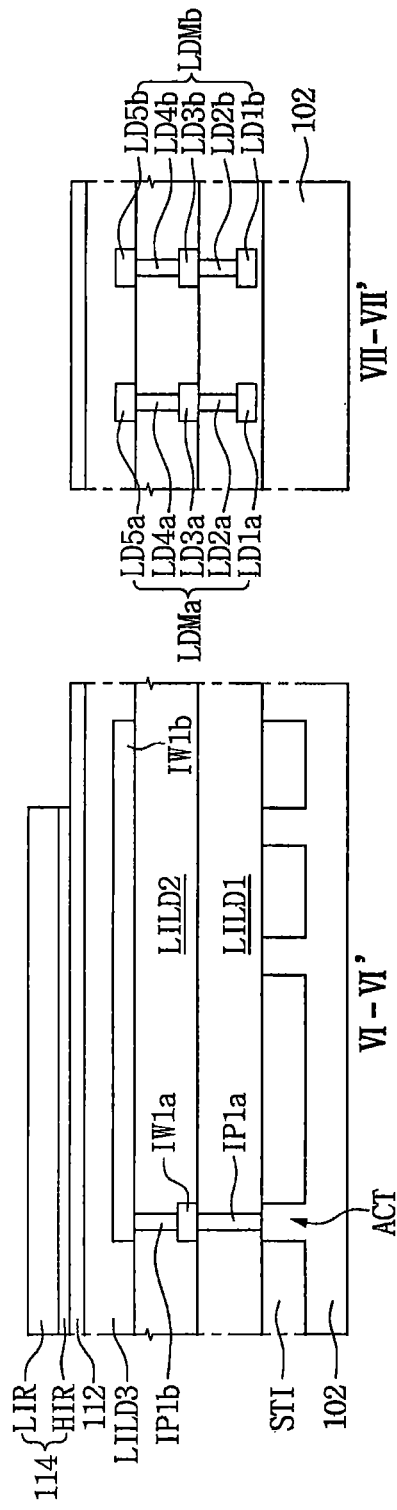
FIGS. 20A to 25B are cross-sectional views illustrating intermediate process operations in methods of forming semiconductor devices according to some embodiments of the inventive concepts.
Figure 20B:
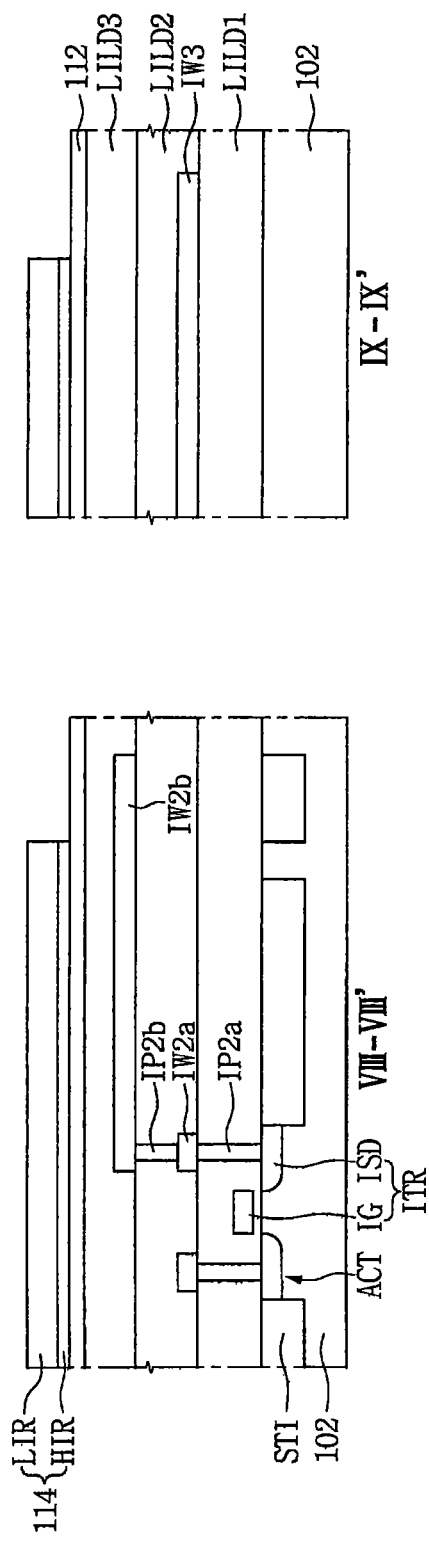

Referring to FIGS. 4, 20A, and 20B, a substrate 102 may be prepared. The substrate 102 may be a semiconductor substrate. An isolation area STI which may define an active region ACT may be formed on the substrate 102. Peripheral transistors may be formed on the substrate 102. For example, a peripheral transistor ITR including a peripheral gate IG on the active region ACT and a peripheral source/drain area ISD in the active region ACT on both sides of the peripheral gate IG may be disposed.

In some embodiments, while the peripheral gate IG is formed, a first lower inner dam LD1a and a first lower outer dam LD1b may be formed.

A first lower interlayer insulating layer LILD1 which may cover the peripheral transistor ITR may be formed on the substrate 102. A plurality of lower plugs, a second lower inner dam LD2a, and a second lower outer dam LD2b, which may pass through the first lower interlayer insulating layer LILD1, may be formed. The plurality of lower plugs may include a first lower plug IP1a and a second lower plug IP2a. The first lower plug IP1a may be electrically connected to a source/drain area ISDa formed in the active region ACT of the substrate 102. The second lower plug IP2a may be electrically connected to peripheral transistor ITR. The second lower plug IP2a may be electrically connected to the peripheral source/drain area ISD of the peripheral transistor ITR.

A plurality of peripheral lower interconnection patterns, a third lower inner dam LD3a, and a third lower outer dam LD3b may be formed on the first lower interlayer insulating layer LILD1. The plurality of peripheral lower interconnection patterns may include a first lower interconnection pattern IW1a, a second lower interconnection pattern IW2a, and a third lower interconnection pattern IW3.

A second lower interlayer insulating layer LILD2 which may cover the plurality of lower interconnection patterns, the third lower inner dam LD3a, and the third lower outer dam LD3b may be formed on the first lower interlayer insulating layer LILD1. A plurality of upper plugs, a fourth lower inner dam LD4a, and a fourth lower outer dam LD4b, which may pass through the second lower interlayer insulating layer LILD2, may be formed. The plurality of upper plugs may include a first upper plug IP1b and a second upper plug IP2b. A plurality of upper interconnection patterns, a fifth lower inner dam LD5a, and a fifth lower outer dam LD5b may be formed on the second lower interlayer insulating layer LILD2. The plurality of upper interconnection patterns may include a first upper interconnection pattern IW1b and a second upper interconnection pattern IW2b. The first upper interconnection pattern IW1b, the first upper plug IP1b, the first lower interconnection pattern IW1a, and the first lower plug IP1a may be electrically connected to each other. The second upper interconnection pattern IW2b, the second upper plug IP2b, the second lower interconnection pattern IW2a, and the second lower plug IP2a may be electrically connected to each other.

The first lower inner dam LD1a, the second lower inner dam LD2a, the third lower inner dam LD3a, the fourth lower inner dam LD4a, and the fifth lower inner dam LD5a may be connected to each other and may define a lower inner dam structure LDMa.

The first lower outer dam LD1b, the second lower outer dam LD2b, the third lower outer dam LD3b, the fourth lower outer dam LD4b, and the fifth lower outer dam LD5b may be connected to each other and may define a lower outer dam structure LDMb.

A third lower interlayer insulating layer LILD3, which may cover the plurality of upper interconnection patterns, the fifth lower inner dam LD5a, and the fifth lower outer dam LD5b, may be formed on the second lower interlayer insulating layer LILD2.

A buffer insulating layer 112 may be formed on the third lower interlayer insulating layer LILD3. The buffer insulating layer 112 may have an etch selectivity different from the third lower interlayer insulating layer LILD3. For example, the buffer insulating layer 112 may be formed of silicon nitride, and the third lower interlayer insulating layer LILD3 may be formed of silicon oxide.

A semiconductor layer may be formed on the buffer insulating layer 112, and a cell semiconductor layer 114 may be formed by patterning the semiconductor layer. In some embodiments, the cell semiconductor layer 114 may be formed of silicon. In some embodiments, the cell semiconductor layer 114 may be formed of doped polysilicon. For example, the cell semiconductor layer 114 may be formed of doped silicon having a P-type conductivity type. The cell semiconductor layer 114 may include a high concentration impurity region HIR and a low concentration impurity region LIR which may be located on the high concentration impurity region HIR and may have an impurity concentration lower than the high concentration impurity region HIR. The high concentration impurity region HIR may be formed by implanting a group III element (e.g., boron) of the periodic table. The cell semiconductor layer 114 may overlap a peripheral circuit including the peripheral transistor ITR. The first to third interconnection patterns IW1b, IW2b, and IW3 may overlap the cell semiconductor layer 114 and extend in a direction of an outside of the cell semiconductor layer 114.

Figure 21A:
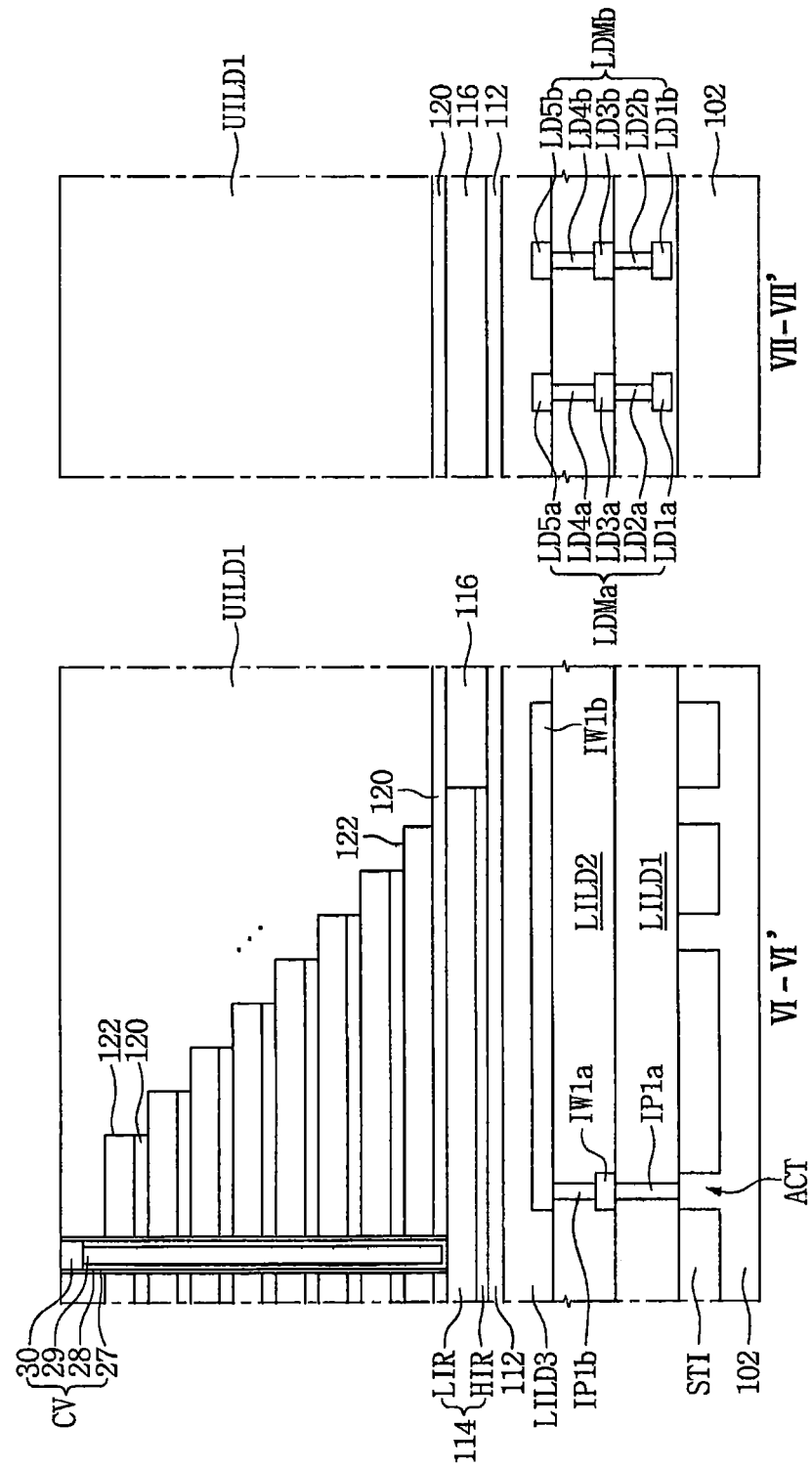
Figure 21B:
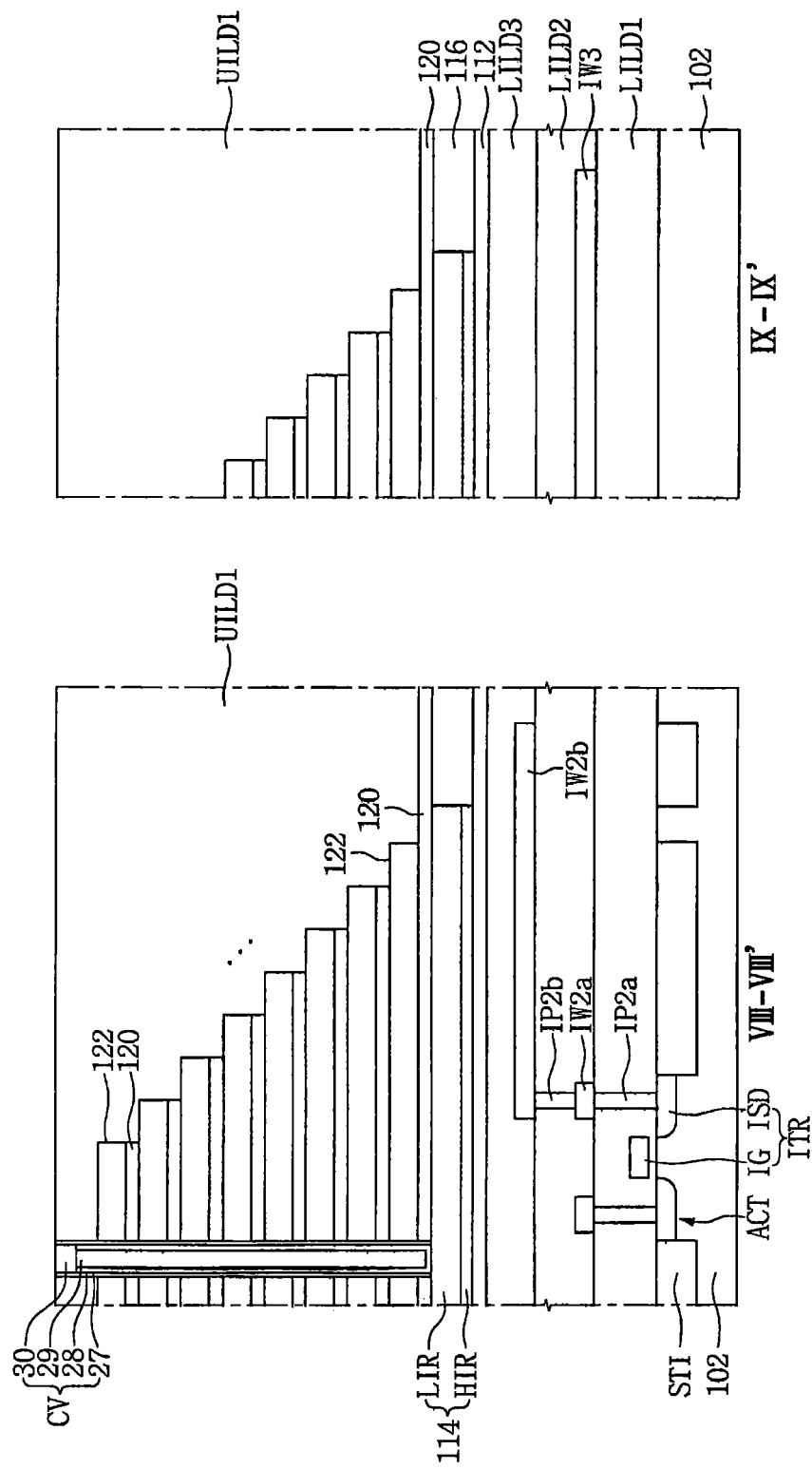

Referring to FIGS. 4, 21A, and 21B, an insulating layer may be formed on the substrate 102 having the cell semiconductor layer 114, and an intermediate interlayer insulating layer 116 may be formed by planarization until the cell semiconductor layer 114 may be exposed. The intermediate interlayer insulating layer 116 may be formed of silicon oxide. First molding patterns 120 and second molding patterns 122 which may be alternately and repeatedly stacked may be formed on the cell semiconductor layer 114. Edges of the first and second molding patterns 120 and 122 may be formed in a step structure. The first molding pattern 120 may have an etch selectivity with respect to the second molding pattern 122. For example, the first molding pattern 120 may be formed of silicon oxide, and the second molding pattern 122 may be formed of silicon nitride.

A first upper interlayer insulating layer UILD1 may be formed on the substrate 102 having the first and second molding patterns 120 and 122. The first upper interlayer insulating layer UILD1 may be formed of silicon oxide. The first upper interlayer insulating layer UILD1 may cover the first and second molding patterns 120 and 122 and may be formed so as to have a substantially planar upper surface.

Cell vertical structures CV, which may pass through the first upper interlayer insulating layer UILD1 and the first and second molding patterns 120 and 122 and may be connected to the cell semiconductor layer 114, may be formed. Ones of the cell vertical structures CV may be formed so as to include a first dielectric 27, a cell semiconductor pattern 28, a cell core insulating pattern 29, and a cell pad pattern 30 such as the methods of forming the cell vertical structures CV of FIGS. 8A and 8B.

Figure 22A:
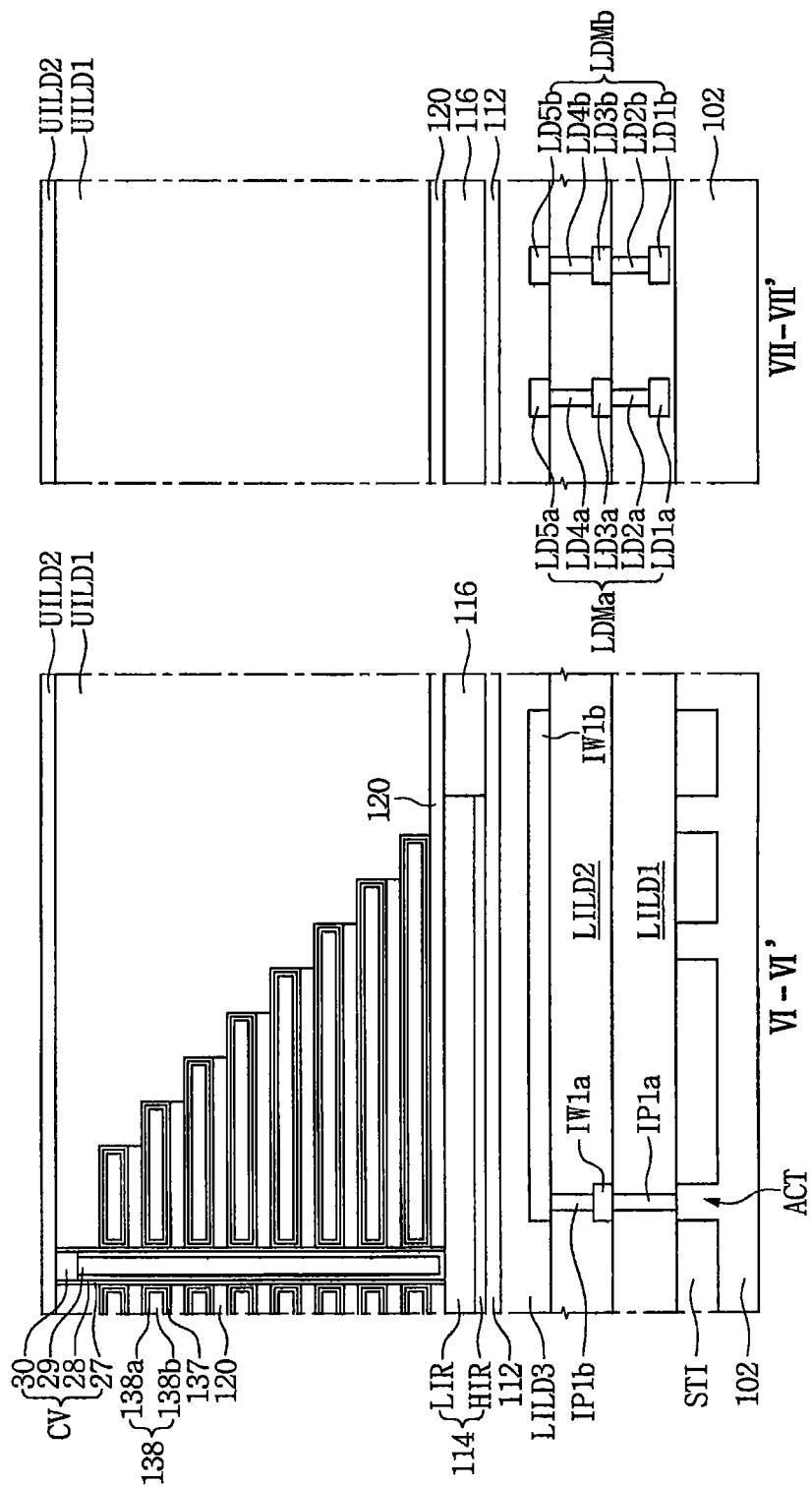
Figure 22B:
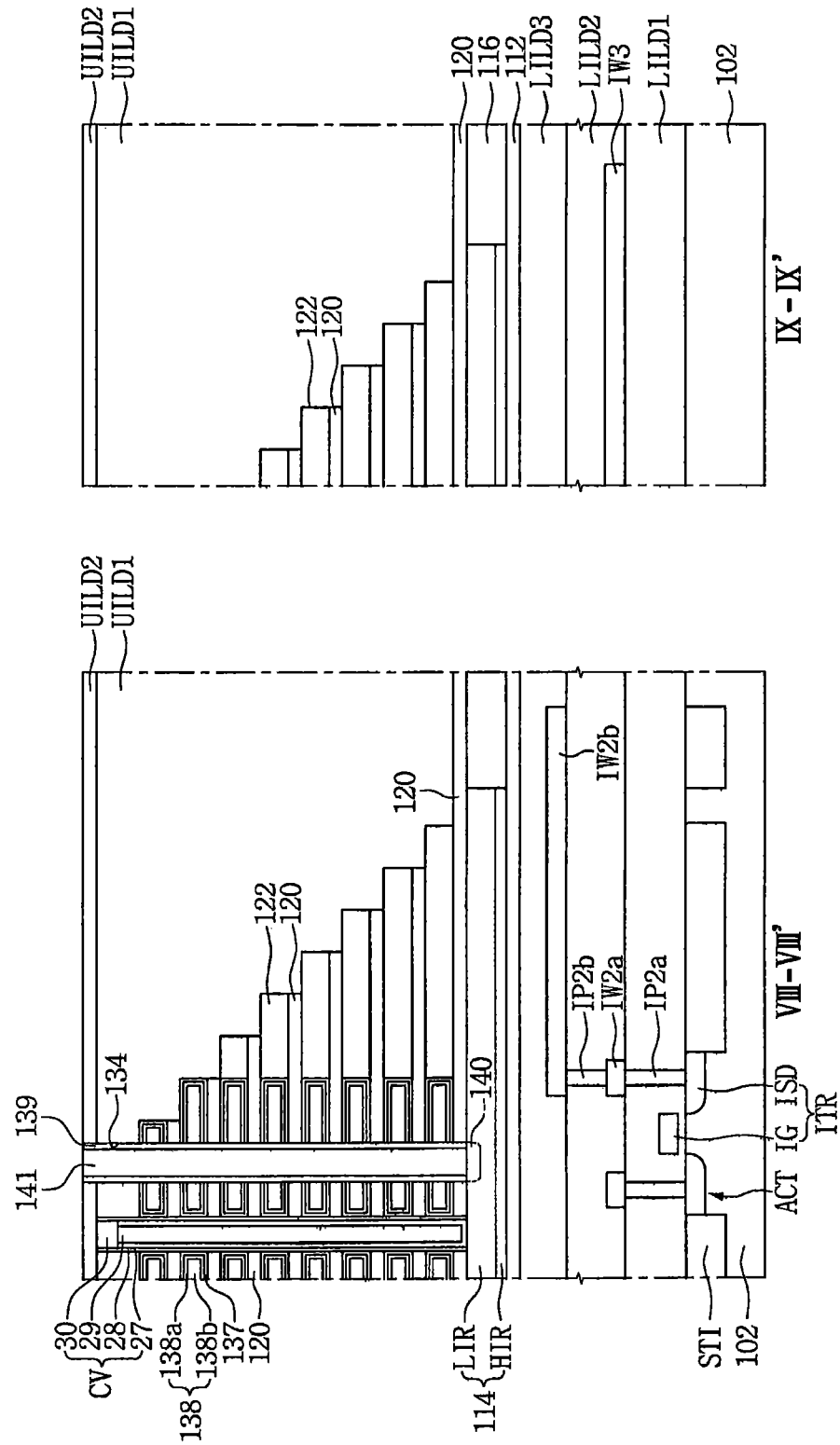

Referring to FIGS. 4, 22A, and 22B, a second upper interlayer insulating layer UILD2 may be formed on the substrate 102 having the cell vertical structures CV. Trenches 134, which may pass through the first and second upper interlayer insulating layers UILD1 and UILD2, and the first and second molding patterns 120 and 122, may be formed on the cell semiconductor layer 114. Empty spaces may be formed by etching the second molding pattern 122 exposed by the trenches 134, a second dielectric 137 may be conformally formed, a conductive material layer may be formed, and cell gate conductive patterns 138 may be formed by removing the conductive material layer formed on an upper part of the second upper interlayer insulating layer UILD2 and in the trenches 134 using an etching process.

A lowermost gate conductive pattern of the cell gate conductive patterns 138 may include a ground select gate electrode, an uppermost gate conductive pattern may include a string select gate electrode, and a plurality of gate conductive patterns between the lowermost gate conductive pattern and the uppermost gate conductive pattern may include cell gate electrodes. The plurality of gate conductive patterns between the lowermost gate conductive pattern and the uppermost gate conductive pattern may include word lines of a memory device.

The trenches 134 may have a line shape. Portions of the first and second molding patterns 120 and 122 on step parts of a direction Y which may cross the trenches 134 may remain. The first molding patterns 120 may be interposed between the cell gate conductive patterns 138. An insulating spacer 139 may be formed on side walls of the trenches 134. The insulating spacer 139 may be formed of an insulating material such as silicon oxide, silicon nitride, or the like.

By performing an ion implantation process, a cell source impurity region 140 may be formed in the cell semiconductor layer 114 exposed by the trenches 134. The cell source impurity region 140 may have a conductivity type different from the low concentration impurity region LIR. For example, the low concentration impurity region LIR may have a P-type conductivity type, and the cell source impurity region 140 may have an N-type conductivity type. Cell source patterns 141 may be formed in the trenches 134. The cell source patterns 141 may be formed of a conductive material (e.g., a material such as Ti, TiN, W, or the like).

Figure 23A:
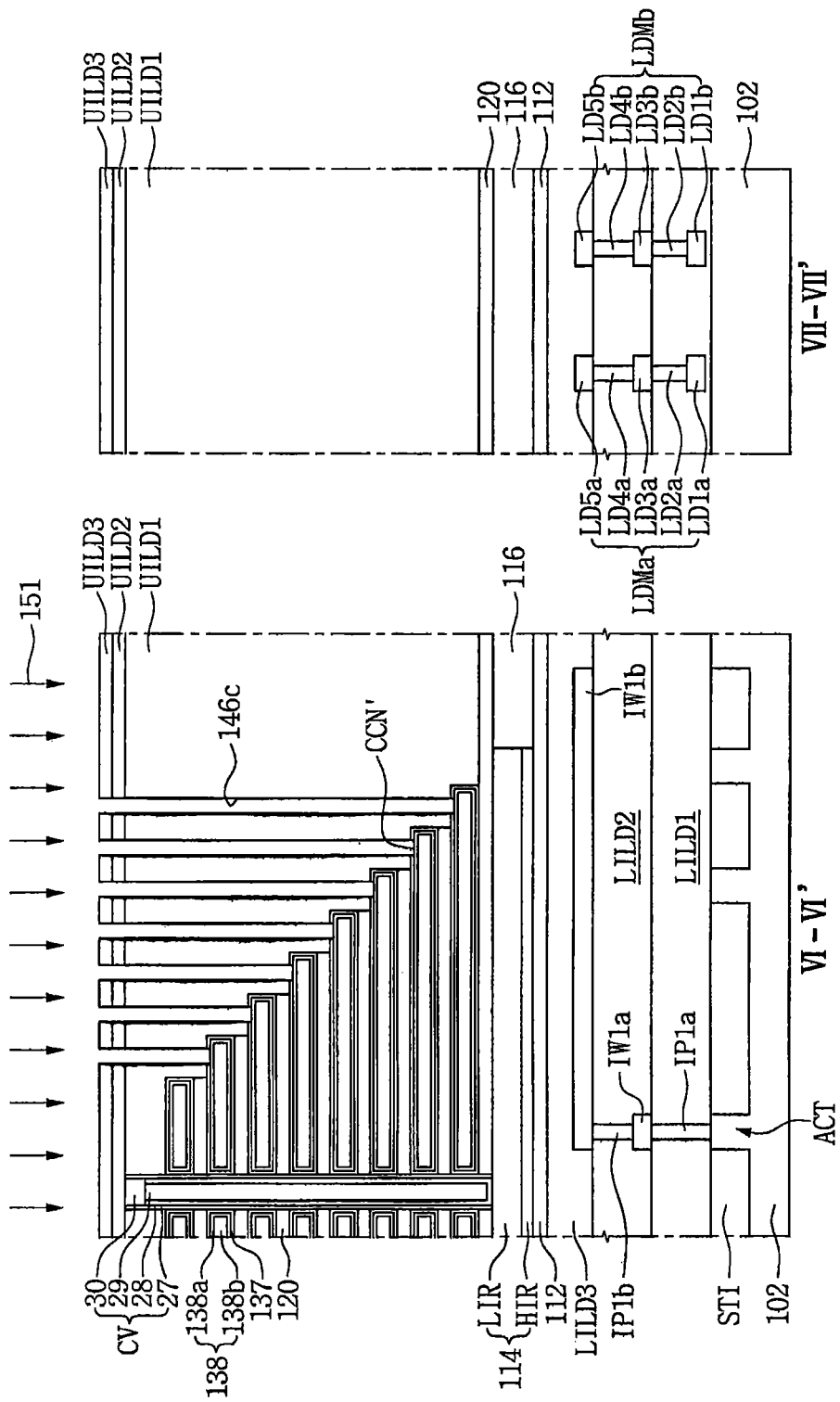
Figure 23B:
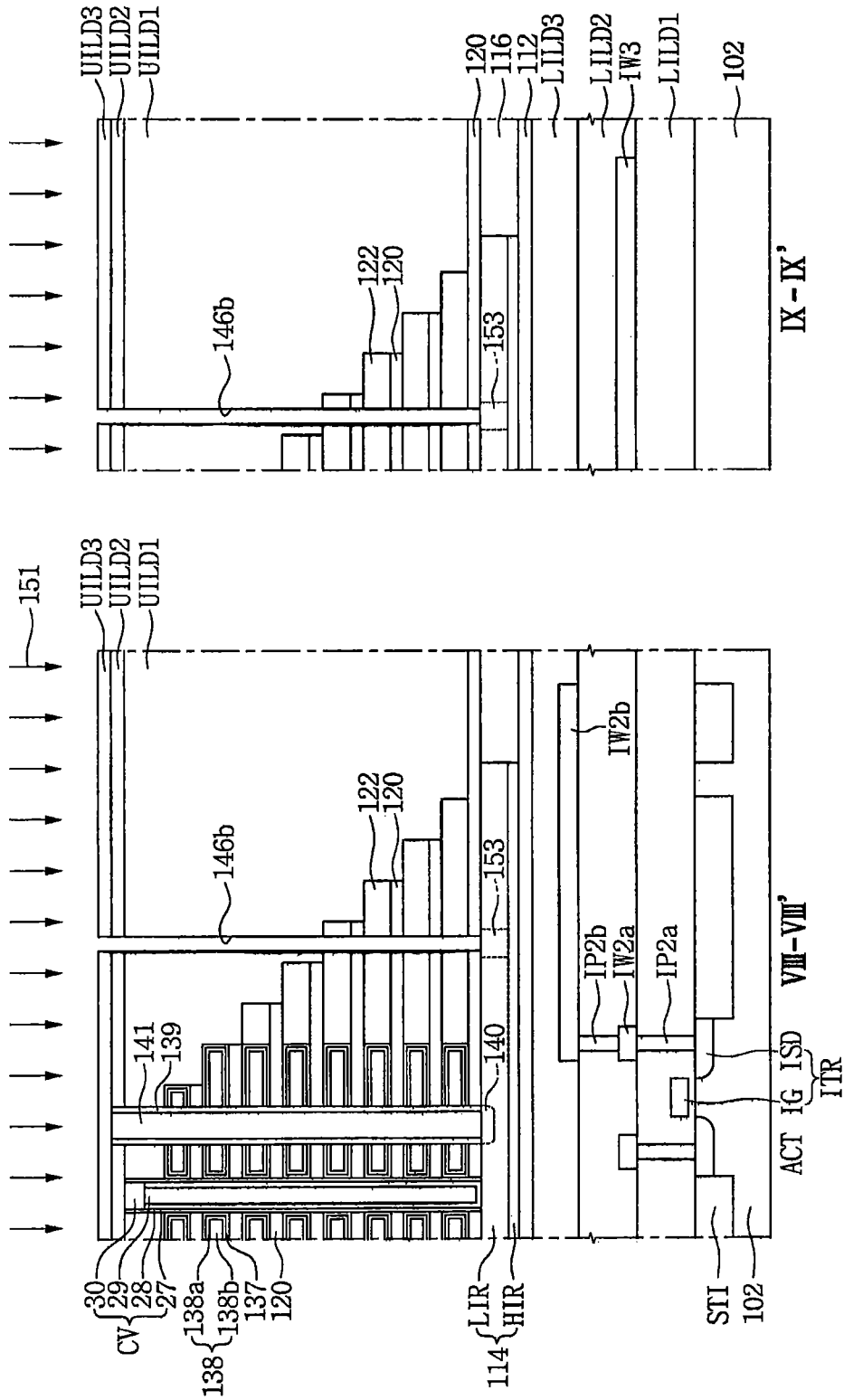

Referring to FIGS. 4, 23A, and 23B, a third upper interlayer insulating layer UILD3 may be formed on the substrate 102 having the cell source patterns 141. The third upper interlayer insulating layer UILD3 may be formed of silicon oxide. By performing a patterning process using a photolithography process and an etching process, cell gate contact holes 146c, which may expose the cell gate conductive patterns 138, and a cell body contact hole 146b, which may expose the cell semiconductor layer 114, may be formed.

In some embodiments, the cell gate contact holes 146c may pass through the first to third upper interlayer insulating layers UILD1 to UILD3.

In some embodiments, the cell body contact hole 146b may pass through the first to third upper interlayer insulating layers UILD1 to UILD3, and step parts of the first and second molding patterns 120 and 122.

By performing an ion implantation process 151, a cell body contact region 153 may be formed in the cell semiconductor layer 114 exposed by the cell body contact hole 146b, and a cell gate contact region CCN' may be formed in ones of the cell gate conductive patterns 138 exposed by the cell gate contact holes 146c. The ion implantation process 151 may be a process of implanting P-type impurity (e.g., "B" in a group III element). Therefore, the cell body contact region 153 and the cell gate contact region CCN' may be areas in which the P-type impurity may be implanted.

The cell body contact region 153 may have the same conductivity type (e.g., a P-type conductivity type) as the low concentration impurity region LIR and an impurity concentration higher than the low concentration impurity region LIR.

Figure 24A:
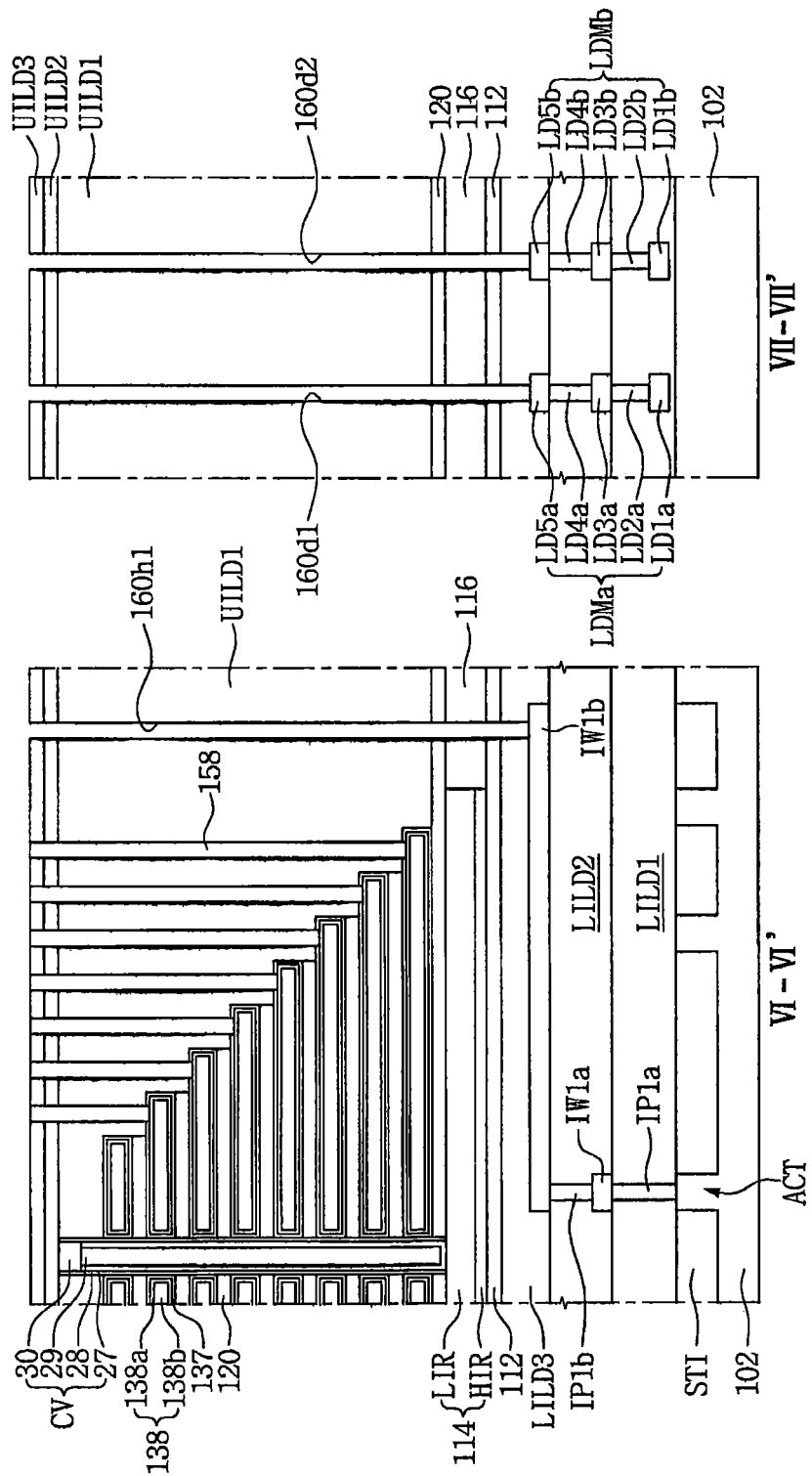
Figure 24B:
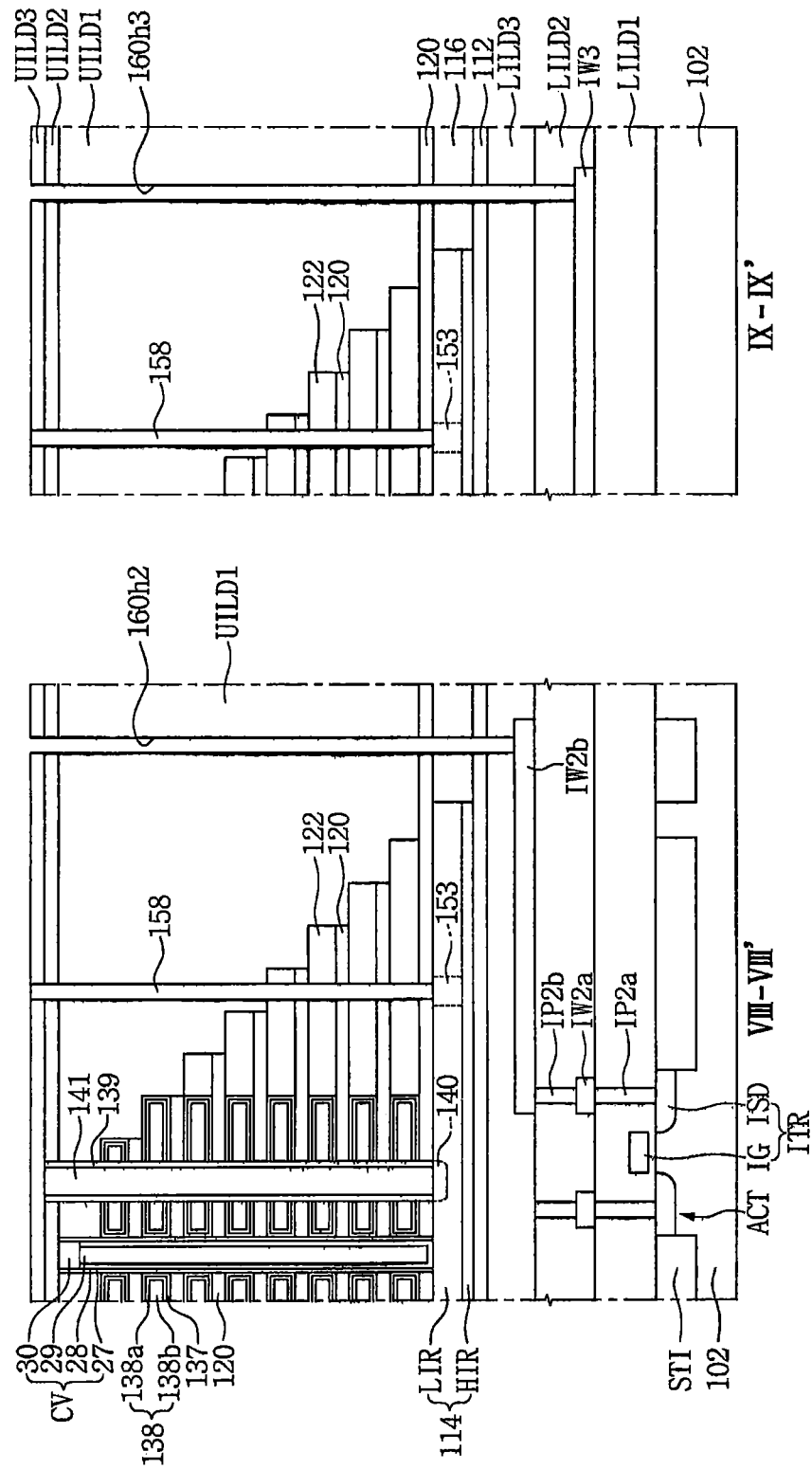

Referring to FIGS. 4, 24A, and 24B, Gap fill layers 158, which may fill the cell gate contact holes 146c and the cell body contact hole 146b, may be formed. The gap fill layers 158 may be formed of a material having an etch selectivity different from the upper interlayer insulating layers UILD3, UILD2, UILD1, 116, and LILD3, the cell semiconductor layer 114, and the cell gate conductive patterns 138. For example, the gap fill layers 158 may be formed of an SOH layer, an amorphous carbon layer, a photoresist, or amorphous silicon.

By performing a patterning process using a photolithography process and an etching process, a first peripheral contact hole 160h1 which may expose the first upper interconnection pattern IW1b, a second peripheral contact hole 160h2 which may expose the second upper interconnection pattern IW2b, a third peripheral contact hole 160h3 which may expose the third lower interconnection pattern IW3, an inner dam groove 160d1 which may expose the fifth lower inner dam LD5a, and an outer dam groove 160d2 which may expose the fifth lower outer dam LD5b may be formed. The third peripheral contact hole 160h3 may have a bottom located a level different from bottoms of the first and second peripheral contact hole 160h1 and 160h2, the inner dam groove 160d1, and the outer dam groove 160d2.

Figure 25A:
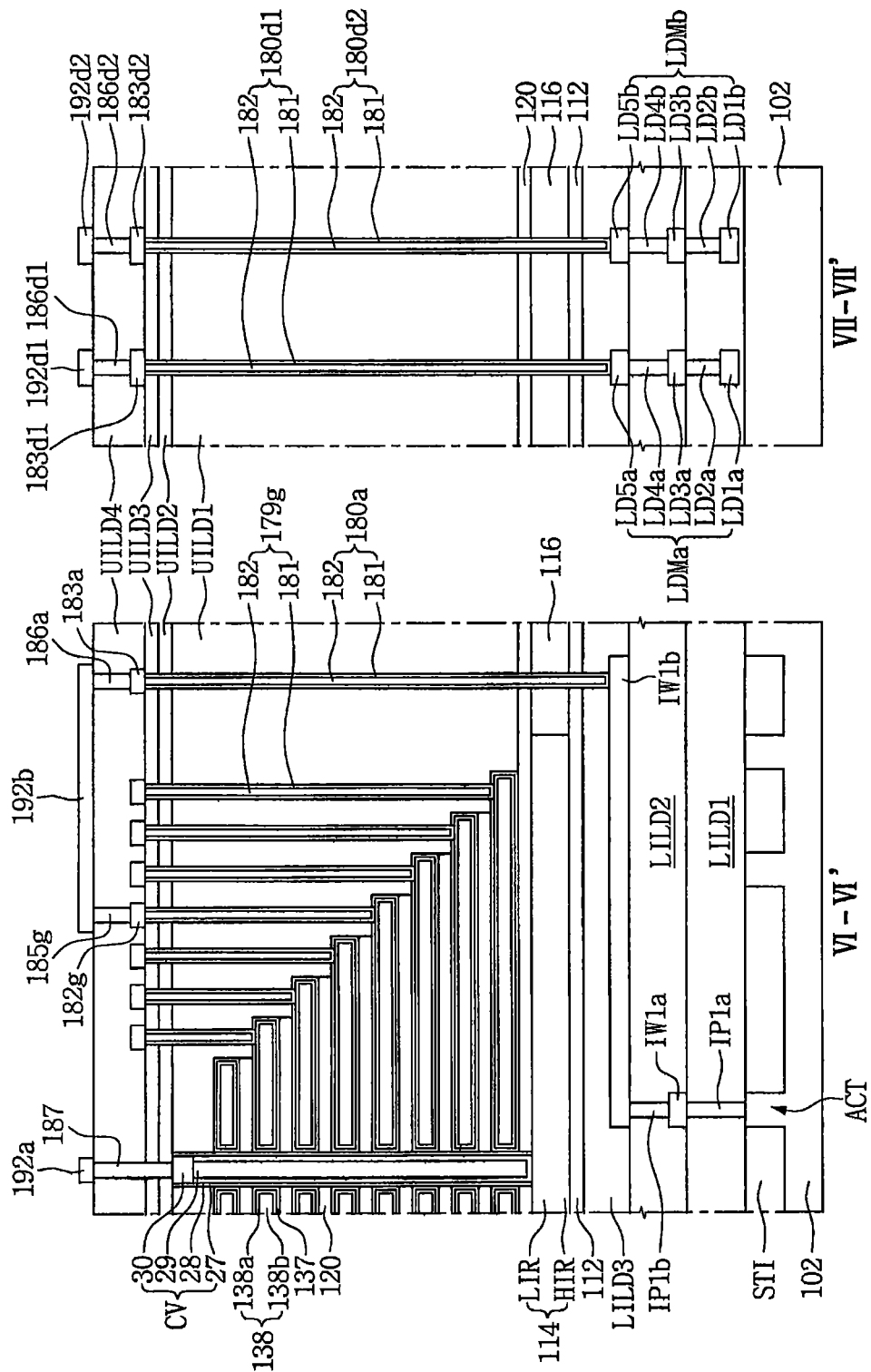
Figure 25B:
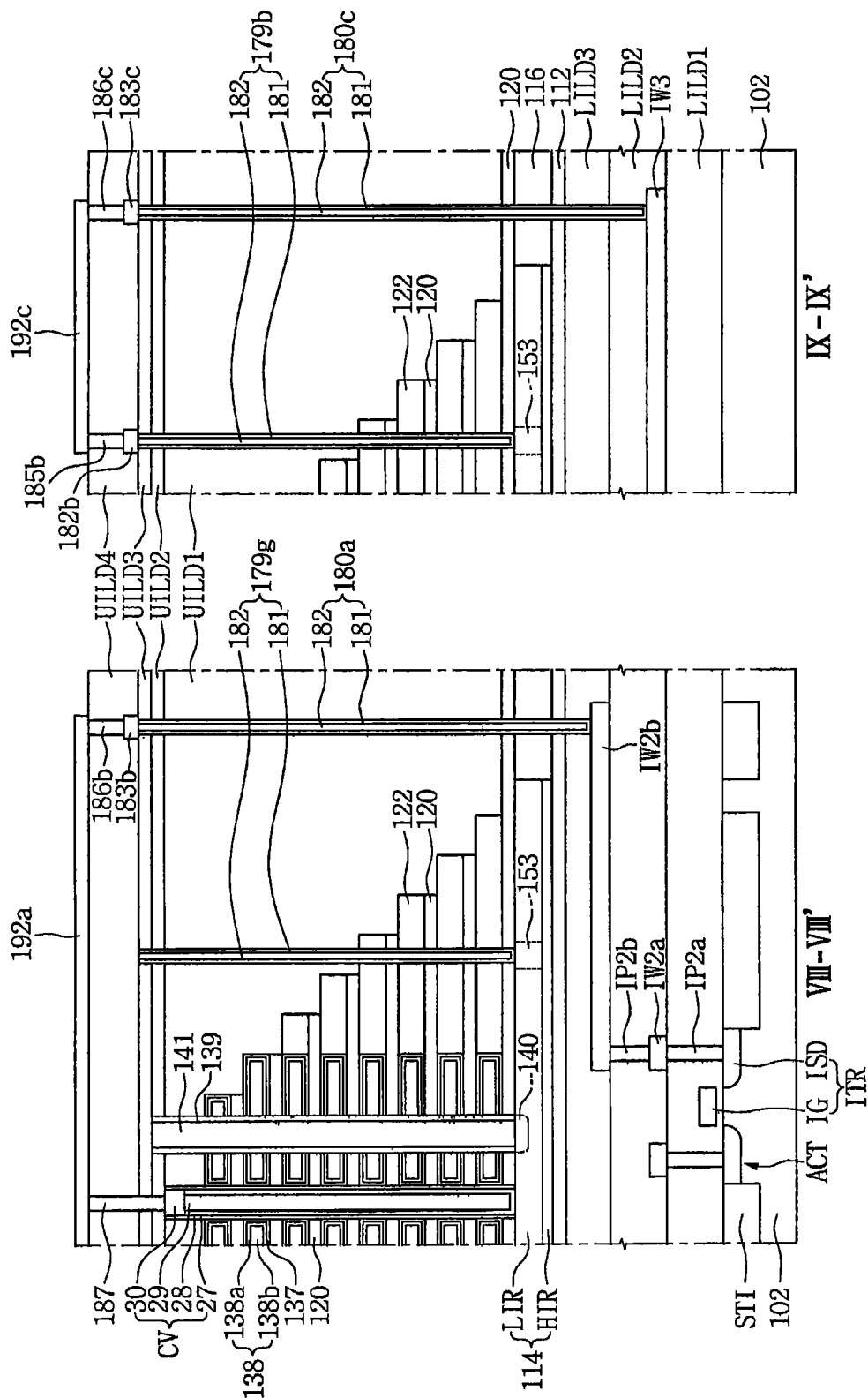

Referring to FIGS. 4, 25A, and 25B, the gap fill layers 158 may be removed. Cell gate contact structures 179g may be formed in the cell gate contact holes 146c, a cell body contact structure 179b may be formed in the cell body contact hole 146b, a first peripheral contact structure 180a may be formed in the first peripheral contact hole 160h1, a second peripheral contact structure 180b may be formed in the second peripheral contact hole 160h2, a third peripheral contact structure 180c may be formed in the third peripheral contact hole 160h3, a first upper inner dam 180d1 may be formed in the inner dam groove 160d1, a first upper outer dam 180d2 may be formed in the outer dam groove 160d2.

Ones of the cell gate contact structures 179g, the cell body contact structure 179b, the first to third contact structures 180a, 180b, and 180c, the first upper inner dam 180d1, and the first upper outer dam 180d2 may include a first conductive layer 181 and a second conductive layer 182 on the first conductive layer 181. The first conductive layer 181 may surround side surfaces and a bottom of the second conductive layer 182.

In some embodiments, the first conductive layer 181 may include a first metal layer (e.g., a metal material such as Ti, or the like) and a metal nitride layer (e.g., a metal nitride such as TiN, WN, or the like) on the first metal layer, and the second conductive layer 82 may include a second metal layer (e.g., W, or the like).

A cell gate intermediate pattern 182g may be formed on the cell gate contact structures 179g, a cell body intermediate pattern 182b may be formed on the cell body contact structure 179b, a first peripheral intermediate pattern 183a may be formed on the first peripheral contact structure 180a, a second peripheral intermediate pattern 183b may be formed on the second peripheral contact structure 180b, a third peripheral intermediate pattern 183c may be formed on the third peripheral contact structure 180c, a second upper inner dam 183d1 may be formed on the first upper inner dam 180d1, and a second upper outer dam 183d2 may be formed on the first upper outer dam 180d2.

A fourth upper interlayer insulating layer UILD4, which may cover the cell gate intermediate pattern 182g, the cell body intermediate pattern 182b, the first peripheral intermediate pattern 183a, the second peripheral intermediate pattern 183b, the third peripheral intermediate pattern 183c, the second upper inner dam 183d1, and the second upper outer dam 183d2, may be formed on the third upper interlayer insulating layer UILD3.

A cell gate upper plug 185g connected to the cell gate intermediate pattern 182g, a cell body upper plug 185b connected to the cell body intermediate pattern 182b, a first peripheral upper plug 186a connected to the first peripheral intermediate pattern 183a, a second peripheral upper plug 186b connected to the second peripheral intermediate pattern 183b, a third peripheral upper plug 186c connected to the third peripheral intermediate pattern 183c, a third upper inner dam 186d1 connected to the second upper inner dam 183d1, and a third upper outer dam 186d2 connected to the second upper outer dam 183d2, which may pass through the fourth upper interlayer insulating layer UILD4, may be formed.

The cell gate upper plug 185g, the cell body upper plug 185b, the first peripheral upper plug 186a, the second peripheral upper plug 186b, the third peripheral upper plug 186c, the third upper inner dam 186d1, and the third upper outer dam 186d2 may be formed, and simultaneously a bit line contact structure 187, which may pass through the second to fourth upper interlayer insulating layers UILD2 to UILD4 and may be connected to the cell pad pattern 30 of the cell vertical structure CV, may be formed.

A bit line interconnection structure 192a, a word line interconnection structure 192b, a body interconnection structure 192c, a fourth upper inner dam 192d1, and a fourth upper outer dam 192d2 may be formed on the fourth upper interlayer insulating layer UILD4.

The word line interconnection structure 192b may be electrically connected to the cell gate upper plug 185g and the first peripheral upper plug 186a. The bit line interconnection structure 192a may be electrically connected to the bit line contact structure 187 and the second peripheral upper plug 186b. The body interconnection structure 192c may be electrically connected to the cell body upper plug 185b and the third peripheral upper plug 186c. The fourth upper inner dam 192d1 may be connected to the third upper inner dam 186d1, and the fourth upper outer dam 192d2 may be connected to the third upper outer dam 186d2.

Referring again to FIGS. 4, 5A, and 5B, a fifth upper interlayer insulating layer UILD5, which may cover the bit line interconnection structure 192a, the word line interconnection structure 192b, the body interconnection structure 192c, the fourth upper inner dam 192d1, and the fourth upper outer dam 192d2, may be formed on the fourth upper interlayer insulating layer UILD4. A fifth upper inner dam 194d1 connected to the fourth upper inner dam 192d1 and a fifth upper outer dam 194d2 connected to the fourth upper outer dam 192d2, which may pass through the fifth upper interlayer insulating layer UILD5, may be formed.

A sixth upper inner dam 196d1 connected to the fifth upper inner dam 194d1 and a sixth upper outer dam 196d2 connected to the fifth upper outer dam 194d2 may be formed on the fifth upper interlayer insulating layer UILD5. A sixth upper interlayer insulating layer UILD6, which may cover the sixth upper inner dam 196d1 and the sixth upper outer dam 196d2, may be formed on the fifth upper interlayer insulating layer UILD5.

Figure 26A:
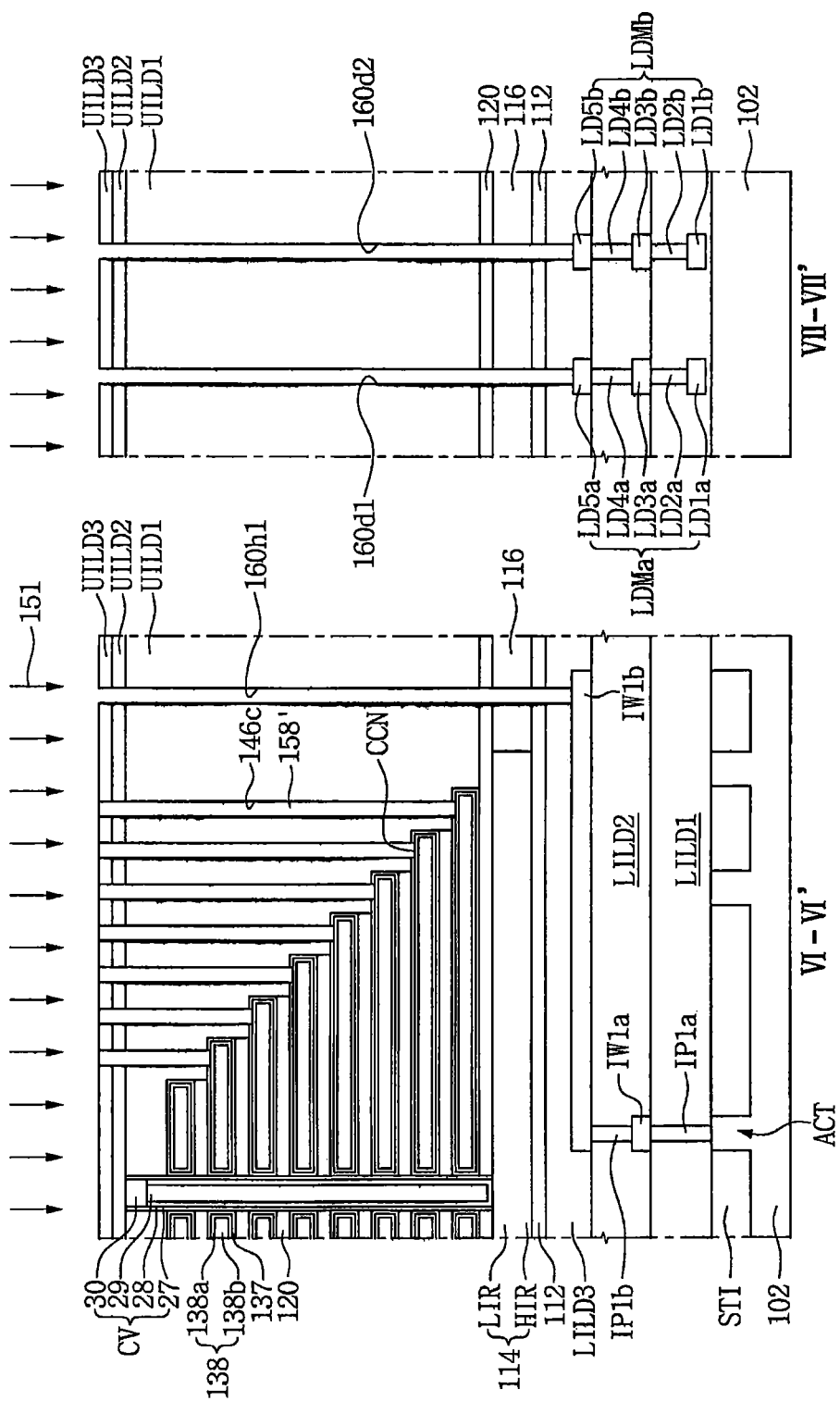
FIGS. 26A and 26B are cross-sectional views illustrating intermediate process operations in methods of forming semiconductor devices according to some embodiments of the inventive concepts.
Figure 26B:
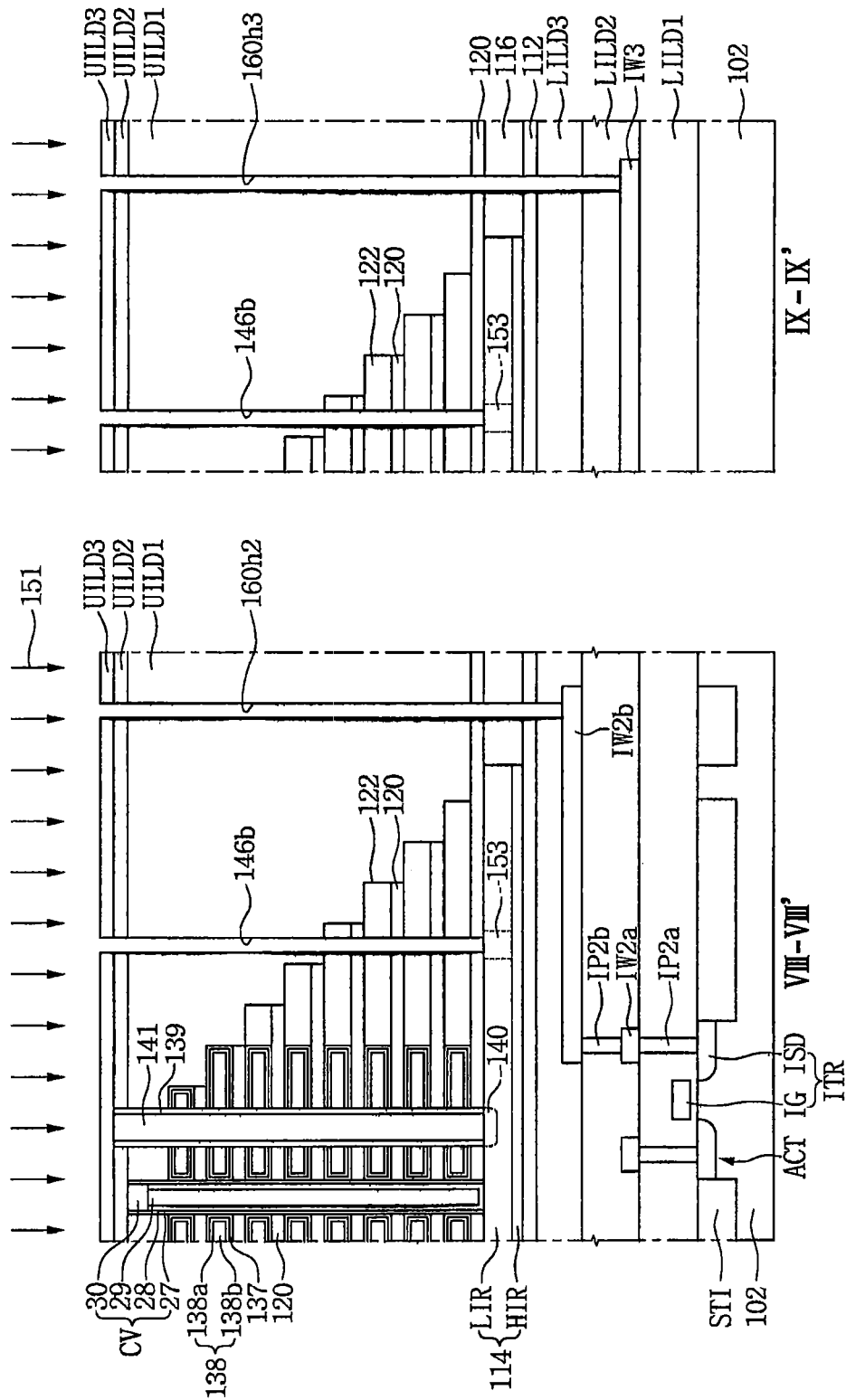

FIGS. 26A and 26B are cross-sectional views illustrating intermediate process operations in methods of forming semiconductor devices according to some embodiments of the inventive concepts. In FIGS. 26A and 26B, FIG. 26A is cross-sectional views illustrating areas taken along lines VI-VI' and VII-VII' of FIG. 4, and FIG. 26B is cross-sectional views illustrating areas taken along lines VIII-VIII' and IX-IX' of FIG. 4.

Example methods of forming semiconductor devices according to some embodiments of the inventive concepts illustrated in FIGS. 4, 5A, and 5B will be described with reference to FIGS. 26A and 26B.

Referring to FIGS. 4, 26A, and 26B, a substrate 102 may be formed by performing processes such as those described with reference to FIGS. 20A to 22B. For example, a third upper interlayer insulating layer UILD3 may be formed on the substrate 102 in which the cell source pattern 141 such as that described with reference to FIGS. 20A to 22B may be formed.

Cell gate contact holes 146c, which may pass through the first to third upper interlayer insulating layers UILD1 to UILD3 and may be electrically connected to the cell gate conductive patterns 138, may be formed. Gap fill layers 158' which may fill the cell gate contact holes 146c may be formed.

By performing a patterning process using a photolithography process and an etching process, a cell body contact hole 146b which may expose the cell semiconductor layer 114, a first peripheral contact hole 160h1 which may expose the first upper interconnection pattern IW1b, a second peripheral contact hole 160h2 which may expose the second upper interconnection pattern IW2b, a third peripheral contact hole 160h3 which may expose the third lower interconnection pattern IW3, an inner dam groove 160d1 which may expose the fifth lower inner dam LD5a, and an outer dam groove 160d2 which may expose the fifth lower outer dam LD5b may be formed.

By performing an ion implantation process 151, a cell body contact region 153 may be formed in the cell semiconductor layer 114 exposed by the cell body contact hole 146b.

In some embodiments, by the ion implantation process 151, a peripheral contact region PCN1, PCN2 and PCN3 may be formed in the first upper interconnection pattern IW1b, the second upper interconnection pattern IW2b, and the third lower interconnection pattern IW3, respectively, which may be exposed by the first to third peripheral contact holes 160h1, 160h2, and 160h3.

The ion implantation process 151 may be a process of implanting P-type impurity (e.g., "B" in a group III element). Therefore, the cell body contact region 153 and the peripheral contact region PCN may be areas in which the P-type impurity (e.g., "B") may be implanted.

The gap fill layer 158' may be removed and processes such as those described with respect to FIGS. 25A and 25B may be performed.

Figure 27A:
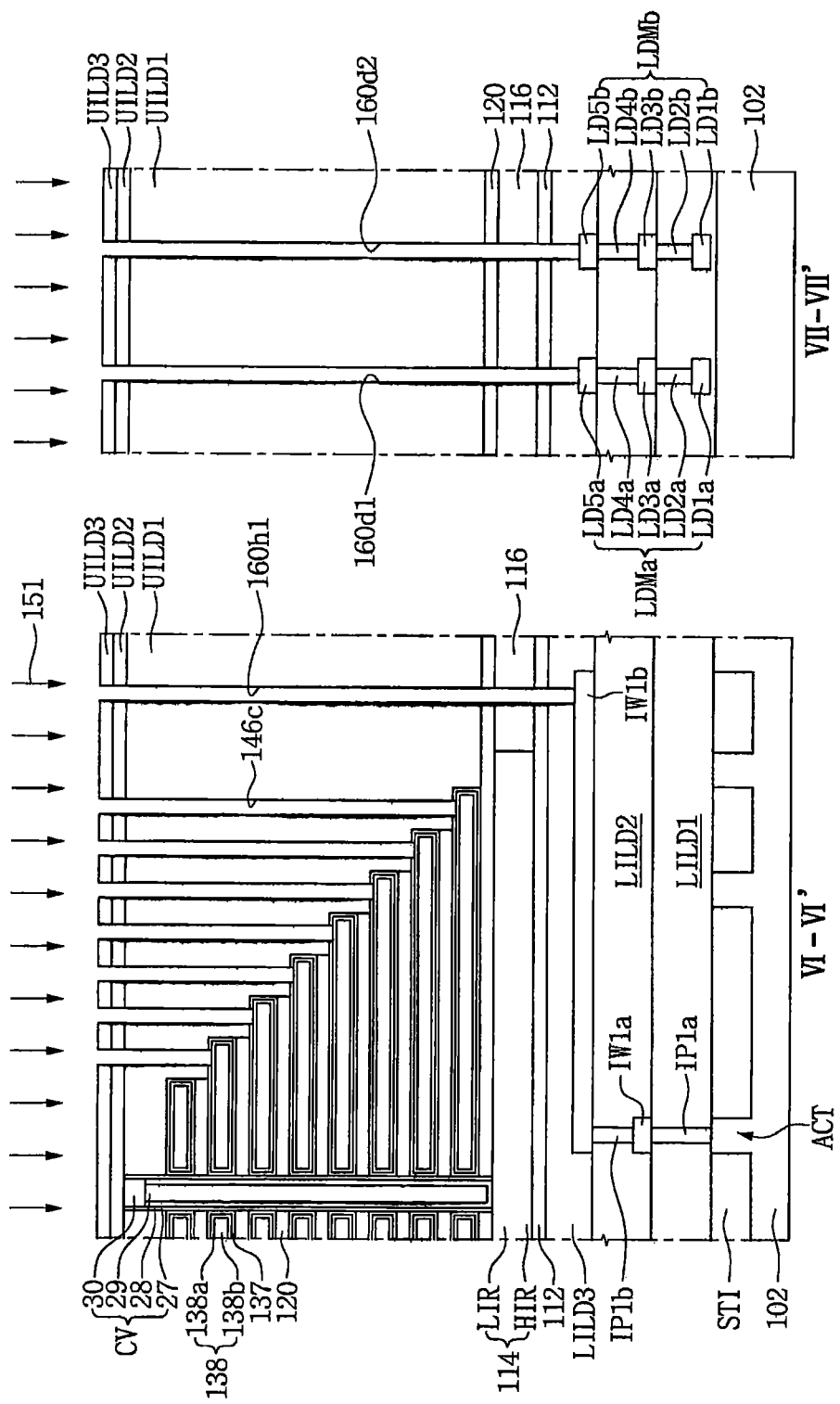
FIGS. 27A and 27B are cross-sectional views illustrating intermediate process operations in methods of forming semiconductor devices according to some embodiments of the inventive concepts.
Figure 27B:
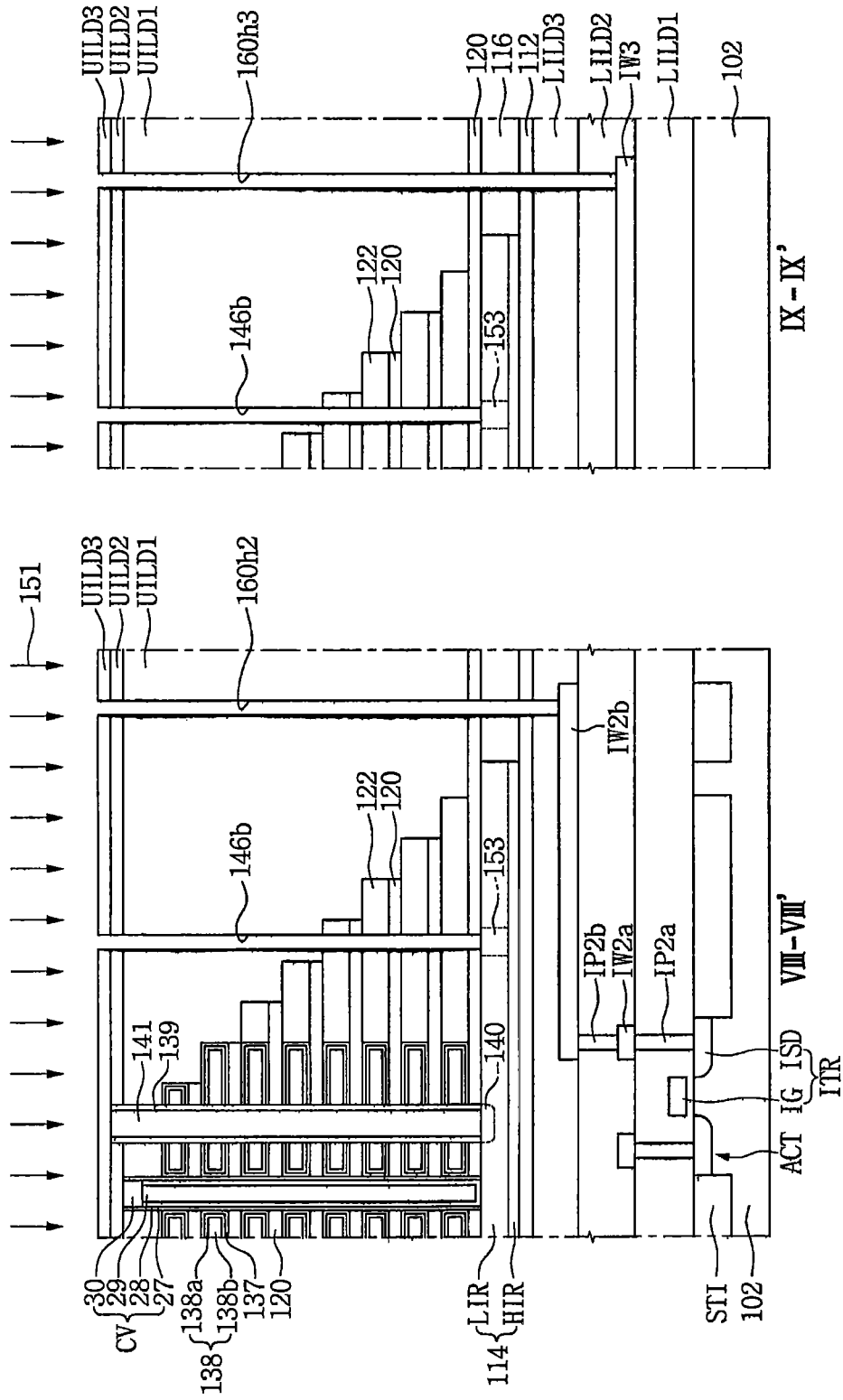

FIGS. 27A and 27B are cross-sectional views illustrating intermediate process operations in methods of forming semiconductor devices according to some embodiments of the inventive concepts. In FIGS. 27A and 27B, FIG. 27A is cross-sectional views illustrating areas taken along lines VI-VI' and VII-VII' of FIG. 4, and FIG. 27B is cross-sectional views illustrating areas taken along lines VIII-VIII' and IX-IX' of FIG. 4.

Example methods of forming semiconductor devices according to some embodiments of the inventive concepts illustrated in FIGS. 4, 5A, and 5B will be described with reference to FIGS. 27A and 27B.

Referring to FIGS. 4, 27A, and 27B, a substrate 102 may be formed by performing processes such as those described with reference to FIGS. 20A to 22B. For example, a third upper interlayer insulating layer UILD3 may be formed on the substrate 102 in which the cell source pattern 141 such as that described with reference to FIGS. 20A to 22B may be formed.

Cell gate contact holes 146c, which may pass through the first to third upper interlayer insulating layers UILD1 to UILD3 and may be electrically connected to the cell gate conductive patterns 138, may be formed By performing a patterning process using a photolithography process and an etching process, cell gate contact holes 146c which may expose the cell gate conductive patterns 138, a cell body contact hole 146b which may expose the cell semiconductor layer 114, a first peripheral contact hole 160h1 which may expose the first upper interconnection pattern IW1b, a second peripheral contact hole 160h2 which may expose the second upper interconnection pattern IW2b, a second peripheral contact hole 160h3 which may expose the third lower interconnection pattern IW3, an inner dam groove 160d1 which may expose the fifth lower inner dam LD5a, and an inner dam groove 160d2 which may expose the fifth lower outer dam LD5b may be formed.

By performing an ion implantation process 151, a cell body contact region 153 may be formed in the cell semiconductor layer 114, a cell gate contact region CCN may be formed in the cell gate conductive patterns 138, a first peripheral contact region PCN1 in the first upper interconnection pattern IW1b, a second peripheral contact region PCN2 in the second upper interconnection pattern IW2b, and a third peripheral contact region PCN3 in the third lower interconnection pattern IW3 may be formed. Therefore, the cell body contact region 153, the cell gate contact region CCN, and the first to third peripheral contact regions PCN1, PCN2, and PCN3 may commonly include a first element, for example, a group III element (e.g., boron) of the periodic table.

Processes such as those described with reference to FIGS. 25A and 25B may be performed.

Figure 28:
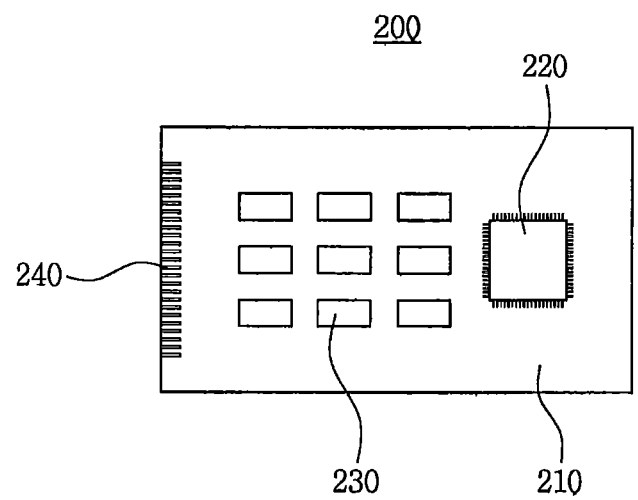
FIG. 28 is a schematic view illustrating a semiconductor module according to some embodiments of the inventive concepts.

FIG. 28 is a schematic view illustrating a semiconductor module according to some embodiments of the inventive concepts.

Referring to FIG. 28, a semiconductor module 200 may include memory devices 230 formed on a module substrate 210. The semiconductor module 200 may include a semiconductor device 220 mounted on the module substrate 210. The memory device 230 may include a semiconductor device according to some embodiments of the inventive concepts. Input/output terminals 240 may be disposed on at least one side of the module substrate 210. For example, the memory device 230 may include a semiconductor device such as one or more of those described with reference to one or more of FIGS. 1A-27B.

Figure 29:
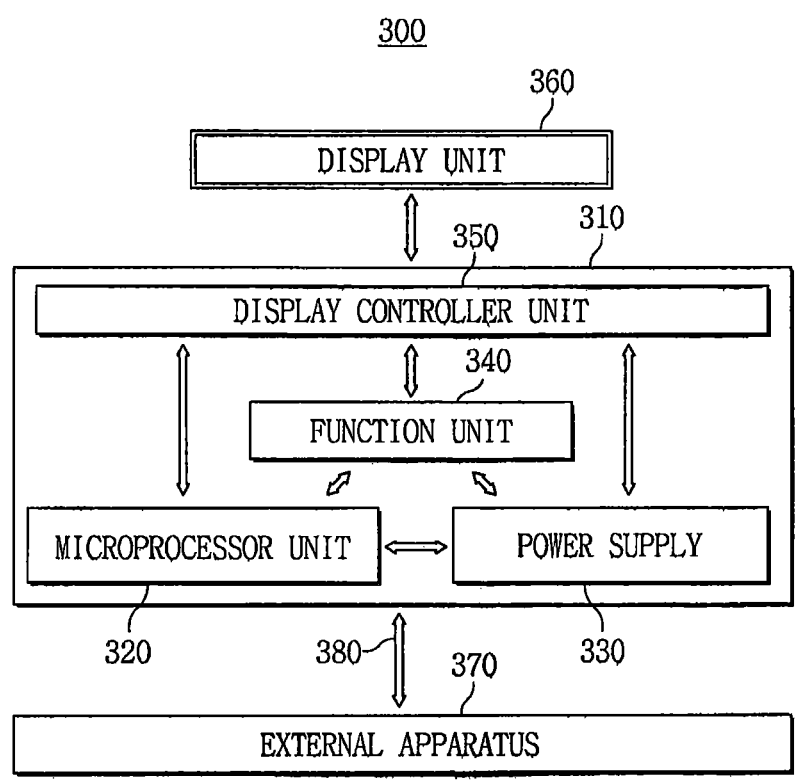
FIG. 29 is a conceptual block diagram illustrating an electronic system according to some embodiments of the inventive concepts.

FIG. 29 is a conceptual block diagram illustrating an electronic system according to some embodiments of the inventive concepts.

Referring to FIG. 29, an electronic system 300 may include a semiconductor device according to some embodiments of the inventive concepts. The electronic system 300 may include a body 310. The body 310 may include a microprocessor unit 320, a power supply 330, a function unit 340, and/or a display controller unit 350. The body 310 may be a system board or a motherboard having a printed circuit board (PCB), etc. For example, the electronic system 300 may include a semiconductor device such as one or more of those described with reference to one or more of FIGS. 1A-27B.

The microprocessor unit 320, the power supply 330, the function unit 340, and the display controller unit 350 may be installed or mounted on the body 310. A display unit 360 may be disposed on an upper surface of the body 310 or outside the body 310. For example, the display unit 360 may be disposed on a surface of the body 310, and then may display an image processed by the display controller unit 350. The power supply 330 may receive a constant voltage from an external power supply, divide the voltage into various voltages levels, and supply those voltages to the microprocessor unit 320, the function unit 340, the display controller unit 350, etc. The microprocessor unit 320 may receive a voltage from the power supply 330 to control the function unit 340 and the display unit 360.

The function unit 340 may perform various functions of the electronic system 300. For example, when the electronic system 300 is a mobile electronic product such as a cellular phone, etc., the function unit 340 may include various components which may perform wireless communication functions such as dialing, image output to the display unit 360, or voice output to a speaker through communication with an external apparatus 370, and when a camera is included, the function unit 340 may serve as an image processor.

In some embodiments, when the electronic system 300 is connected to a memory card to expand the capacity, the function unit 340 may be a memory card controller. The function unit 340 may exchange signals with the external apparatus 370 through a wired or wireless communication unit 380.

Further, when the electronic system 300 requires a Universal Serial Bus (USB) to expand the functions, the function unit 340 may serve as an interface controller.

Figure 30:
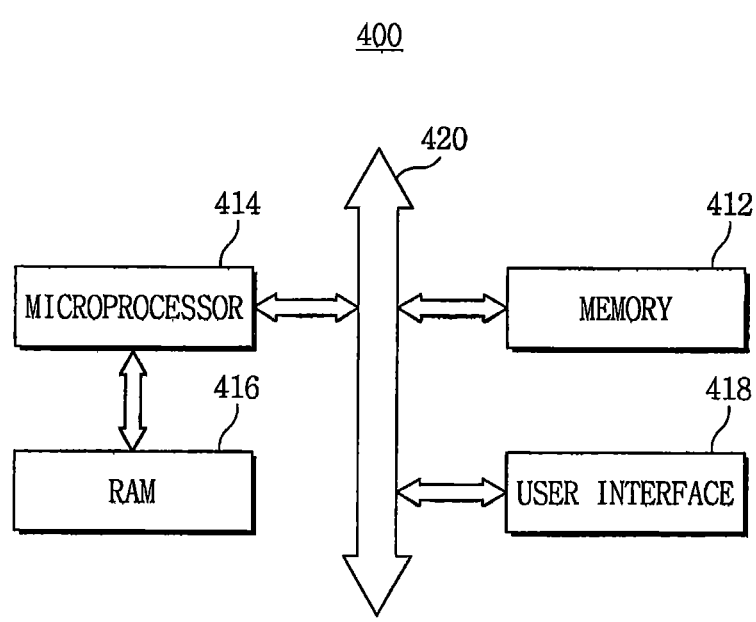
FIG. 30 is a schematic block diagram illustrating an electronic system according to some embodiments of the inventive concepts.

FIG. 30 is a schematic block diagram illustrating an electronic system according to some embodiments of the inventive concepts.

Referring to FIG. 30, an electronic system 400 may include a semiconductor device according to some embodiments of the inventive concepts. For example, the electronic system 400 may include a semiconductor device such as one or more of those described with reference to one or more of FIGS. 1A-27B. The electronic system 400 may include a memory system 412, a microprocessor 414, a RAM 416, and a user interface 418 which may perform data communication using a bus 420. The microprocessor 414 may program and control the electronic system 400. The RAM 416 may be used as an operational memory of the microprocessor 414. The microprocessor 414, the RAM 416, and/or other components may be assembled within a single package. The memory system 412 may include the semiconductor device according to some embodiments of the inventive concepts.

The user interface 418 may be used to input data to the electronic system 400 or output data from the electronic system 400. The memory system 412 may store operational codes of the microprocessor 414, data processed by the microprocessor 414, or data received from the outside. The memory system 412 may include a controller and a memory.

According to some embodiments of the inventive concepts, a 3-dimensional semiconductor device capable of improving a degree of integration and improving productivity may be provided. According to some embodiments of the inventive concepts, in the 3-dimensional semiconductor device, methods of forming a plurality of contact areas and a plurality of contact structures aligned on the plurality of contact areas, and a structure of a semiconductor device formed by the methods may be provided.

Although a few embodiments have been described with reference to the accompanying drawings, those skilled in the art will readily appreciate that many modifications are possible in embodiments without departing from the scope of the present invention and without changing essential features. Therefore, the above-described embodiments should be considered in a descriptive sense only and not for purposes of limitation.

What is claimed is:

1. A method of forming a semiconductor device, comprising:
    forming a cell vertical structure, and cell gate conductive patterns stacked vertically, on a substrate, wherein edges of the cell gate conductive patterns include a step structure;
    forming an interlayer insulating layer on the substrate, wherein the interlayer insulating layer is on the cell gate conductive patterns;
    forming cell gate contact holes that pass through the interlayer insulating layer and expose portions of the step structure;
    forming cell gate contact regions by implanting a first element in the portions of the step structure exposed by the cell gate contact holes;
    forming cell gate contact structures in the cell gate contact holes;
    forming a first peripheral area on the substrate;
    forming a first peripheral contact hole that passes through the interlayer insulating layer and exposes the first peripheral area;
    forming a first peripheral contact region in the first peripheral area exposed by the first peripheral contact hole; and
    forming a first peripheral contact structure in the first peripheral contact hole,
    wherein the first peripheral area is formed before forming the cell gate conductive patterns, and
    wherein the first peripheral contact region and the cell gate contact regions are simultaneously formed by the implanting the first element.

2. The method of claim 1, further comprising:
    forming a second peripheral area on the substrate, wherein the second peripheral area is formed before forming the cell gate conductive patterns;
    forming a second peripheral contact hole that passes through the interlayer insulating layer and exposes the second peripheral area;
    forming a second peripheral contact region in the second peripheral area exposed by the second peripheral contact hole; and
    forming a second peripheral contact structure in the second peripheral contact hole, wherein the second peripheral contact region is formed by implanting a second element, before or after forming the first peripheral contact region,
    wherein the first peripheral contact region has a first conductivity type, and
    wherein the second peripheral contact region has a second conductivity type different from the first conductivity type.

3. The method of claim 1,
    wherein forming the cell gate contact regions by implanting the first element comprises:

forming a first of the cell gate contact regions at a first vertical level by implanting the first element in a portion of an upper surface of a first of the cell gate conductive patterns;

forming a second of the cell gate contact regions at a second vertical level by implanting the first element in a portion of an upper surface of a second of the cell gate conductive patterns; and forming a third of the cell gate contact regions at a third vertical level by implanting the first element in a portion of an upper surface of a third of the cell gate conductive patterns, and wherein the first, second, and third vertical levels are three different vertical levels, respectively.

4. The method of claim 1, wherein the cell vertical structure includes a core insulating pattern, a cell pad pattern on the core insulating pattern, a channel layer between the core insulating pattern and the cell gate conductive patterns, and a data storage layer between the channel layer and the cell gate conductive patterns, wherein the cell pad pattern includes polysilicon, and wherein a first distance between an upper surface of the substrate and an upper surface of any one of the cell gate contact structures is greater than a second distance between the upper surface of the substrate and an upper surface of the cell vertical structure.

5. A method of forming a semiconductor device, comprising:

forming a cell vertical structure, and cell gate conductive patterns stacked vertically, on a substrate, wherein the cell gate conductive patterns are formed in a cell array area and extend to a step area, and wherein portions of the cell gate conductive patterns in the step area include a step structure, wherein the cell gate conductive patterns are formed of doped silicon;

forming an interlayer insulating layer on the substrate, wherein the interlayer insulating layer is on the cell gate conductive patterns;

forming cell gate contact holes that pass through the interlayer insulating layer and expose the portions of the cell gate conductive patterns formed in the step area;

by performing an implantation process, forming cell gate contact regions in the portions of the cell gate conductive patterns exposed by the cell gate contact holes;

forming cell gate contact structures in the cell gate contact holes;

forming a peripheral area on the substrate, wherein the interlayer insulating layer is on the peripheral area;

forming a peripheral contact hole that passes through the interlayer insulating layer and exposes the peripheral area;

forming a peripheral contact region in the peripheral area; and forming a peripheral contact structure in the peripheral contact hole, wherein the cell gate contact regions include an implanted impurity by the implantation process, wherein the peripheral contact structure and the cell gate contact structures are simultaneously formed, and wherein the peripheral contact region and the cell gate contact regions are simultaneously formed by the implantation process.

6. The method of claim 5, wherein the peripheral area is formed before forming the cell gate conductive patterns.

7. The method of claim 5, wherein the peripheral contact hole and the cell gate contact holes are simultaneously formed.

8. The method of claim 5, wherein the cell vertical structure extends through the cell gate conductive patterns.

9. The method of claim 5, wherein the cell vertical structure includes a core insulating pattern, a cell pad pattern on the core insulating pattern, a channel layer between the core insulating pattern and the cell gate conductive patterns, and a data storage layer between the channel layer and the cell gate conductive patterns, wherein the cell pad pattern includes polysilicon, and wherein a first distance between an upper surface of the substrate and an upper surface of any one of the cell gate contact structures is greater than a second distance between the upper surface of the substrate and an upper surface of the cell vertical structure.

10. A method of forming a semiconductor device, comprising:

forming a cell vertical structure, and cell gate conductive patterns stacked vertically, on a substrate, wherein edges of the cell gate conductive patterns include a step structure;

forming an interlayer insulating layer on the substrate, wherein the interlayer insulating layer is on the cell gate conductive patterns;

performing a patterning process that forms first contact holes that pass through the interlayer insulating layer and expose portions of the step structure, and simultaneously forms a second contact hole that exposes an impurity region on the substrate;

performing an implantation process that forms first contact regions by implanting a first element in the portions of the step structure exposed by the first contact holes, and simultaneously forms a second contact region by implanting the first element in the impurity region exposed by the second contact hole; and simultaneously forming first contact structures in the first contact holes, and a second contact structure in the second contact hole.

11. The method of claim 10, wherein the cell gate conductive patterns are formed of doped silicon.

12. The method of claim 10, wherein the cell vertical structure extends through the cell gate conductive patterns.

* * * * *